US007425406B2

(12) United States Patent
Oshima et al.

(10) Patent No.: US 7,425,406 B2

(45) Date of Patent: Sep. 16, 2008

(54) LITHOGRAPHIC PRINTING PLATE PRECURSOR AND LITHOGRAPHIC PRINTING METHOD

(75) Inventors: Yasuhito Oshima, Shizuoka (JP); Hidekazu Oohashi, Shizuoka (JP); Akihiro Endo, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/187,890

(22) Filed: Jul. 25, 2005

(65) Prior Publication Data

US 2006/0024612 A1 Feb. 2, 2006

(30) Foreign Application Priority Data

Jul. 27, 2004 (JP) .......................... P.2004-218454
Aug. 30, 2004 (JP) .......................... P.2004-249823

(51) Int. Cl.
*G03F 7/00* (2006.01)
*G03F 7/004* (2006.01)

(52) U.S. Cl. .................................... 430/302; 430/270.1

(58) Field of Classification Search .............. 430/270.1, 430/302, 138
See application file for complete search history.

(56) References Cited

U.S. PATENT DOCUMENTS

| | | | | |
|---|---|---|---|---|
| 5,512,423 | A * | 4/1996 | Kitao et al. | 430/345 |
| 5,916,680 | A * | 6/1999 | Wakata et al. | 428/402.21 |
| 6,019,914 | A * | 2/2000 | Lokshin et al. | 252/586 |
| 6,040,113 | A * | 3/2000 | Van Damme et al. | 430/271.1 |
| 6,447,977 | B2 * | 9/2002 | Vermeersch et al. | 430/270.1 |
| 6,489,079 | B1 * | 12/2002 | Verschueren et al. | 430/270.1 |
| 6,569,594 | B2 * | 5/2003 | Damme et al. | 430/270.1 |
| 6,632,589 | B2 * | 10/2003 | Inno et al. | 430/303 |
| 6,727,203 | B2 * | 4/2004 | Ichikawa | 503/215 |
| 6,800,426 | B2 * | 10/2004 | Ray et al. | 430/322 |
| 2003/0068575 | A1 | 4/2003 | Yanaka | |

FOREIGN PATENT DOCUMENTS

| | | | |
|---|---|---|---|
| EP | 0845708 | A1 | 6/1998 |
| EP | 0897795 | A1 | 2/1999 |
| EP | 1393899 | A2 | 3/2004 |
| EP | 1502736 | A2 | 2/2005 |
| EP | 1557262 | A2 | 7/2005 |
| EP | 1584485 | A2 | 10/2005 |
| GB | 2001584 | A | 2/1979 |
| JP | 7-333835 | A | 12/1995 |
| JP | 2001-277740 | A | 10/2001 |
| JP | 2002-287334 | A | 10/2002 |

* cited by examiner

*Primary Examiner*—Amanda C. Walke
(74) *Attorney, Agent, or Firm*—Birch, Stewart, Kolasch & Birch, LLP

(57) ABSTRACT

A lithographic printing plate precursor comprising a support and an image-recording layer containing at least one compound selected from the group consisting of a spiropyran compound and a spirooxazine compound, and an acid generator, and a lithographic printing method including a process of removing the unexposed area of the image-recording layer on a printing press.

21 Claims, No Drawings

LITHOGRAPHIC PRINTING PLATE PRECURSOR AND LITHOGRAPHIC PRINTING METHOD

BACKGROUND OF THE INVENTION

1. Field of the Invention

The present invention relates to a lithographic printing plate precursor having good visibility of a printing plate after exposure, and to a lithographic printing method including on-press development.

2. Background Art

A lithographic printing plate generally comprises a lipophilic image area that receives ink and a hydrophilic non-image area that receives a fountain solution in printing. Lithographic printing is a printing method of making difference in ink-adhering property on the surface of a lithographic printing plate with the lipophilic image area of the lithographic printing plate as the ink-receptive area and the hydrophilic non-image area as the fountain solution-receptive area (ink-repellent area) by making use of the natures of water and oily ink of repelling to each other, adhering ink only on the image area and transferring the ink to the material to be printed, e.g., paper.

For manufacturing a lithographic printing plate, a lithographic printing plate precursor (a PS plate) comprising a hydrophilic support having provided thereon a lipophilic photosensitive resin layer (an image-recording layer) has so far been widely used. A lithographic printing plate is generally obtained by a plate-making method of exposing a lithographic printing plate precursor through an original image of a lith film and the like, and then, for leaving the area to become an image area of the image-recording layer, dissolving and removing other unnecessary image-recording layer with an alkali developing solution or an organic solvent, to thereby bare a hydrophilic support surface to form a non-image area.

In a conventional plate-making process of a lithographic printing plate precursor, a process of dissolving and removing unnecessary image-recording layer with a developing solution and the like after exposure is necessary, but the disuse or simplification of such an additional wet process is one of the objects in the industry. Since the discard of waste solutions discharged with wet processes is a particularly great interest in the industry at large in recent years from the consideration of the global environment, the solution of the above problem is increasingly desired.

As a simple plate-making method as a countermeasure, a method that is called on-press development is proposed, which is a method of using an image-recording layer capable of removing an unnecessary area of a lithographic printing plate precursor in an ordinary printing process, and removing a non-image area after exposure on a printing press to obtain a lithographic printing plate.

As the specific examples of on-press development, e.g., a method of using a lithographic printing plate precursor having an image-recording layer soluble or dispersible with, e.g., a fountain solution, an ink solvent, or an emulsified product of a fountain solution and ink, a method of mechanically removing an image-recording layer by the contact with the rollers and the blanket of a printing press, and a method of mechanically removing an image-recording layer by the contact with the rollers and the blanket after weakening the cohesive strength of an image-recording layer or the adhesive strength of an image-recording layer and a support by the permeation of a fountain solution and an ink solvent are exemplified.

In the present invention, unless otherwise indicated, "development process" means a process of removing an unexposed area of an image-recording layer of a lithographic printing plate precursor by bringing into contact with a liquid (generally an alkali developing solution) to thereby bare the hydrophilic support surface with an apparatus other than a printing press (generally an automatic processor), and "on-press development" means a method and a process of removing an unexposed area of an image-recording layer of a lithographic printing plate precursor by bringing into contact with a liquid (generally printing ink and/or a fountain solution) to thereby bare the hydrophilic support surface with a printing press.

However, when a conventional image-recording layer of an image-recording system utilizing ultraviolet rays and visible rays is used, it is necessary to take methods requiring much labor, such that the exposed lithographic printing plate precursor must be stored under a completely light-shielding condition or a constant temperature condition until it is mounted on a printing press, since the image-recording layer is not fixed after exposure.

On the other hand, in recent years, digitized techniques of electronically processing, accumulating and outputting image data using a computer have prevailed, and various novel image output systems corresponding to these digitized techniques have been put to practical use. Under such circumstances, a computer-to-plate technique directly making a printing plate is attracting public attention, which is a technique of scanning exposing a lithographic printing plate precursor with high convergent radiant rays such as laser beams carrying digitized image data without using a lith film. With such a tendency, it is an important technical subject to obtain a lithographic printing plate precursor well adapted to this purpose.

As has been described, the simplification of plate making operation, and the realization of dry system and non-processing system have been more and more desired from both aspects of the global environmental protection and the adaptation for digitization.

Since high output lasers such as semiconductor lasers and YAG lasers radiating infrared rays of the wavelength of from 760 to 1,200 nm are inexpensively available nowadays, methods of using these high output lasers as image recording means are now promising as the manufacturing method of a lithographic printing plate by scanning exposure that is easy to be included in digitized techniques.

In conventional plate-making methods, image recording is carried out by imagewise exposing a photosensitive lithographic printing plate precursor by low to middle intensity of illumination to cause imagewise change of physical properties by photochemical reaction in the image-recording layer. While in the above method of using high output lasers, an exposure area is irradiated with a great quantity of light energy in an extremely short period of time, and the light energy is efficiently converted to heat energy, the heat energy causes thermal changes such as chemical changes, phase changes and morphological or structural changes in the image-recording layer, and these changes are utilized in image-recording. Accordingly, image data are inputted by light energy, e.g., laser beams, but image recording is performed in the state including the reaction by heat energy in addition to light energy. A recording system making use of heat generation by such high power density exposure is generally called heat mode recording, and the conversion of light energy to heat energy is called light/heat conversion.

Great advantages of a plate-making method using heat mode recording are that image-recording layers are insensitive to the lights of ordinary levels of illuminance such as room illumination, and that the fixation of images recorded by high illuminance exposure is not essential. That is, lithographic printing plate precursors for use in heat mode recording are free of sensitization by room illumination before exposure and fixation of images is not essential after exposure. Therefore, for example, if a lithographic printing plate precursor having an image-recording layer that is insolubilized or solubilized by exposure with high output laser beams that is capable of on-press development is available, a printing system that an image is not influenced even if exposed to room light after exposure becomes possible. That is, it is expected that a lithographic printing plate precursor preferably used for on-press development can be obtained if heat mode recording can be used.

However, many conventional photosensitive materials useful as image-recording layers in practical use have photosensitive wavelengths in the visible ray region of 760 nm or less, so that these materials cannot be used in image recording with infrared lasers. Therefore, materials capable of image recording with infrared lasers have been desired.

As one example, a lithographic printing plate precursor comprising a hydrophilic support having provided thereon an image-forming layer containing hydrophobic thermoplastic polymer particles dispersed in a hydrophilic binder is disclosed in patent literature 1 (Japanese Patent 2938397). Patent literature 1 discloses that it is possible to perform on-press development with a fountain solution and/or ink by subjecting the lithographic printing plate precursor to exposure with an infrared laser to coalesce the hydrophobic thermoplastic polymer particles by heat to thereby form an image, and then mounting the lithographic printing plate precursor on the cylinder of a press.

However, there is a problem that a method of forming an image by coalescence of fine particles by mere thermal fusion as above certainly shows a good on-press developing property, but image strength (the adhesion with a support) is extremely weak and press life is insufficient.

On the other hand, lithographic printing plate precursors containing microcapsules encapsulating a polymerizable compound on a hydrophilic support is disclosed patent literature 2 (JP-A-2001-277740 (the term "JP-A" as used herein refers to an "unexamined published Japanese patent application")) and patent literature 3 (JP-A-2001-277742). Further, patent literature 4 (JP-A-2002-287334) discloses a lithographic printing plate precursor comprising a support having provided thereon a photosensitive layer containing an infrared absorber, a radical polymerization initiator and a polymerizable compound. A method of using a polymerization reaction is characterized in that image strength is relatively strong since the density of chemical bonding in an image area is high as compared with an image area formed by heat fusion of polymer fine particles.

In general, as the preprocess of mounting a printing plate on a printing press, the detection and discrimination of images on a printing plate, i.e., works for ascertaining whether the images fitting for the purpose are recorded on the printing plate or not, and ascertaining for what a color of ink the plate is, are operated. In ordinary lithographic printing plate precursors accompanied by a development process, an image can be easily ascertained after plate making (after development process), or before printing (before a printing plate is mounted on a printing press) generally by coloring an image-recording layer in advance.

However, in a lithographic printing plate precursor of an on-press development type or a non-processing (non-development) type not accompanied by development process before printing, the discrimination of a plate cannot be done, since there is no image on the printing plate, which sometimes leads to the error in operation. In particular in multicolor printing, it is important for printing work to be capable of distinguishing whether register marks for register are clearly written so as to be distinguished or not.

However, since an on-press development type lithographic printing plate precursor is subjected to no special process after exposure until development on a printing press, it is necessary that plate detection be done by colored or decolored images only by exposure operation. Further, for preventing the transfer of a colored matter to the printing press and a printed matter by the substance removed by on-development, in a photo-polymerization negative printing plate, a coloring system that a colorless layer is colored by exposure is preferred to a decoloring system that a colored layer is decolored by exposure, and a technique capable of not coloring a removed substance in ink and a fountain solution is desired. Further, it is desired that a colored image is not decolored and stable due to the lapse of time.

As the discoloring agent or discoloring system that causes color change by exposure, (a) compounds that themselves are discolored by any energy, e.g., heating, application of pressure or irradiation, and (b) compounds that themselves are not discolored by the application of energy but are discolored by the contact with any other component (a component that discolors a discoloring agent), are exemplified.

As the well-known examples of above (a), leuco compounds, e.g., a thermochromic compound, a piezochromic compound, a photo-chromic compound, a triarylmethane dye, a quinoline dye, an indigoid dye and an azine dye are exemplified. These compounds are discolored by the application of heat or pressure, irradiation with light or air oxidation.

As the well-known examples of the above (b), various systems (discoloration systems) that cause discoloration among two or more components, e.g., an acid-base reaction, an oxidation reduction reaction, a coupling reaction, a chelate forming reaction, are exemplified. For example, coloring systems comprising acid substances (color developers) such as acid clay and phenols with a coupler having a partial stricture of lactone, lactam, spiropyran or spirooxazine used in pressure-sensitive paper as discoloring components, systems utilizing the azo coupling reaction of aromatic diazonium salt, diazotate, diazosulfonates with naphthols, anilines, active methylenes etc., chelate-forming reactions such as the reaction of hexamethylenetetramine with ferric iron ion and gallic acid, and the reaction of phenolphthalein-Complexon acids with alkaline earth metal ions, and oxidation reduction reaction such as the reaction of ferric stearate with pyrogallol, and the reaction of silver behenate with 4-methoxy-1-naphthol are exemplified.

Further, patent literature 5 (JP-A-7-333835) discloses a photosensitive lithographic printing plate containing a photobleaching coloring complex comprising spiropyran and a metal salt. Patent literature 6 (JP-B-5-34392 (the term "JP-B" as used herein refers to an "examined Japanese patent publication")) discloses a technique of coupling spiropyran having a silanol group to silica gel. However, these are techniques of systems that cause decoloration by exposure and not to obtain a colored image by exposure.

Further, patent literature 7 (JP-B-55-44935) proposes the stabilization of a spiropyran colored image by activated metal oxide. However, the patent is related to photography and copying materials using photo-chromic compounds, and on-press development type lithographic printing plate precursors using infrared lasers is not disclosed at all.

Thus, discoloration systems of the compounds that cause discoloration by exposure are known, but the systems usable in lithographic printing plate precursors capable of on-press development, excellent in a coloring property, and showing good aging stability of a colored image are not known yet.

SUMMARY OF THE INVENTION

An object of the invention is to provide a lithographic printing plate precursor having good visibility of a printing plate after exposure. Another object is to provide an on-press development type or a non-processing (non-development) type lithographic printing plate precursor having good visibility of a printing plate after exposure. A further object is to provide an on-press development type lithographic printing plate precursor showing good aging stability of a colored image formed by exposure and capable of plate detection before development. A still further object of the invention is to provide a lithographic printing method including on-press development of the lithographic printing plate precursor.

The present invention is as follows.

1. A lithographic printing plate precursor comprising a support and an image-recording layer, wherein tie image-recording layer contains an acid generator and at least one compound selected from the group consisting of a spiropyran compound and a spirooxazine compound.

2. A lithographic printing plate precursor comprising: a support; an image-recording layer; and a layer containing an acid generator and at least one compound selected from the group consisting of a spiropyran compound and a spirooxazine compound.

3. The lithographic printing plate precursor as described in the above item 1, wherein the image-recording layer contains a polymerizable compound and a polymerization initiator.

4. The lithographic printing plate precursor as described in the above item 1, wherein at least one of the acid generator and the at least one compound selected from the group consisting of a spiropyran compound and a spirooxazine compound is encapsulated in a microcapsule.

5. The lithographic printing plate precursor as described in the above item 1, which is capable of being mounted on a printing press and printing without development process after image recording with infrared laser exposure, or capable of image recording with infrared laser exposure after being mounted on a printing press and printing without development process.

6. The lithographic printing plate precursor as described in the above item 1, wherein the image-recording layer is an image-recording layer removable by printing ink and/or a fountain solution.

7. The lithographic printing plate precursor as described in the above item 6, wherein the image-recording layer further contains hydrophilic fine particles.

8. The lithographic printing plate precursor as described in the above item 7, wherein the hydrophilic fine particles includes at least fine particle selected from the group consisting of colloidal silica, alumina sol, magnesium oxide, zirconium oxide, titanium oxide, magnesium carbonate, potassium alginate and mica.

9. The lithographic printing plate precursor as described in the above item 2, wherein the image-recording layer contains a polymerizable compound and a polymerization initiator.

10. The lithographic printing plate precursor as described in the above item 2, wherein at least one of the acid generator and the at least one compound selected from the group consisting of a spiropyran compound and a spirooxazine compound is encapsulated in a microcapsule.

11. The lithographic printing plate precursor as described in the above item 2, which is capable of being mounted on a printing press and printing without development process after image recording with infrared laser exposure, or capable of image recording with infrared laser exposure after being mounted on a printing press and printing without development process.

12. The lithographic printing plate precursor as described in the above item 2, wherein the image-recording layer is an image-recording layer removable by printing ink and/or a fountain solution.

13. The lithographic printing plate precursor as described in the above item 12, wherein the image-recording layer further contains hydrophilic fine particles.

14. The lithographic printing plate precursor as described in the above item 13, wherein the hydrophilic fine particles includes at least fine particle selected from the group consisting of colloidal silica, alumina sol, magnesium oxide, zirconium oxide, titanium oxide, magnesium carbonate, potassium alginate and mica.

15. A lithographic printing plate precursor comprising: a support; an image-recording layer removable by printing ink and/or a fountain solution; and a hydrophilic overcoat layer, in this order, wherein the overcoat layer contains: at least one of spiropyran and spirooxazine; and hydrophilic fine particles.

16. The lithographic printing plate precursor as described in the above item 15, wherein the hydrophilic fine particles includes at least fine particle selected from the group consisting of colloidal silica, alumina sol, magnesium oxide, zirconium oxide, titanium oxide, magnesium carbonate, potassium alginate and mica.

17. A lithographic printing method comprising: imagewise exposing the lithographic printing plate precursors as described in any one of the above items 1 to 16 with infrared laser; removing the unexposed area of the image-recording layer to form a lithographic printing plate, with the lithographic printing plate precursor mounted on the cylinder of the printing press; and printing with the obtained lithographic printing plate.

The invention can provide a lithographic printing plate precursor having good visibility of a printing plate after exposure. The invention can further provide an on-press development type or a ion-processing (non-development) type lithographic printing plate precursor having good visibility of a printing plate after exposure. The invention can also provide an on-press development type lithographic printing plate precursor showing good aging stability of a colored image formed by exposure and capable of plate detection before development. The invention can still further provide a lithographic printing method including on-press development of the lithographic printing plate precursor.

According to the invention, good visibility of a printing plate after exposure can be obtained by using a spiropyran compound or a spirooxazine compound and an acid generator capable of generating an acid by the action of light or heat. This is based on the mechanism that an acid generated from the acid generator by exposure functions to open a spiropyran ring or a spirooxazine ring to thereby convert these colorless compounds to colored matters.

A spiropyran compound and a spirooxazine compound are compounds that satisfy excellent coloring characteristics at the time of exposure, while do not develop colors even when the development scum of unexposed area generating in on-press development is mixed in ink, and do not adversely influence on the printed matters, such as turbidity of colors and soiling. However, although these compounds are more stable in a ring closing structure (decoloring substance) than in a ring opening structure (coloring substance) and there are cases where images decolors with the lapse of time after exposure in a film weak in cohesive force capable of on-press development, excellent coloring property can be maintained, the aging stability of a colored image can be improved and, at the same time, on-press developing property can be maintained on a preferred level by the addition of these compounds and hydrophilic fine particles in one and the same layer.

The mechanism of the improvement of stability of a colored image is presumed due to the fact that a ring closing decoloring reaction is restrained by the stabilization of a coloring substance on the surface of hydrophilic fine particles.

DETAILED DESCRIPTION OF THE INVENTION

Spiropyran Compound and Spirooxazine Compound:

Spiropyran compounds and spirooxazine compounds (these compounds are hereinafter sometimes referred to as couplers) for use in the invention are described below.

A spiropyran compound is a compound having a primary structure such that a pyran ring is spiro-bonding to any other ring (an aliphatic ring or a heterocyclic ring). A spiro- oxazine compound is a compound having a primary structure such that an oxazine ring is spiro-bonding to any other ring (an aliphatic ring or a heterocyclic ring). To a pyran ring or an oxazine ring and a ring spiro-bonding to these rings, any other ring (an aliphatic ring or a heterocyclic ring) may further be condensed. A pyran ring or an oxazine ring, a ring spiro-bonding to these rings, and a condensed ring of these rings may each have a substituent.

The position of the spiro-bonding in a pyran ring is the 2-position (2H-pyran ring) or the 4-position (4H-pyran ring). The 2-position is preferred to the 4-position. The position of the spiro-bonding in an oxazine ring is the 2-position (2H-oxazine ring). A heterocyclic ring is preferred to an aliphatic ring as the ring to form a spiro-bonding with a pyran ring or an oxazine ring.

A spiropyran compound or a spirooxazine compound preferably has a structure represented by the following formula (I).

(I)

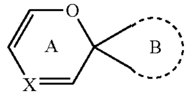

In formula (I), when X represents a carbon atom (a hydrogen atom or an arbitrary substituent is substituted on the carbon atom), the compound represents a spiropyran compound, and when X represents a nitrogen atom, the compound represents a spirooxazine compound. Any other ring (an aromatic ring, an aliphatic ring or a heterocyclic ring) may be condensed to ring A. Ring B is a heterocyclic ring containing at least one hetero atom. Any other ring (an aromatic ring, an aliphatic ring or a heterocyclic ring) may be condensed to heterocyclic ring B. Ring A, heterocyclic ring B and a condensed ring of these rings may each have an arbitrary substituent.

A ring condensed with ring A and heterocyclic ring B is preferably an aromatic ring. The examples of the aromatic rings include a benzene ring, a pentalene ring, an indene ring, a naphthalene ring, an azulene ring, a heptalene ring, a biphenylene ring, an indacene ring, an acenaphthylene ring, a fluorene ring, a phenalene ring, a phenanthrene ring, an anthracene ring, a fluoranthene ring; an acephenantlurylene ring, an aceanthrylene ring, a triphenylene ring, a pyrene ring, a chrysene ring, a naphthacene ring, a pleiadene ring, a picene ring, a perylene ring, a pentaphene ring, a pentacene ring, a tetraphenylene ring, a hexaphene ring, a hexacene ring, a rubicene ring, a coronene ring, a trinaphthylene ring, a heptaphene ring, a heptacene ring, a pyranthrene ring, and an ovalene ring.

The hetero atom on heterocyclic ring B is preferably a nitrogen atom, an oxygen atom or a sulfur atom. The examples of the substituents on ring A, heterocyclic ring B and the condensed ring of these rings include a halogen atom (F, Cl, Br, I), nitro, hydroxyl, —COOX, —$SO_3$X (X represents a hydrogen atom, an alkali metal or ammonium), an aliphatic group, an aromatic group, a heterocyclic group, —O—R, —CO—R, —NH—R, —O—CO—R, —CO—O—R, —$SO_2$—R, —O—$SO_2$—R, —$SO_2$—O—R, —NH—CO—R, —CO—NH—R, —NH—CO—O—R and —O—CO—NH—R. R represents an aliphatic group, an aromatic group or a heterocyclic group.

In the invention, the aliphatic group and the heterocyclic group may have a cyclic structure or a branched structure. The number of carbon atoms of the aliphatic group is preferably from 1 to 30, more preferably from 1 to 20, still more preferably from 1 to 15, further preferably from 1 to 10, and most preferably from 1 to 6.

The aliphatic group may have arbitrary substituents. The examples of the substituents are the same as the substituents of ring A, heterocyclic ring B and the condensed ring of these rings.

In the invention, the number of carbon atoms of the aromatic group is preferably from 6 to 30, more preferably from 6 to 20, and most preferably from 6 to 15. The aromatic group may have an arbitrary substituent. The examples of the substituents are the same as the substituents of ring A, heterocyclic ring B and the condensed ring of these rings.

In the invention, the number of carbon atoms of the heterocyclic group is preferably from 1 to 30, more preferably from 1 to 20, still more preferably from 1 to 15, further preferably from 1 to 10, and most preferably from 1 to 6. The heterocyclic group may have an arbitrary substituent. The examples of the substituents are the same as the substituents of ring A, heterocyclic ring B and the condensed ring of these rings.

A spiropyran compound or a spirooxazine compound more preferably has a structure represented by the following formula (II).

(II)

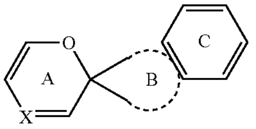

In formula (II), X represents a carbon atom or a nitrogen atom. Any other ring (an aromatic ring, an aliphatic ring-or a heterocyclic-ring) may be condensed to ring A. Ring B is a heterocyclic ring containing at least one hetero atom. Any other ring (an aromatic ring, an aliphatic ring or a heterocyclic ring) may be condensed to heterocyclic ring B. Any other ring (an aromatic ring, an aliphatic ring or a heterocyclic ring) may be condensed to ring C. Ring C may be a heterocyclic aromatic ring in which one or more carbon atoms constituting ring C are substituted with hetero atoms selected from an oxygen atom, a nitrogen atom and a sulfur atom. Ring A, heterocyclic ring B, benzene ring C and the condensed ring of these rings may each have an arbitrary substituent. A ring condensed with ring C is preferably an aromatic ring.

The hetero atom on heterocyclic ring B is preferably a nitrogen atom, an oxygen atom or a sulfur atom.

A spiropyran compound or a spirooxazine compound still more preferably has a structure represented by the following formula (IIIa), (IIIb) or (IIIc), and a structure represented by formula (IIIa) is particularly preferred.

(IIIa)

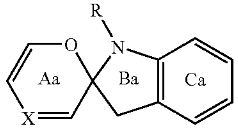

(IIIb)

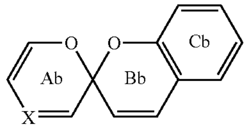

(IIIc)

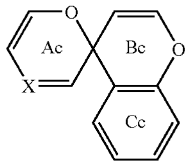

In formulae (IIIa), (IIIb) and (IIIc), any other ring (an aromatic ring, an aliphatic ring or a heterocyclic ring) may be condensed with rings Aa, Ab, Ac, Ba, Bb, Bc, Ca, Cb and Cc. Rings Aa, Ab, Ac, Ba, Bb, Bc, Ca, Cb, Cc and the condensed ring of these rings may each have a substituent. Each of ring Ca, Cb and Cc may be an aromatic ring in which one or more carbon atoms constituting each of ring Ca, Cb and Cc are substituted with hetero atoms selected from an oxygen atom, a nitrogen atom and a sulfur atom. A ring condensed with each of ring Ca, Cb and Cc is preferably an aromatic ring.

In formula (IIIa), R represents a hydrogen atom, an aliphatic group, an aromatic group, or a heterocyclic group, and R more preferably represents an aliphatic group.

When a lithographic printing plate precursor in the invention is used as an on press development type lithographic printing plate, that is, when a lithographic printing plate precursor is mounted on a printing press after image recording and used for printing without development process, or a lithographic printing plate precursor is image recorded after being mounted on a printing press and used for printing without development process, there are cases where at least one compound selected from the group consisting of a spiropyran compound and a spirooxazine compound is mixed in ink and/or a fountain solution to thereby change the tint of a printed matter and reduce quality. For avoiding such a problem, at least one compound selected from the group consisting of a spiropyran compound and a spirooxazine compound is preferably a colorless or light-colored (preferably colorless) compound before image forming, or a compound that changes to colorless or light-colored (preferably colorless) after on-press development even if it is a colored compound before image forming. In this point, a spirooxazine compound is preferred, and a spirooxazine compound represented by formula (IIIa), wherein X represents a nitrogen atom, is particularly preferred.

As the specific examples of spiropyran/spirooxazine compounds, the compounds disclosed in JP-A-5-206489, JP-A-6-199827, JP-A-5-72668, JP-A-6-95291, JP-A-6-199827, JP-A-7-17978, JP-A-8-290667, JP-A-7-138251, JP-A-7-258245, JP-A-7-300484, JP-A-8-245627, JP-A-8-291176, JP-A-9-241626, JP-A-9-323990, JP-T-11-503117 (the term "JP-T" as used herein means a published Japanese translation of a PCT patent application), JP-A-2000-281920, JP-A-2002-332480 and JP-T-2003-535095 can be used. Further, the compounds described in Ramaiah Muthyala compiled, *Chemistry and Application of Leuco Dyes*, Chapter 1, "Spiropyran Leuco Dyes", published by Plenum Press (1997), John C. Crano and Robert J. Guglielmetti compiled, *Organic Photochromic and Thermochromic Compounds*, Vol. 2, "Physicochemical Studies, Biological Applications and Thermochromism", Chapter 10, "Thermochromism of Organic Compounds", published by Kluwer Academic/Plenum Publishers (1999), and Ramaiah Muthyala compiled, *Chemistry and Applications of Leuco Dyes*, Chapter 10, "Thermochromism of Organic Compounds", published by Plenum Press (1997) can also be used.

As the specific examples of spiropyran/spirooxazine compounds, the following compounds are exemplified, but the invention is not limited to these compounds.

1',3'-Dihydro-1',3',3'-trimethylspiro[2H-1-benzo-pyran-2,2'-(2H)indole], 1',3'-dihydro-8-methoxy-1',3',3'- trimethylspiro[2H-1-benzopyran-2,2'-(2H)indole],6-bromo-',3'-dihydro-1',3',3'-trimethylspiro[2H-1-benzopyran-2,2'-(2H) indole], 1',3'-dihydro-1',3',3'-trimethyl-6-nitro-spiro[2H-1-benzopyran-2,2'-(2H)indole], 1',3'-dihydro-8-methoxy-1',3',3'-trimethyl-6-nitrospiro[2H-1-benzopyran-2,2'-(2H) indole], 1',3'-dihydro-5'-methoxy-1',3',3'-trimethyl-6-nitrospiro[2H-1-benzopyran-2,2'-(2H)indole], 1',3'-dihydro-8-methoxy-5'-methylsulfonyl-1',3',3'-trimethyl-6-nitrospiro [2H-1-benzopyran-2,2'-(2H)indole], 1',3'-dihydro-3',3'-dimethyl-1-(3-sulfopropyl)-6-nitro-spiro[2H-1-benzopyran-2,2'-(2H)indole]triethylamine salt, 1',3'-dihydro-3',3'-dimethyl-6-nitro-1'-octadecylspiro-[2H-1-benzopyran-2,2'-(2H)indole], 1',3'-dihydro-3',3'-dimethyl-6nitrol-1-octadecyl-8-dodecanoyloxymethylspiro-[2H-1benzopyran-2,2'(2H)indole], 1,3-dihydro-1,3,3-trimethylspiro[2H-indole-2,3'-[3H]naphtho[2,1,-b][1,4]-oxazine]1',3'-dihydro-1',3',3'-trimethyl-6-nitrospiro[2H-1-benzopyran-2,2'-[2H] indole], 1,3-dihydro-3,3-dimethyl-1-octadecylspiro[2H-indole-2,3'-[3H]naphtho[2,1-b][1,4]-oxazine], 1,3-dihydro-1,3,3-trimethylspiro[2H-indole-2,3'-[3H]phenanthro[9,10-b][1,4]oxazine], 5-chloro-1,3-dihydro-1,3,3-trimethylspiro [2H-indole-2,3'-[3H]naphtho[2,1-b]-[1,4]oxazine], 5-chloro-1,3-dihydro-1,3,3-trimethylspiro-[2H-indole-2,3'-[3H]phenanthro[9,10-b][1,4]oxazine],

B-1

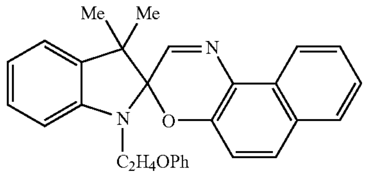

B-2

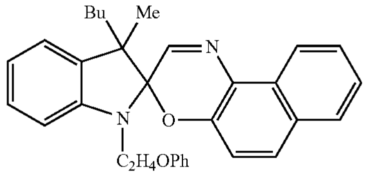

-continued
B-3
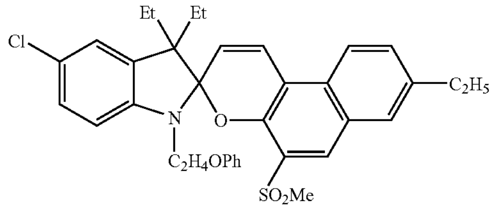
B-4
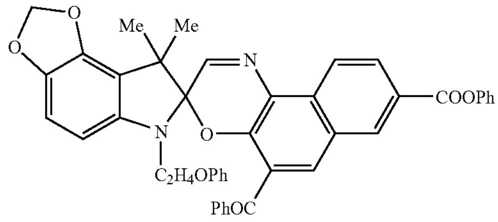
B-5
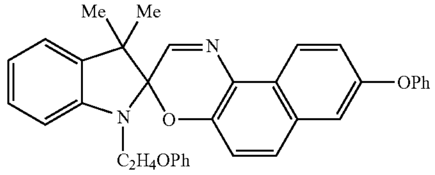
B-6
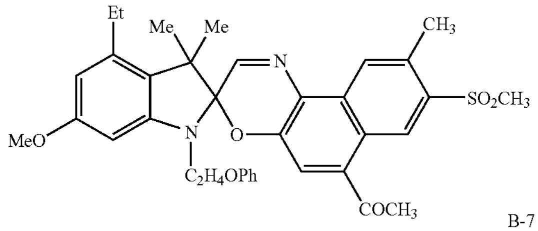
B-7
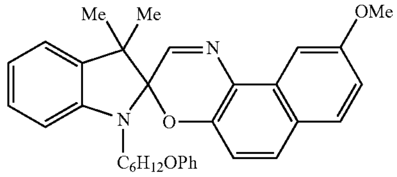
B-8
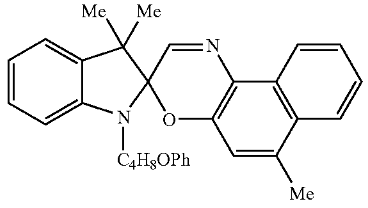
B-9
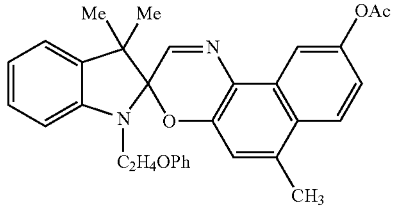
B-10
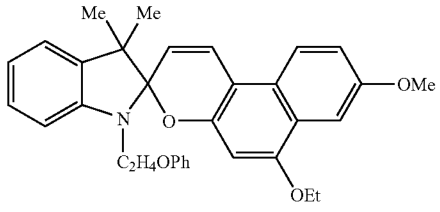
-continued
B-11
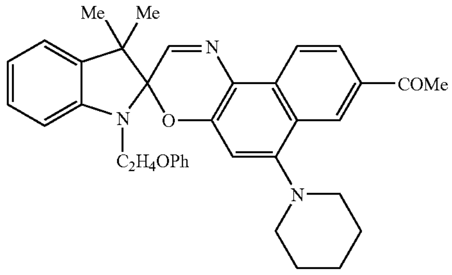
B-12
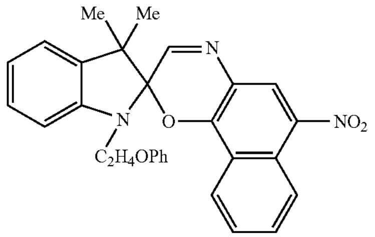
B-13
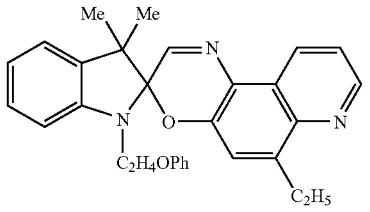
B-14
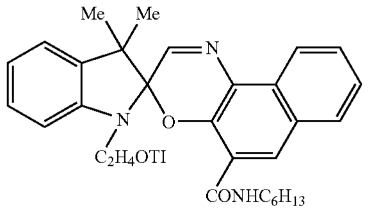
B-15
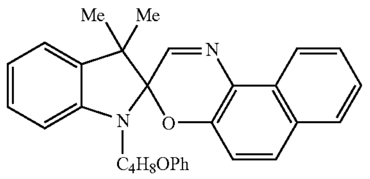
B-16
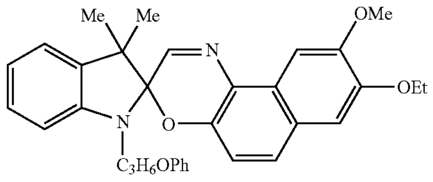
B-17
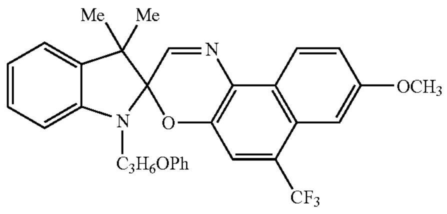

-continued
B-18
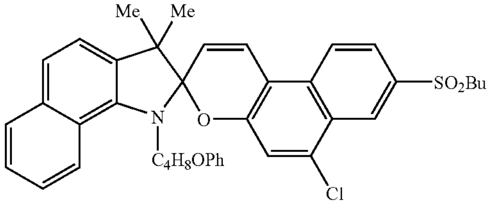
B-19
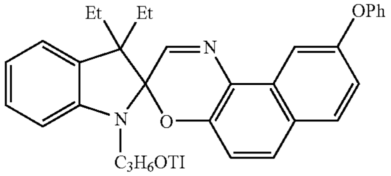
B-20
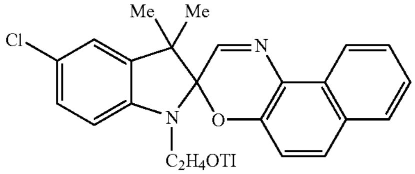
B-21
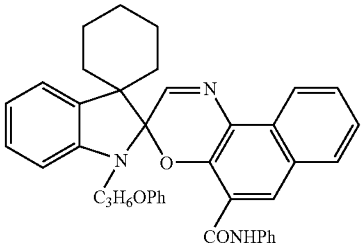
B-22
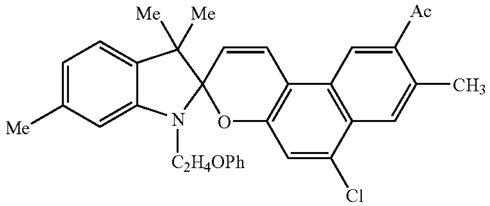
B-23
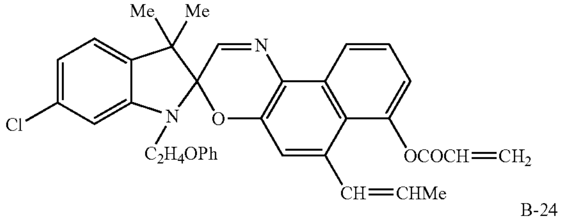
B-24
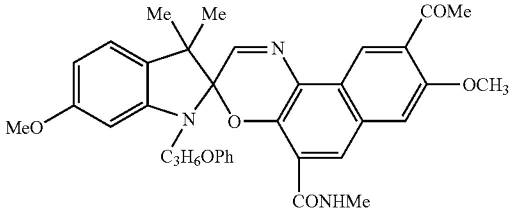
-continued
B-25
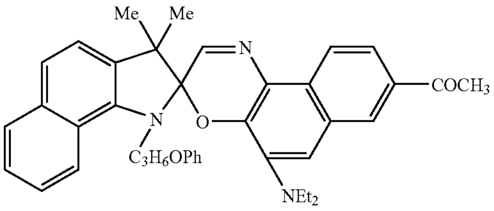
B-26
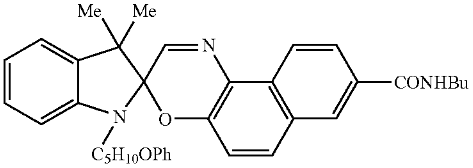
B-27
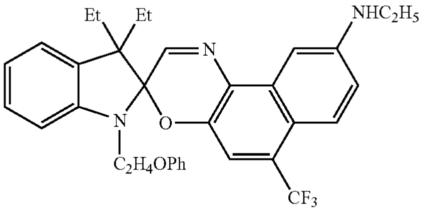
B-28
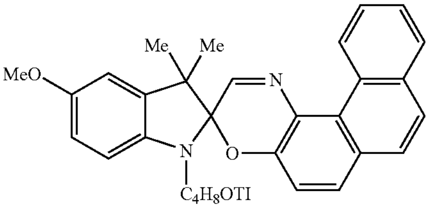
C-1
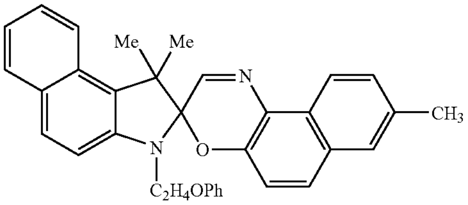
C-2
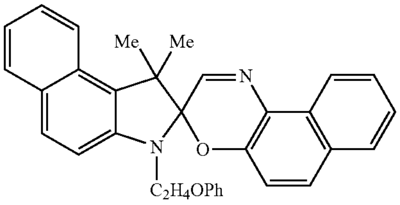
C-3
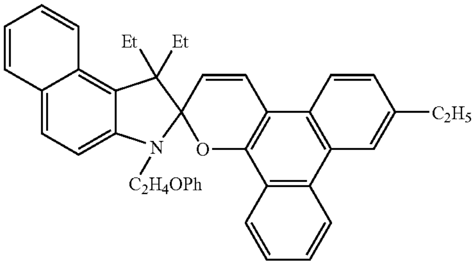

-continued
C-4
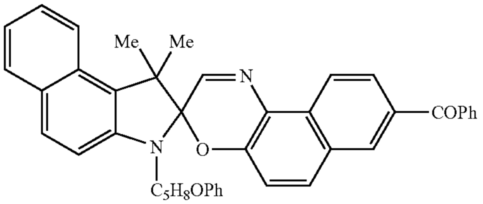
C-5
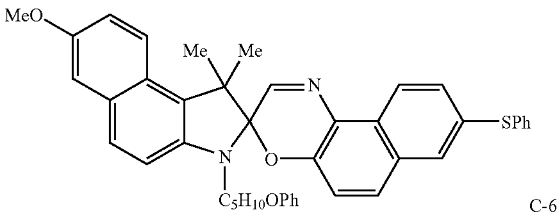
C-6
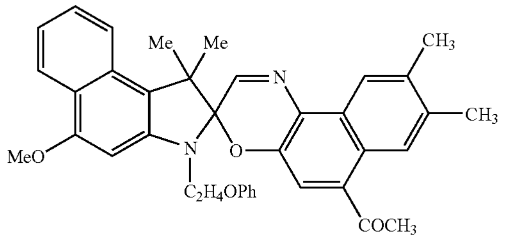
C-7
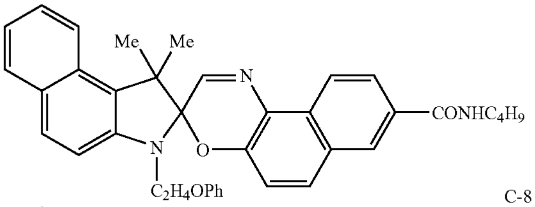
C-8
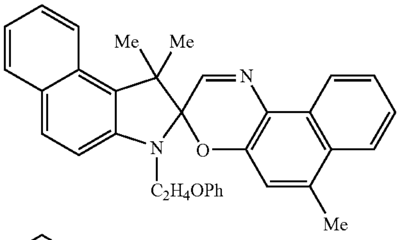
C-9
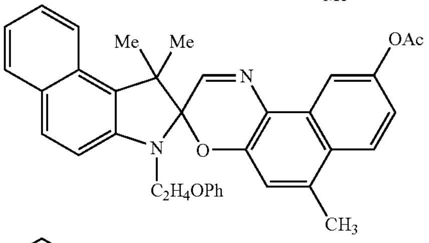
C-10
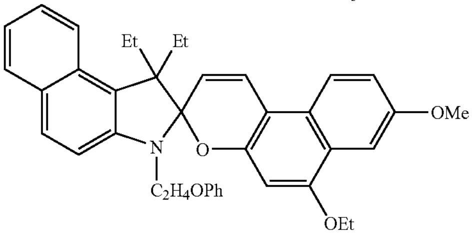
-continued
C-11
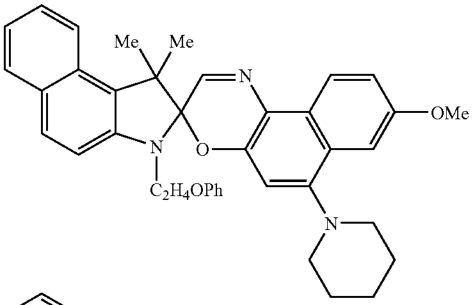
C-12
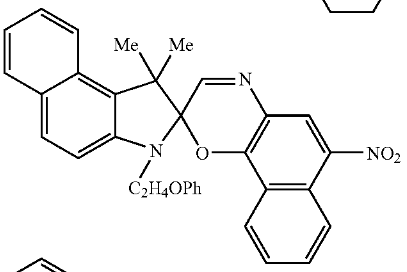
C-13
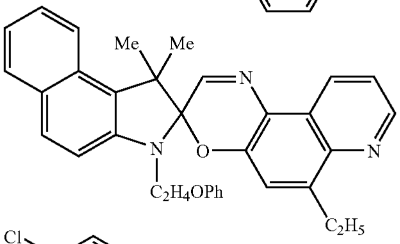
C-14
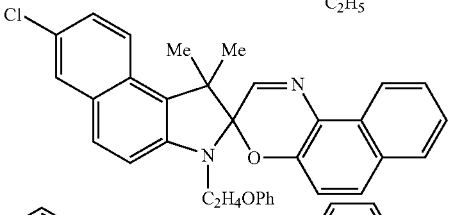
C-15
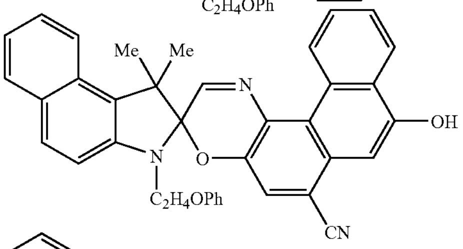
C-16
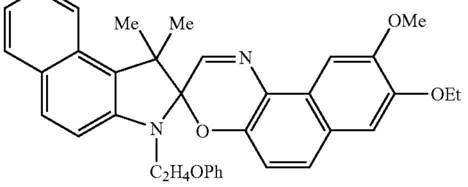
C-17
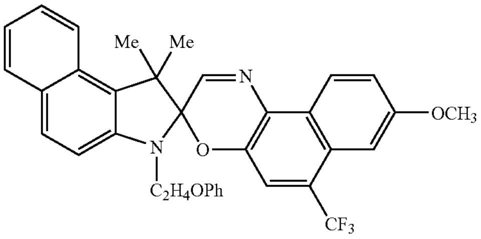

-continued
C-18
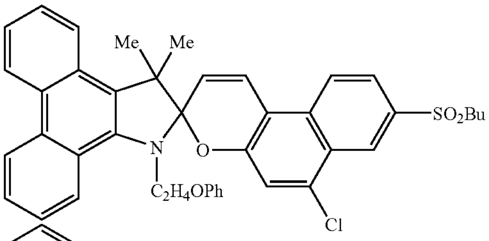
C-19
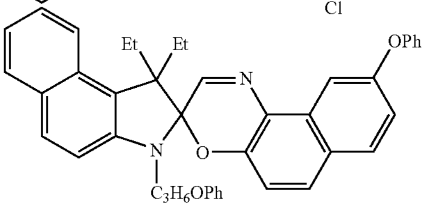
C-20
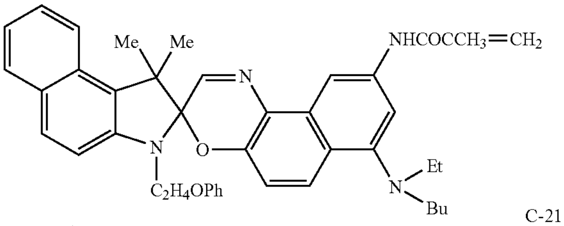
C-21
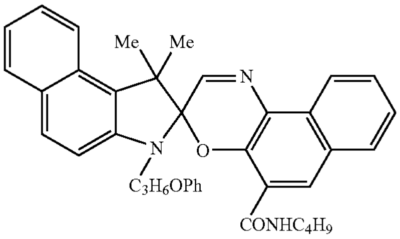
C-22
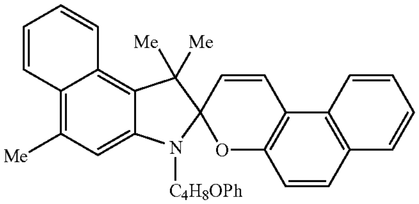
C-23
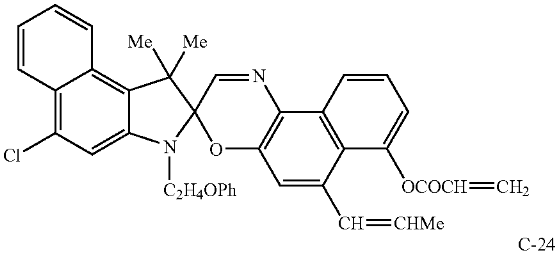
C-24
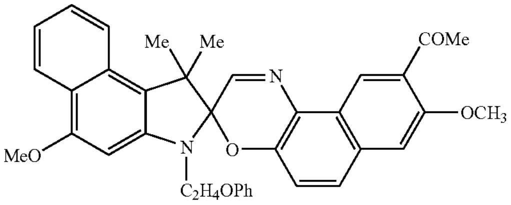
-continued
C-25
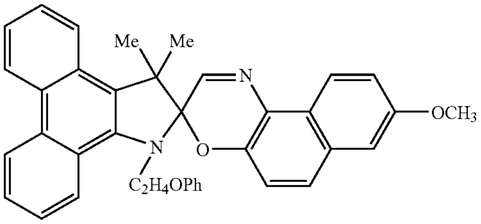
C-26
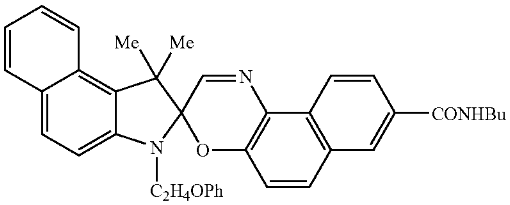
C-27
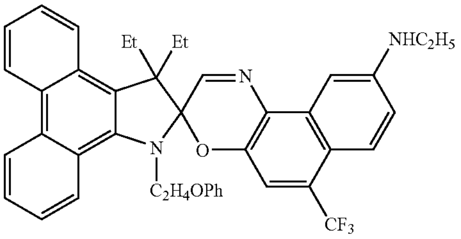
C-28
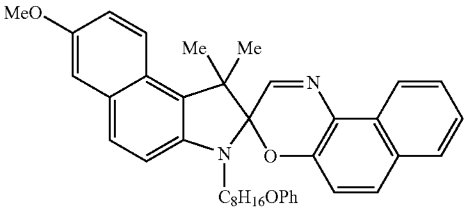
D-1
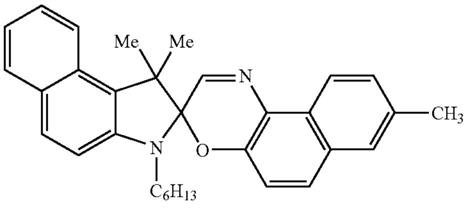
D-2
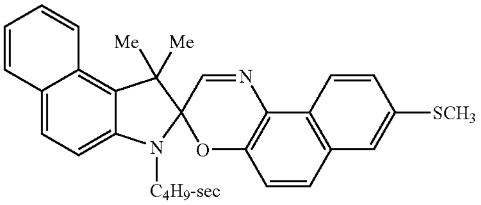
D-3
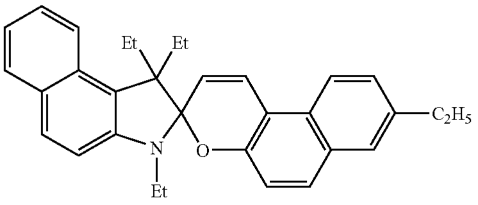

-continued
D-4
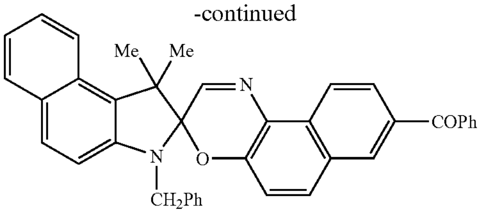
D-5
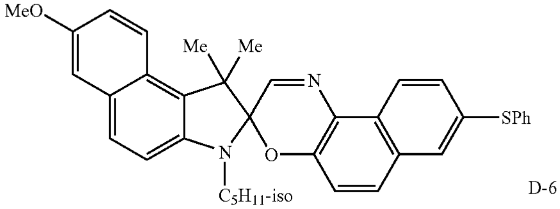
D-6
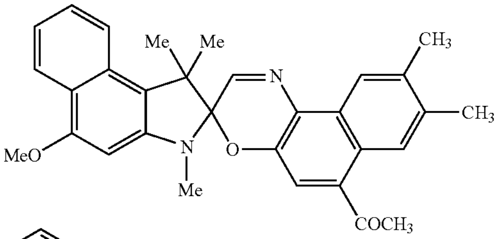
D-7
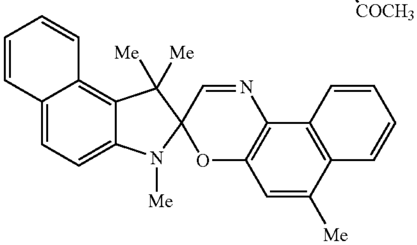
D-8
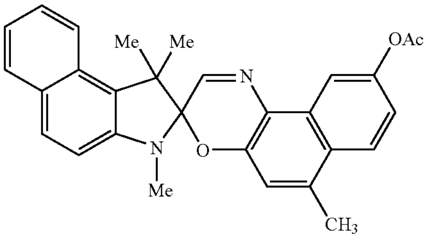
D-9
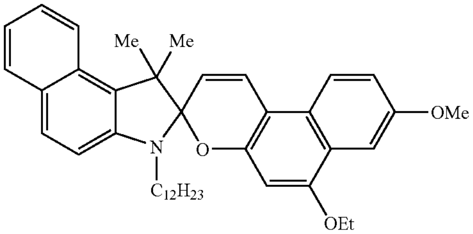
D-10
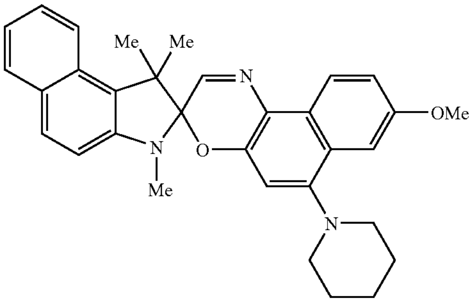
-continued
D-11
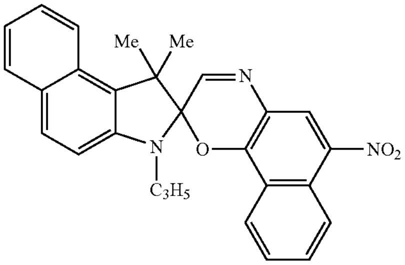
D-12
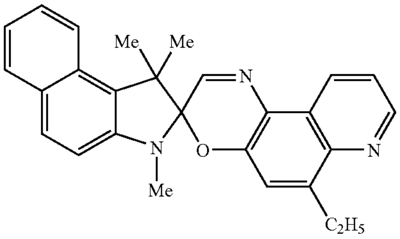
D-13
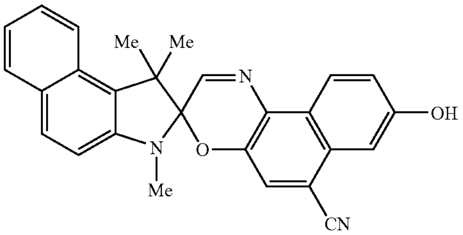
D-14
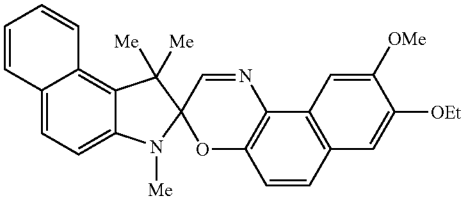
D-15
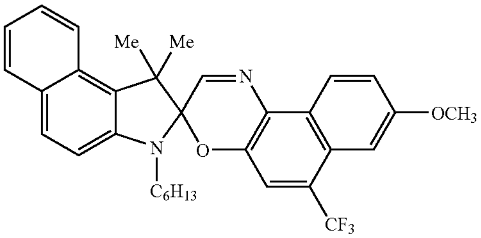
D-16
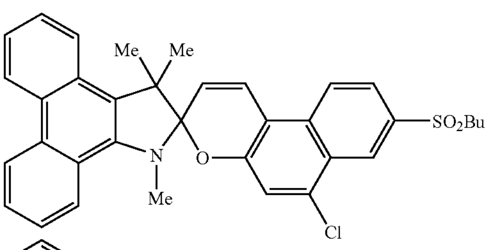
D-17
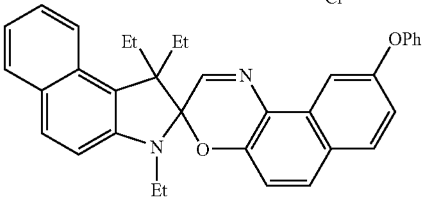

-continued
D-18
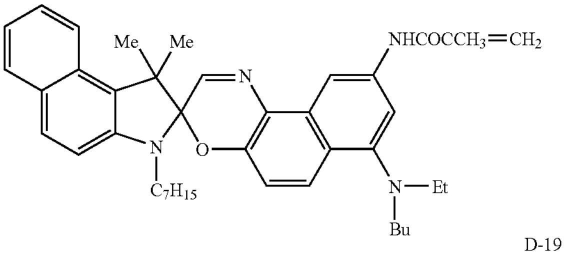
D-19
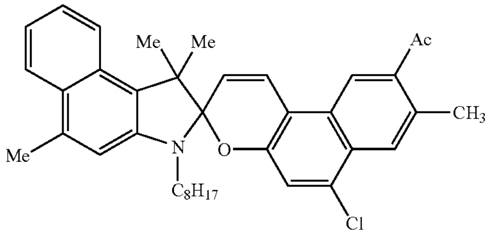
D-20
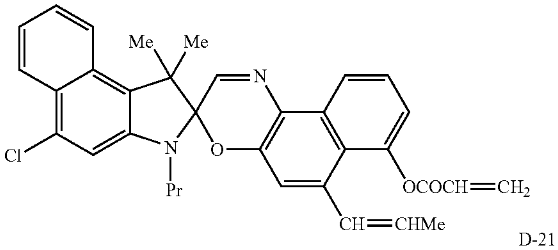
D-21
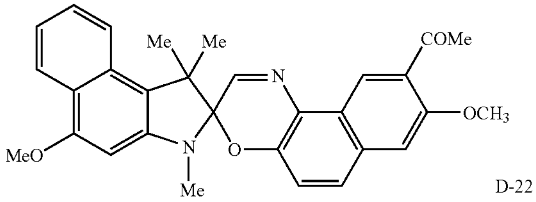
D-22
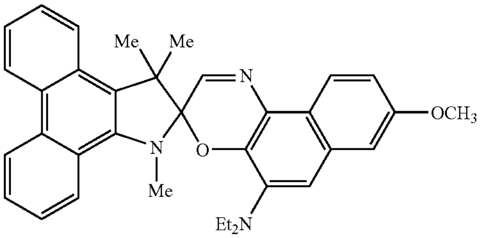
D-23
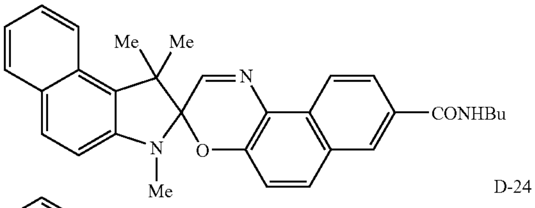
D-24
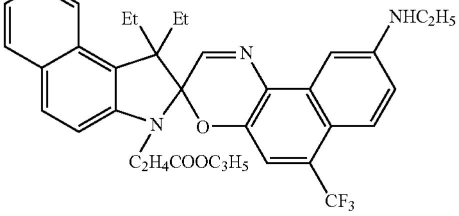
-continued
D-25
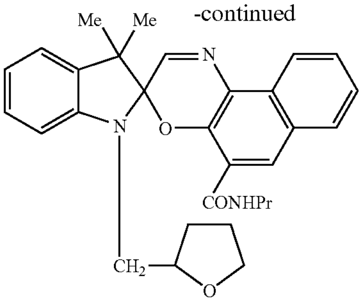
D-26
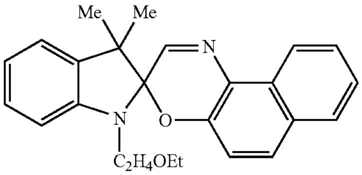
E-1
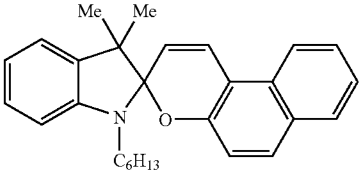
E-2
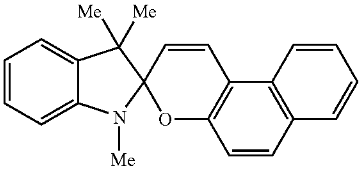
E-3
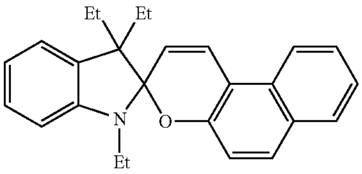
E-4
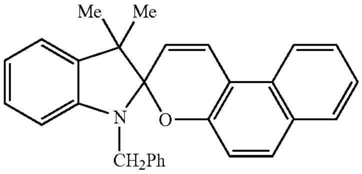
E-5
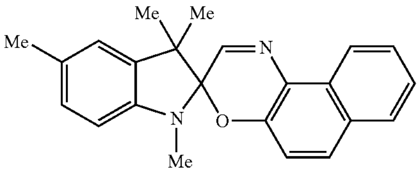
E-6
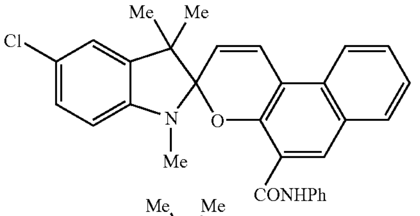
E-7
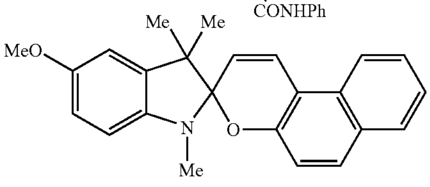

-continued
E-8
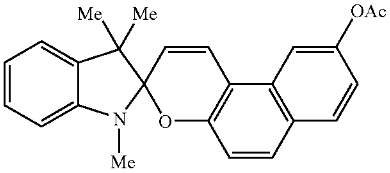
E-9
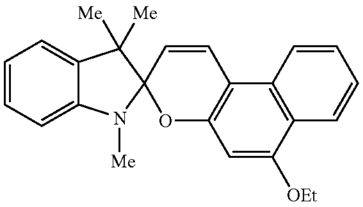
E-10
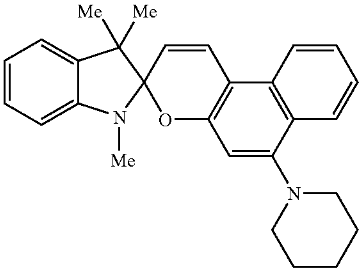
E-11
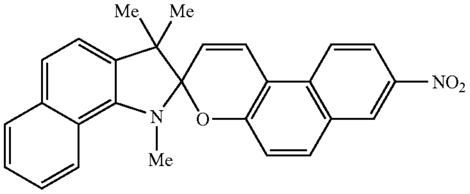
E-12
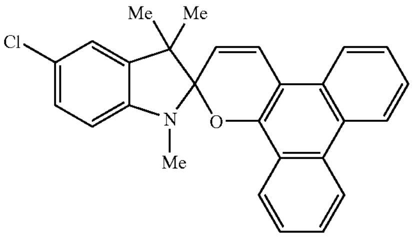
E-13
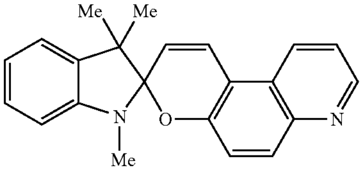
E-14
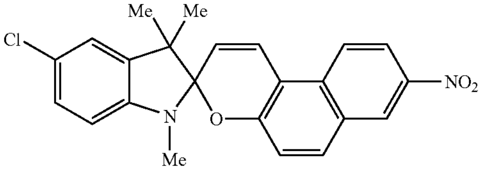
E-15
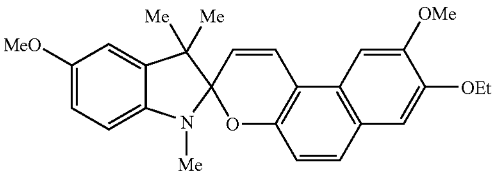
-continued
E-16
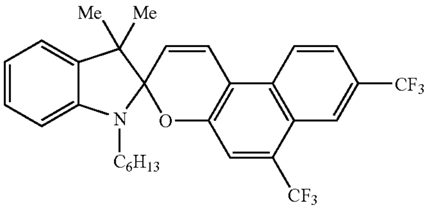
E-17
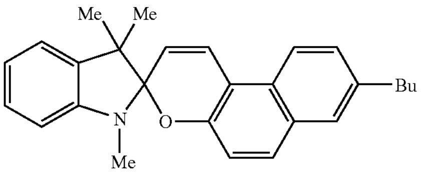
E-18
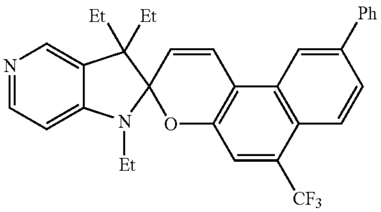
E-19
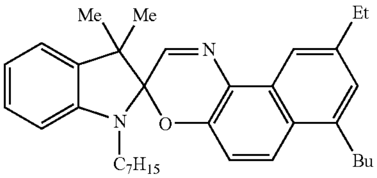
E-20
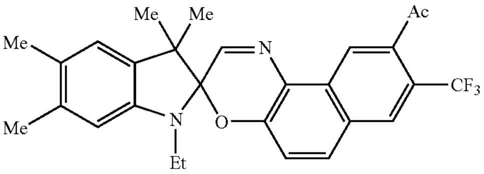
E-21
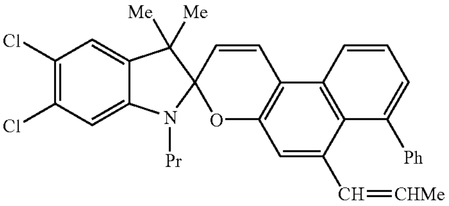
E-22
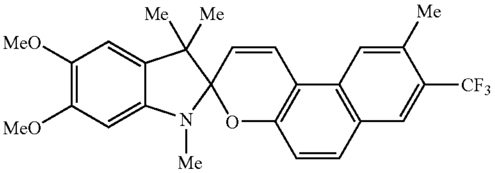
E-23
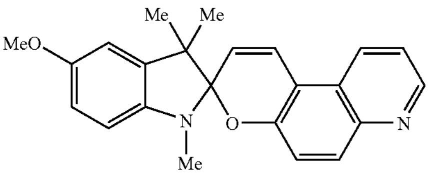

-continued

E-24

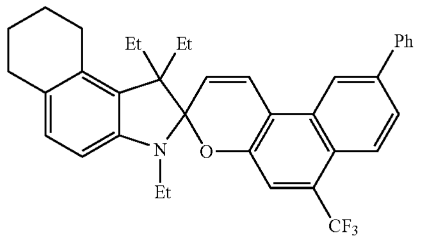

A spiropyran compound or a spirooxazine compound can be synthesized with referring to the above literatures and patents.

Acid Generator:

An acid generator for use in the invention is a compound capable of generating an acid by the action of light and/or heat, and well-known acid generators and photo-cationic polymerization photo-initiators that are used in forming the printout image of a PS plate and in the field of microresist are exemplified as preferred acid generators.

More specifically, organic compounds typified by trihalomethyl-substituted heterocyclic compound, compounds generating a sulfonic acid by photo-decomposition typified by iminosulfonate, disulfone compounds, and onium salts (e.g., iodonium salt, diazonium salt, sulfonium salt, etc.) disclosed in JP-A-2002-29162, JP-A-2002-46361 and JP-A-2002-137562 can be exemplified. Compounds obtained by introducing these acid-generating groups or compounds to the main chain or side chain of polymers can also be used. The examples of acid generators are shown below, but the invention is not limited thereto.

(A-1)

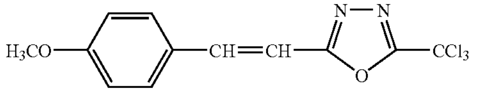

(A-2)

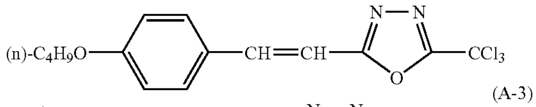

(A-3)

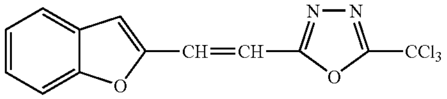

(A-4)

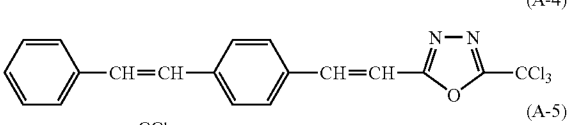

(A-5)

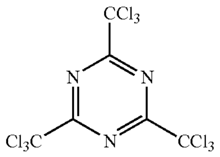

(A-6)

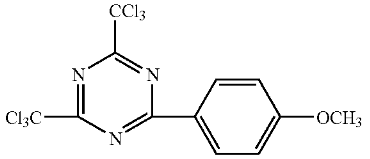

-continued (A-7)

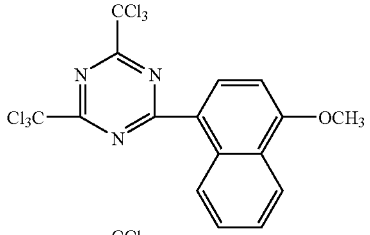

(A-8)

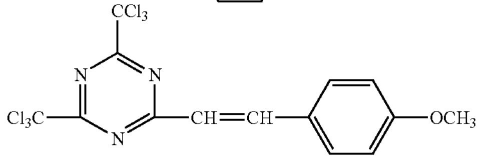

(A-9)

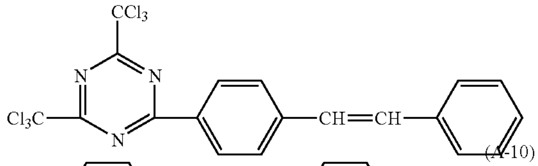

(A-10)

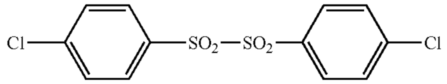

(A-11)

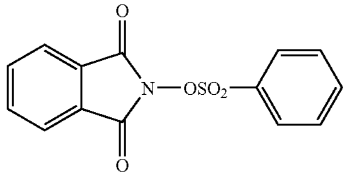

(AI-1)

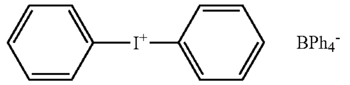

(AI-2)

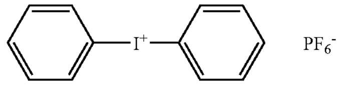

(AI-3)

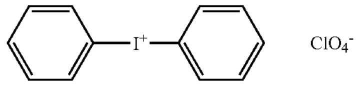

(AI-4)

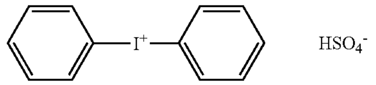

(AI-5)

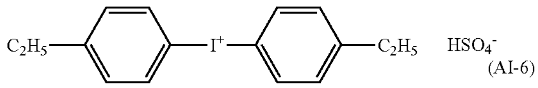

(AI-6)

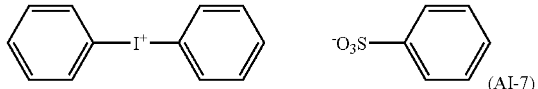

(AI-7)

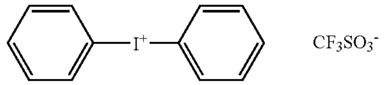

(AI-8)

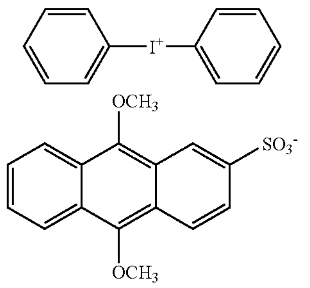

-continued
(AI-9)
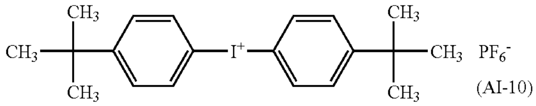
(AI-10)
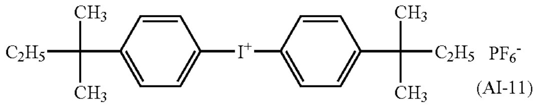
(AI-11)
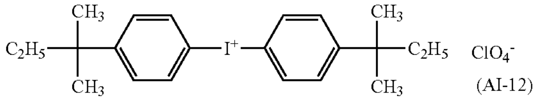
(AI-12)
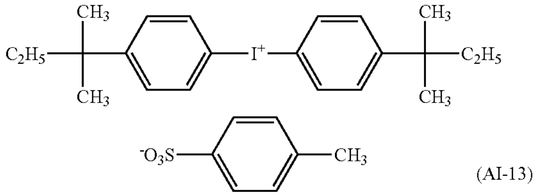
(AI-13)
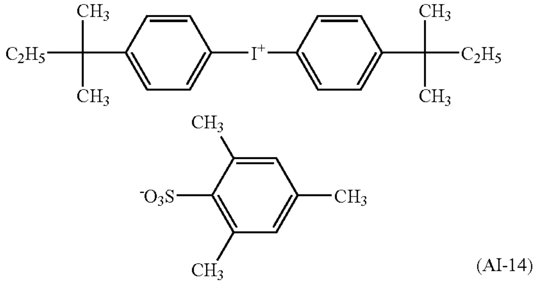
(AI-14)
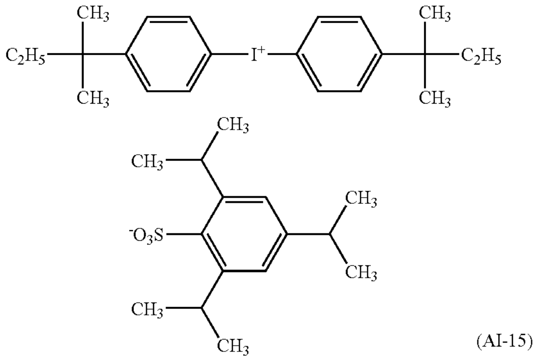
(AI-15)
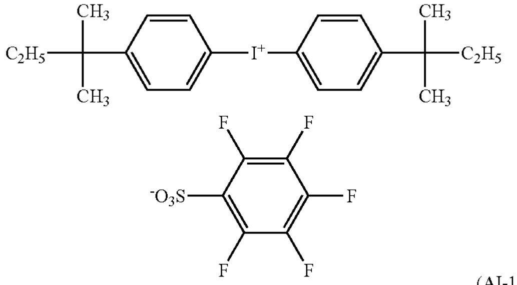
(AI-16)
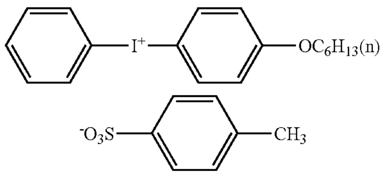
-continued
(AI-17)
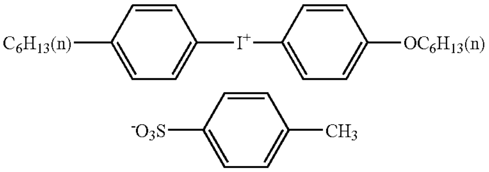
(AN-1)
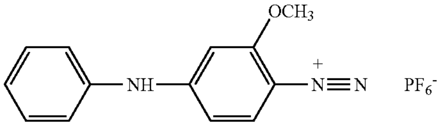
(AN-2)
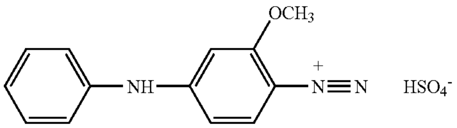
(AN-3)
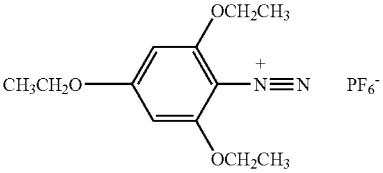
(AN-4)
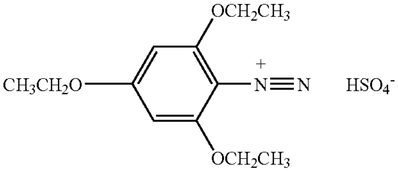
(AN-5)
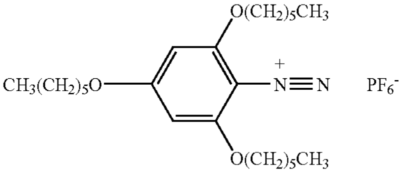
(AN-6)
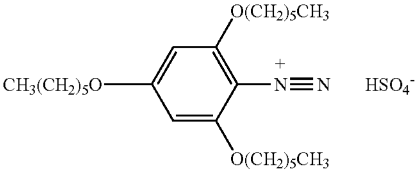
(AN-7)
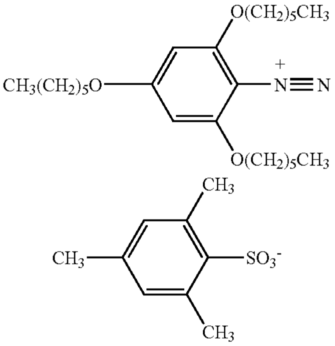

-continued (AN-8)

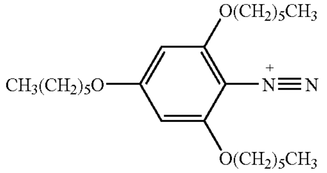

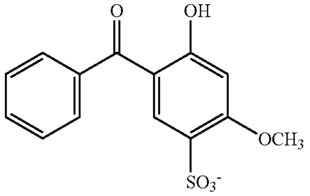

(AS-1)

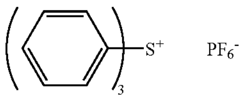

(AS-2)

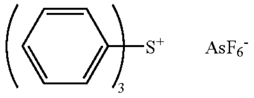

(AS-3)

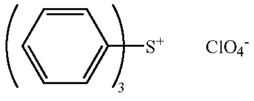

(AS-4)

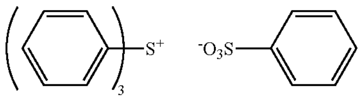

(AS-5)

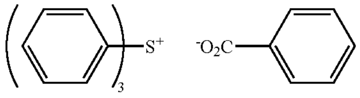

(AS-6)

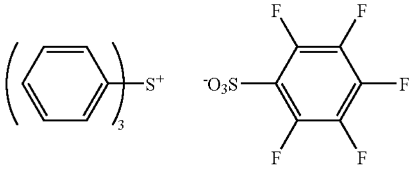

(AS-7)

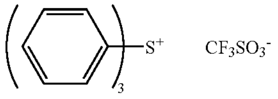

(AS-8)

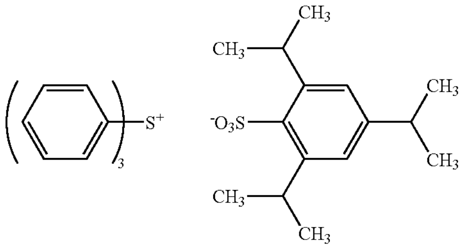

(AS-9)

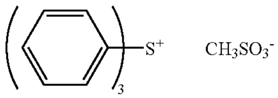

(AS-10)

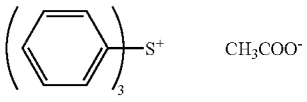

-continued (AS-11)

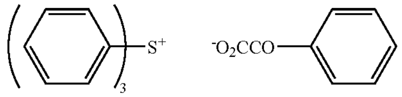

(AS-12)

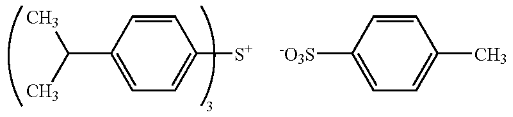

Of these acid generators, iodonium salt, diazonium salt and sulfonium salt are preferred for high sensitivity, and iodonium salt is more preferred.

Further, acid generators capable of generating an acid having an acid dissociation constant (pKa) at 25° C. of preferably 5 or lower, more preferably 3 or lower, still more preferably 1 or lower, and particularly preferably −1 or lower, are preferred for good sensitivity.

The examples of these acids include organic acids represented by R—COOH, R—$SO_3H$, R—$SO_2H$, R—$PO_3H_2$, R—$OPO_3H_2$, R—$PO_2H_2$ and R—$OPO_2H_2$ (R represents a hydrocarbon group having from 1 to 30 carbon atoms that may have a substituent), and inorganic acids, e.g., HF, HCl, HBr, HI, $HClO_4$, $HBF_4$, $HPF_6$, $HSbF_6$, $AsF_6$, $H_3PO_3$, $H_3PO_4$, $H_2SO_3$, $H_2SO_4$ and HNO3. Of these acids, R—$SO_3H$, R—$PO_3H_2$, R—$OPO_3H_2$, $HClO_4$, $HBF_4$ and $HPF_6$ are preferred, R—$SO_3H$, $HClO_4$, $HBF_4$ and $HPF_6$ are more preferred, and R—$SO_3H$ and $HClO_4$ having a hydrocarbon group substituted with a fluorine atom are particularly preferred.

To contain at least one compound selected from the group consisting of a spiropyran compound and a spirooxazine compound, and an acid generator in an image-recording layer, a method of dissolving at least one compound selected from the group consisting of a spiropyran compound and a spirooxazine compound, and an acid generator in an appropriate solvent, and coating the solution on an image-recording layer, and a method of microencapsulating at least either one, preferably both, of at least one compound selected from the group consisting of a spiropyran compound and a spirooxazine compound, and an acid generator, and adding the microcapsules to an image-recording layer are used. The latter method is more preferred for the reasons that the hindrance of the reaction systems of a printout image-forming reaction system and a print image-forming reaction system can be avoided by separating one from another by using microcapsules, as a result good plate detecting property and press life can be obtained. Microencapsulation can be can be carried out according to the later-described well-known methods.

At least one compound selected from the group consisting of a spiropyran compound and a spirooxazine compound, and an acid generator can be added to one or two or more layers other than an image-recording layer, e.g., a protective layer and an undercoating layer, besides an image-recording layer.

The addition amount of at least one compound selected from the group consisting of a spiropyran compound and a spirooxazine compound per a unit area of a lithographic printing plate precursor is preferably from 0.001 to 1 $g/m^2$, more preferably from 0.005 to 0.5 $g/m^2$, and most preferably from 0.01 to 0.3 $g/m^2$.

The addition amount of an acid generator per a unit area of a lithographic printing plate precursor is preferably from 0.001 to 1 $g/m^2$, more preferably from 0.005 to 0.5 $g/m^2$, and most preferably from 0.01 to 0.3 $g/m^2$.

A system that causes color change by exposure comprising at least one compound selected from the group consisting of a spiropyran compound and a spirooxazine compound, and an acid generator may be used in combination with other systems of discoloring agents or discoloring compounds that cause color change by exposure.

Hydrophilic Fine Particles:

As hydrophulic fine particles for use in the invention, inorganic metal fine particles having on the surface thereof a functional group capable of bonding through hydrogen are preferred, e.g., silica sol, alumina sol, magnesium oxide, zirconium oxide, titanium oxide, magnesium carbonate, calcium alginate, and mica are exemplified, and silica sol, alumina sol, mica and mixtures of them are more preferred.

These hydrophilic fine particles have hydrophilic surfaces and interact with the coloring substances (ring opening structures) of spiropyran and spirooxazine through hydrogen bonding, and restrain free rotation with spiro-atoms as the center for returning from coloring substances to decoloring substances (ring closing structures), so that it becomes possible to increase the heat stability of the coloring substances.

Silica sol has many hydroxyl groups on the surface, and the inside is constituted of a siloxane bonding (—Si—O—Si). By the hydroxyl groups on the surface, hyper-fine particles of silica having a particle size of from 1 to 100 nm are present in water or a polar solvent in the state of dispersion, so that silica sol is also called colloidal silica. Silica sol is specifically described in, compiled by Toshiro Kagami and Akira Hayashi, *Kojundo Silica no Oyo Gijutsu (Applied Technology of High Purity Silica)*, Vol. 3, CMC Publishing Co., Ltd. (1991).

Alumina sol is alumina hydrate (boehmite series) having a colloidal size of from 5 to 200 nm, and dispersed with anions in water (e.g., a halogen atom ions such as a fluorine ion, a chlorine ion, and carboxylate anions such as an acetate ion) as the stabilizer.

Mica means aluminosilicate containing an alkali metal, belongs to phillosilicate, and represented by the following formula.

$$A(B, C)_{2\text{-}3}D_4O_{10}(OH, F, O)_2$$

wherein A represents K, Na or Ca; B and C each represents $Fe^{II}Fe^{III}$, Mn, Al, Mg or V; and D represents Si or Al.

It is also effective to use synthetic mica synthesized by the coordination of alkali ions among phyllosilicate ions and the substitution of the hydroxyl group in the talc structure with fluorine by using alkali silicofluoride according to an intercalation method.

The average particle size of the hydrophilic sol-like fine particles is preferably from 0.01 to 10 μm, more preferably from 1 to 5 μm. Hydrophilic fine particles having a large aspect ratio and flat shapes are also preferred.

Hydrophilic fine particles may be doped with at least one element selected from Fe, Cu, Ce, La, Ni, Se and Ag. When hydrophilic fine particles are doped with these elements, the coloring substances are shifted to blue side, coloring sensitivity increases and stabilization heightens.

All of the above hydrophilic fine particles are easily commercially available.

The content of the hydrophilic fine particles is preferably from 1.0 to 70 mass % of the solids content in the image-recording layer or the overcoat layer, more preferably from 5.0 to 50 mass %.

Components for Forming Print Image:

As the components for forming a print image, at least either (A) image-forming components utilizing radical or cationic polymerization, or (B) image-forming components utilizing thermal fusion and thermal reaction of a hydrophobitizing precursor can be used in an image-recording layer in the invention. When components (A) are used, the image recording layer becomes a polymerization series image recording layer, and when components (B) are used, the image recording layer becomes a hydrophobitizing precursor series image-recording layer. These components are described below.

(A) Image-Forming Components using Polymerization:

Polymerization series components are high in image forming sensitivity, and exposure energy can be effectively shared for the formation of a printout image, so that it is suitable to obtain a printout image having good visibility.

Polymerization series components comprise polymerizable compounds and polymerization initiators as the primary components.

<Polymerizable Compound>

The polymerizable compounds usable in the invention are addition polymerizable compounds having at least one ethylenic unsaturated double bond, and the addition polymerizable compounds are selected from the compounds having at least one, preferably two or more, ethylenic unsaturated bond. These compounds are well known in the field of this industry, and they can be used with no particular restriction in the invention. In the invention, polymerizable compounds mean not only mere monomers but also prepolymers, i.e., dimers, trimers or oligomers, and mixtures and copolymers of them. (These polymerizable compounds have chemical forms of, e.g., monomers or prepolymers, i.e., dimers, trimers or oligomers, and mixtures and copolymers of them.) As the examples of monomers (and copolymers of them), unsaturated carboxylic acids (e.g., acrylic acid, methacrylic acid, itaconic acid, crotonic acid, isocrotonic acid, maleic acid, etc.), and esters and amides of these unsaturated carboxylic acids are exemplified, and preferably esters of unsaturated carboxylic acids and aliphatic polyhydric alcohol compounds, and amides of unsaturated carboxylic acids and aliphatic polyhydric amine compounds are used. Further, the addition reaction products of unsaturated carboxylic acid esters and amides having a nucleophilic substituent such as a hydroxyl group, an amino group or a mercapto group with monofunctional or polyfunctional isocyanates or epoxies, and the dehydration condensation reaction products of unsaturated carboxylic acid esters and amides with monofunctional or polyfunctional carboxylic acids are also preferably used. Furthermore, the addition reaction products of unsaturated carboxylic acid esters or amides having an electrophilic substituent such as an isocyanate group or an epoxy group with monofunctional or polyfunctional alcohols, amines or thiols, and the substitution reaction products of unsaturated carboxylic acid esters or amides having a separable substituent such as a halogen group or a tosyloxy group with monofunctional or polyfunctional alcohols, amines or thiols are also preferably used. As another example, it is also possible to use compounds obtained by substituting the above unsaturated carboxylic acids with unsaturated phosphonic acid, styrene, vinyl ether, etc.

The specific examples of the monomers of esters of aliphatic polyhydric alcohol compounds and unsaturated carboxylic acids include, as acrylic esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrvlate, hexanediol diacrylate, 1,4-cyclohexaniediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, polyester acrylate oligomer, isocyanuric acid EO-modified triacrylate, etc.

As methacrylic esters, the examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane, bis[p-(methacryloxyethoxy)phenyl]-dimethylmethane, etc.

As itaconic esters, the examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc. As crotonic esters, the examples include ethylene glycol dicrotonate, tetramethylene glycol dicrotonate, pentaerythritol dicrotonate, sorbitol tetradicrotonate, etc. As isocrotonic esters, the examples include ethylene glycol diisocrotonate, pentaerythritol diisocrotonate, sorbitol tetraisocrotonate, etc. As maleic esters, the examples include ethylene glycol dimaleate, triethylene glycol dimaleate, pentaerythritol dimaleate, sorbitol tetramaleate, etc.

As the examples of other esters, e.g., the aliphatic alcohol esters disclosed in JP-B-51-47334 and JP-A-57-196231, the esters having an aromatic skeleton disclosed in JP-A-59-5240, JP-A-59-5241 and JP-A-2-226149, and the esters containing an amino group disclosed in JP-A-1-165613 are also preferably used in the invention. The above ester monomers can also be used as mixtures.

Further, the specific examples of the amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriamintris-acrylamide, xylylenebis-acrylamide, xylylenebis-methacrylamide, etc. As other preferred amide monomers, the amide monomers having a cyclohexylene structure disclosed in JP-B-54-21726 can be exemplified.

Further, urethane series addition polymerizable compounds manufactured by the addition reaction of isocyanate and hydroxyl groups are also preferably used. As the specific example of such a compound, as disclosed in JP-B-48-41708, a vinyl urethane compound containing two or more polymerizable vinyl groups in one molecule obtained by adding a vinyl monomer having a hydroxyl group represented by the following formula (A) to a polyisocyanate compound having two or more isocyanate groups in one molecule is exemplified.

$$CH_2{=}C(R_4)COOCH_2CH(R_5)OH \quad (A)$$

wherein $R_4$ and $R_5$ each represents H or $CH_3$.

The urethane acrylates disclosed in JP-A-51-37193, JP-B-2-32293 and JP-B-2-16765, and the urethane compounds having an ethylene oxide skeleton disclosed in JP-B-58-49860, JP-B-56-17654, JP-B-62-39417 and JP-B-62-39418 are also preferably used in the invention. In addition, extremely high speed photopolymerizable compositions can be obtained by using addition polymerizable compounds having an amino structure or a sulfide structure in the molecule as disclosed in JP-A-63-277653, JP-A-63-260909 and JP-A-1-105238.

As other examples, polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. The specific unsaturated compounds disclosed in JP-B-46-43946, JP-B-1-40337 and JP-B-1-40336, and the vinyl sulfonic acid compounds disclosed in JP-A-2-25493 can also be exemplified.

Further, according to cases, the structures containing a perfluoroalkyl group disclosed in JP-A-61-22048 are preferably used. In addition, the compounds introduced as the photo-curable monomers and oligomers into *Bulletin of Nippon Setchaku Kyokai*, Vol. 20, No. 7, pp. 300-308 (1984) can also be used.

As the compound having a vinyloxy group that can be preferably used in the invention, the compounds disclosed in JP-A-2002-29162 are exemplified. As the specific examples, tetramethylene glycol divinyl ether, trimethylolpropane trivinyl ether, tetraethylene glycol divinyl ether, pentaerythritol divinyl ether, pentaerythritol trivinyl ether, pentaerythritol tetravinyl ether, 1,4-bis[2-(vinyloxy)-ethyloxy]benzene, 1,2-bis[2-(vinyloxy)ethyloxy]benzene, 1,3-bis[2-(vinyloxy) ethyloxy]benzene, 1,3,5-tris[2-(vinyloxy)ethyloxy]benzene, 4,4'-bis[2-(vinyloxy)ethyloxy]- biphenyl, 4,4'-bis[2-(vinyloxy)ethyloxy]diphenyl ether, 4,4'-bis[2-(vinyloxy)ethyloxy]diphenylmethane, 1,4-bis[2-(vinyloxy)ethyloxy]naphthalene, 2,5-bis[2-(vinyloxy)-ethyloxy]furan, 2,5-bis[2-(vinyloxy,)ethyloxy]thiophene, 2,5-bis[2-(vinyloxy) ethyloxy]imidazole, 2,2-bis {4-2-(vinyloxy)ethyloxy] phenyl}propane (bis[vinyloxyethyl]ether of bisphenol A), 2,2-bis[4-(vinyloxymethyloxy)phenyl]propane, and 2,2-bis [4-(vinyloxy)phenyl]propane are exemplified, but the invention is not limited to these compounds.

The details in usage of these addition polymerizable compounds, e.g., what a structure is to be used, whether the compounds are to be used alone or in combination, or what an amount is to be used, can be optionally set up according to the final design of the performances of the lithographic printing plate precursor. For example, these conditions are selected on the basis of the following aspects.

In the point of sensitivity, a structure containing many unsaturated groups per a molecule is preferred and bifunctional or higher functional groups are preferred in many cases. For increasing the strength of an image area, i.e., a hardened film, trifunctional or higher functional groups are preferred, and it is also effective to use different functional numbers and different polymerizable groups (e.g., acrylic ester, methacrylic ester, styrene compounds, vinyl ether compounds) in combination to control both speed and strength.

Further, the selection and usage of the addition polymerizable compounds are important factors for the compatibility with other components in an image-recording layer (e.g., a binder polymer (a nonaqueous polymer), a polymerization initiator, a colorant) and dispersibility, for example, in some cases compatibility can be improved by using low purity compounds or two or more compounds in combination. Further, it is also possible to select a compound having a specific structure for the purpose of improving the adhesion property to a support and other layers, e.g., a protective layer (also called an overcoat layer) described later.

Polymerizable compounds are used preferably in an amount of from 5 to 80 mass % of the total solids content constituting an image-recording layer, and more preferably from 25 to 75 mass %. Polymerizable compounds may be used alone, or two or more compounds may be used in combination.

<Polymerization Initiator>

A polymerization initiator usable in the invention is a compound capable of generating a radical by light or heat, or both of these energies, and initiating and accelerating polymerization of a compound having polymerizable unsaturated groups. As the polymerization initiators that can be used in the invention, well-known thermal polymerization initiators, compounds having a bond small in bond-dissociating energy, and photopolymerization initiators are exemplified. When an acid generator usable in the invention also has a function as a radical generator at the same time, it need not be necessary to use an acid generator and a radical generator in combination, and it is possible to use such a compound alone.

As radical polymerization initiators, e.g., organic halogen compounds, carbonyl compounds, organic peroxides, azo-based polymerization initiators, azide compounds, metallocene compounds, hexaarylbiimidazole compounds, organic boron compounds, disulfone compounds, oxime ester compounds, and onium salt compounds are exemplified.

As the organic halogen compounds, specifically, the compounds described in Wakabayashi et al., *Bull. Chem. Soc. Japan,* 42-2924 (1969), U.S. Pat. No. 3,905,815; JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, *Journal of Heterocyclic Chemistry*, 1 (No. 3) (1970) are exemplified. Of these compounds, oxazole compounds and s-triazine compounds substituted with a trihalomethyl group are preferably used.

More preferably, s-triazine derivatives in which at least one mono-, di- or tri-halogen-substituted methyl group is bonded to the s-triazine ring, specifically, e.g., 2,4,6- tris(monochloromethyl)-s-triazine, 2,4,6-tris(dichloro-methyl)-s-triazine, 2,4,6-tris(trichloromethyl)-s-triazine, 2-methyl-4,6-bis (trichloromethyl)-s-triazine, 2-n-propyl-4,6-bis(trichloromethyl)-s-triazine, 2-(α,α,β-trichloro-ethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis (trichloromethyl)-s-triazine, 2-styryl-4,6-bis (trichloromethyl)-s-triazine, 2-(p-methoxy-styryl)-4,6-bis (trichloromethyl)-s-triazine, 2-(p-i-propyl-oxystyryl)-4,6-bis(trichloromethyl)-s-triazine, 2-(p-tolyl)-4,6-bis (trichloromethyl)-s-triazine, 2-(4-methoxy-naphthyl)-4,6-bis(trichloromethbyl)-s-triazine, 2-phenyl-thio-4,6-bis (trichloromethyl)-s-triazine, 2-benzylthio-4,6-bis (trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis (tribromomethyl)-s-triazine are exemplified.

As the carbonyl compounds, benzophenone derivatives, e.g., benzophenone, Michler's ketone, 2-methylbenzophenone, 3-methylbenzophenone, 4-methylbenzophenone, 2-chlorobenzo-phenone, 4-bromobenzophenone, and 2-carboxybenzophenone, acetophenone derivatives, e.g., 2,2-dimethoxy-2-phenyl-acetophenone, 2,2-diethoxyacetophenone, 1-hydroxycyclohexyl phenyl ketone, α-hydroxy-2-methylphenylpropanone, 1-hydroxy-1-methylethyl-(p-isopropylphenyl) ketone, 1-hydroxy-1-(p-dodecylphenyl) ketone, 2-methyl-[4'-(methylthio)phenyl]-2- morpholino-1-propanone, and 1,1,1-trichloromethyl-(p-butyl-phenyl) ketone, thioxanthone derivatives, e.g., thioxanthone, 2-ethylthioxaiithone, 2-isopropylthioxanthone, 2-chloro- thioxanthone, 2,4-dimethylthioxanthone, 2,4-diethylthio-xanthone, and 2,4-diisopropylthioxanthone, and benzoic ester derivatives, e.g., ethyl p-dimethylaminobenzoate and ethyl p-diethylaminobenzoate are exemplified.

As the azo-based compounds, the azo compounds disclosed in JP-A-8-108621 can be used.

As the organic peroxides, e.g., trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydro-peroxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)-hexane, 2,5-oxanoyl peroxide, succinic acid peroxide, benzoyl peroxide, 2,4-dichlorobenzoyl peroxide, diisopropylperoxy dicarbonate, di-2-ethylhexylperoxy dicarbonate, di-2-ethoxy- ethylperoxy dicarbonate, dimethoxyisopropylperoxy carbonate; di(3-methyl-3-methoxybutyl-peroxy dicarbonate, tert-butyl-peroxy acetate, tert-butylperoxy pivalate, tert-butylperoxy neodecanoate, tert-butylperoxy octanoate, tert-butylperoxy laurate, tersyl carbonate, 3,3',4,4'-tetra(t-butylperoxy-carbonyl)benzophenone, 3,3',4,4'-tetra(t-hexylperoxy-carbonyl)benzophenone, 3,3',4,4'-tetra (p-isopropylcumyl-peroxycarbonyl)benzophenone, carbonyldi(t-butylperoxy-dihydrogendiphthalate), and carbonyldi(t-hexylperoxy-dihydrogendiphthalate) are exemplified.

As the metallocene compounds, various titanocene compounds disclosed in JP-A-59-152396, JP-A-61-151197, JP-A-63-41484, JP-A-2-249, JP-A-2-4705 and JP-A-5-83588, e.g., dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti- bis-2,3,4,5,6-pentafluorophen-1-yl, and the iron-arene complexes disclosed in JP-A-1-304453 and JP-A-1-152109 are exemplified.

As the hexaarylbiimidazole compounds, various compounds disclosed in JP-B-6-29285, U.S. Pat. Nos. 3,479,185, 4,311,783 and 4,622,286, specifically, e.g., 2,2'-bis(o-chlorophenyl)-4,4',5,5'-tetraphenylbiimidazole, 2,2'-bis(o-bromophenyl)-4,4', 5,5'-tetraphenylbiimidazole, 2,2'-bis(o,p-dichloro-phenyl)-4,4',5,5'-tetraphenylbiimidazole, 2,2'-bis-(o-chlorophenyl)-4,4',5,5'-tetra(m-methoxyphenyl) biimidazole, 2,2'-bis(o,o'-dichlorophenyl)-4,4',5,5'-tetraphenyl-buimidazole, 2,2'-bis(o-nitrophenyl)-4,4',5,5'-tetraphenyl- biimidazole, 2,2'-bis(o-methylphenyl)-4,4',5,5'-tetra-phenylbiimidazole, and 2,2'-bis(o-trifluorophenyl)-4,4',5,5'-tetraphenylbiimidazole are exemplified.

As the organic boron compounds, e.g., the organic borates disclosed in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Kunz, Martin, "Rad Tech '98 Proceeding Apr. 19-22, 1998, Chicago", the organic boron sulfonium complexes or the organic boron oxosulfonium complexes disclosed in JP-A-6-157623, JP-A-6-175564 and JP-A-6-175561, the organic boron iodonium complexes disclosed in JP-A-6-175554 and JP-A-6-175553, the organic boron phosphonium complexes disclosed in JP-A-9-188710, and the organic boron transition metal coordination complexes disclosed in JP-A-6-348011, JP-A-7-128785, JP-A-7-140589, JP-A-7-306527 and JP-A-7-292014 are exemplified.

As the disulfone compounds, the compounds disclosed in JP-A-61-166544 and JP-A-2003-328465 are exemplified.

As the oxime ester compounds, the compounds described in J. C. S. Perkin II, 1653-1660 (1979), J. C. S. Perkin II, 156-162 (1979), *Journal of Photopolymer Science and Technology,* 202-232 (1995), JP-A-2000-66385, the compounds disclosed in JP-A-2000-80068, specifically the compounds represented by the following formulae are exemplified.

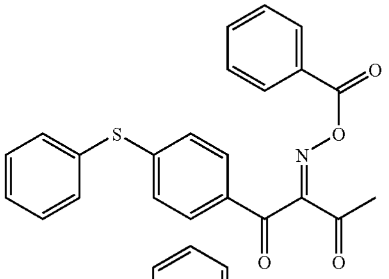

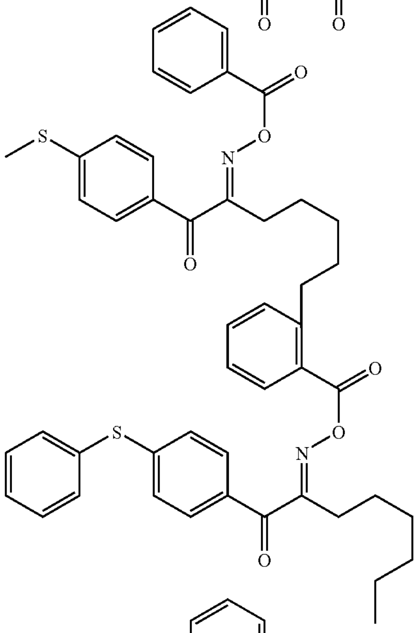

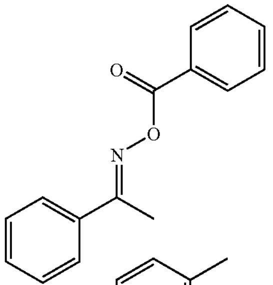

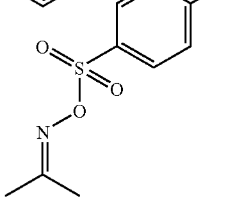

-continued

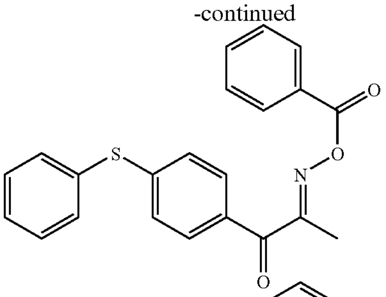

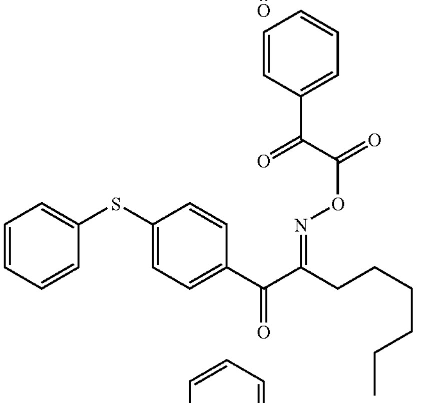

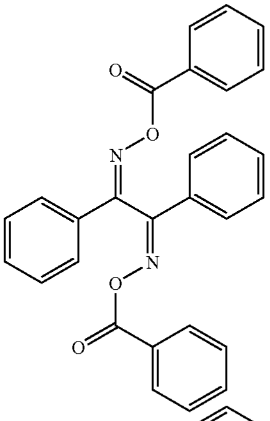

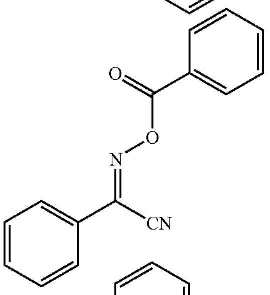

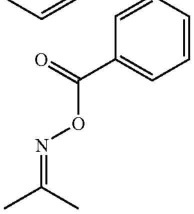

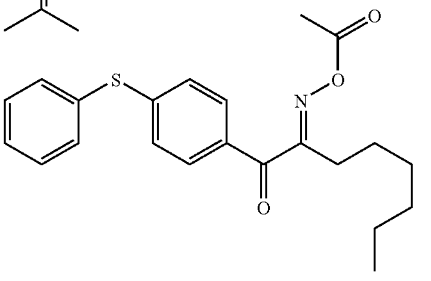

-continued

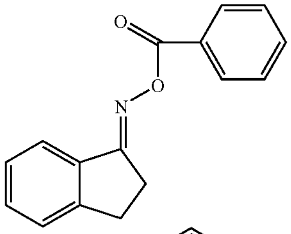

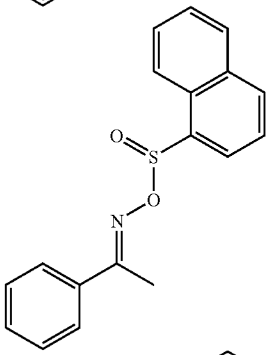

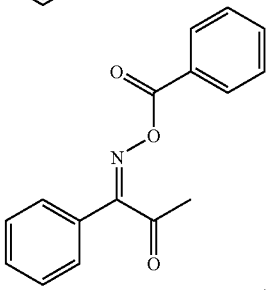

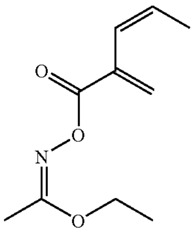

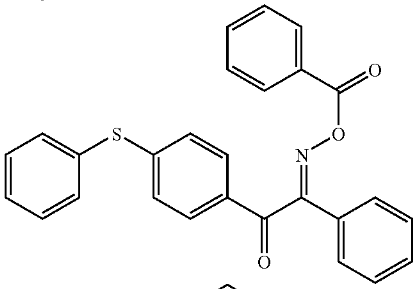

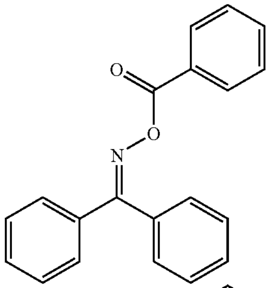

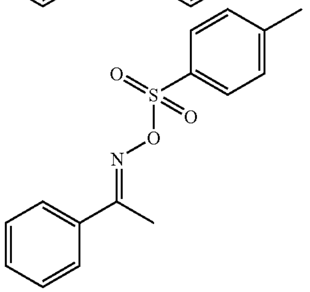

-continued

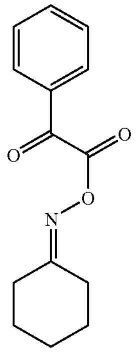

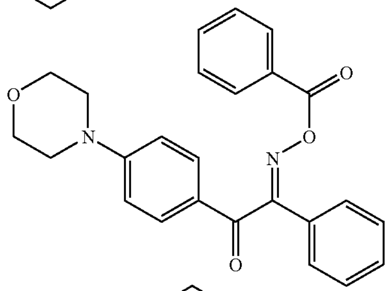

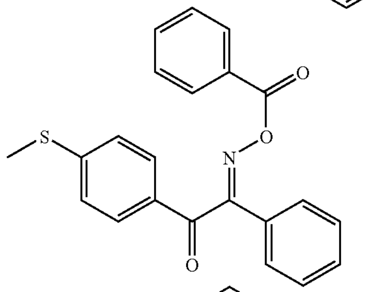

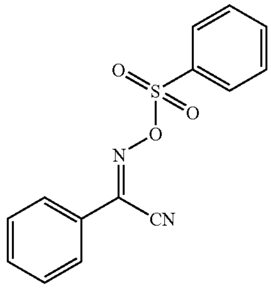

As the onium salt compounds, onium salts, e.g., the diazonium salts described in S. I. Schlesinger, *Photogr. Sci. Ens.*, 18,387 (1974), and T. S. Bal et al., *Polymer,* 21, 423 (1980), the ammonium salts disclosed in U.S. Pat. No. 4,069,055 and JP-A-4-365049, the phosphonium salts disclosed in U.S. Pat. Nos. 4,069,055 and 4,069,056, the iodonium salts disclosed in EP 104,143, U.S. Pat. Nos. 339,049, 410,201, JP-A-2-150848 and JP-A-2-296514, the sulfonium salts disclosed in EP 370,693, EP 390,214, EP 233,567, EP 297,443, EP 297,442, U.S. Pat. Nos. 4,933,377, 161,811, 410,201,339,049, 4,760,013, 4,734,444, 2,833,827, German Patent Nos. 2,904,626,3,604,580 and 3,604,581, the selenonium salts described in J. V. Crivello et al., *Macromolecules,* 10 (6), 1307 (1977), and J. V. Crivello et al., *J. Polymer Sci.*, Polymer Chem. Ed., 17, 1047 (1979), and the arsonium salts described in C. S. Wen et al., *Teh. Proc. Coiff, Rad. Curing ASIA*, p. 478, Tokyo, Oct (1988) are exemplified.

As preferred compounds particularly from the aspects of reactivity and stability, the oxime ester compounds and the onium salts (diazonium salts, iodonium salts and sulfonium salts) are exemplified.

The onium salts preferably used in the invention are onium salts represented by the following formula (RI-I), (RI-II) or (RI-III).

(RI-I)

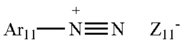

(RI-II)

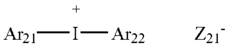

(RI-III)

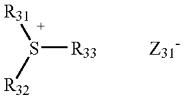

In formula (RI-I), $Ar_{11}$ represents an aryl group having 20 or less carbon atoms, which may have from 1 to 6 substituents, and as the preferred substituents, an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxyl group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms-are exemplified. $Z_{11}$ represents a monovalent anion, and specifically a halogen ion, a perchlorate ion, a hexafluorophosphate ion, a tetrafluoroborate ion, a sulfonate ion, a sulfinate ion, a thiosulfonate ion and a sulfate ion are exemplified. In particular, in view of stability, a perchlorate ion, a hexafluorophosphate ion, a tetrafluoroborate ion, a sulfonate ion and a sulfinate ion are preferred.

In formula (RI-II), $Ar_{21}$ and $Ar_{22}$ each represents an aryl group having 20 or less carbon atoms, which may have from 1 to 6 substituents, and as the preferred substituents, an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxyl group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms are exemplified. $Z_{21}$ represents a monovalent anion, and specifically a halogen ion, a perchlorate ion, a hexafluoro-phosphate ion, a tetrafluoroborate ion, a sulfonate ion, a sulfinate ion, a thiosulfonate ion and a sulfate ion are exemplified. In view of stability and reactivity, a perchlorate ion, a hexafluoropliosphate ion, a tetrafluoroborate ion, a sulfonate ion, a sulfinate ion and a carboxylate ion are preferred.

In formula (RI-III), $R_{31}$, $R_{32}$ and $R_{33}$ each represents an aryl, alkyl, alkenyl or alkynyl group having 20 or less carbon atoms, which may have from 1 to 6 substituents. Above all, in view of stability and reactivity, an aryl group is preferred. As the substituents, an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxyl group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms are exemplified. $Z_{31}$ represents a monovalent anion, and specifically a halogen ion, a perchlorate ion, a hexafluoro-phosphate ion, a tetrafluoroborate ion, a sulfonate ion, a sulfinate ion, a thiosulfonate ion, a sulfate ion, and a carboxylate ion are exemplified. In particular, in view of stability and reactivity, a perchlorate ion, a hexafluoro-phosphate ion, a tetrafluoroborate ion, a sulfonate ion, a sulfinate ion and a carboxylate ion are preferred. As more preferred carboxylate ions, the carboxylate ions disclosed in JP-A-2001-343742 are exemplified, and the carboxylate ions disclosed in JP-A-2002-148790 are particularly preferred.

The specific examples of the onium salt compounds are shown below, but the invention is not limited to these compounds.

(N-1)

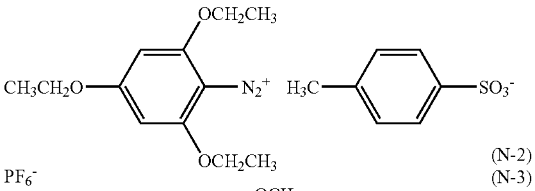

(N-2)

$PF_6^-$ (N-3)

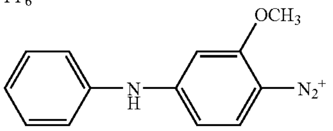

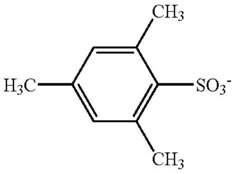

(N-4)

$ClO_4^-$ (N-5)

$PF_6^-$ (N-6)

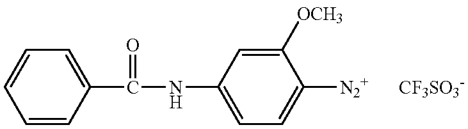

(N-7)

$BF_4^-$ (N-8)

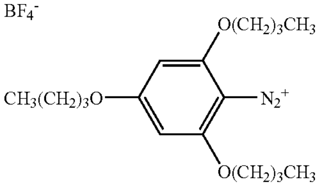

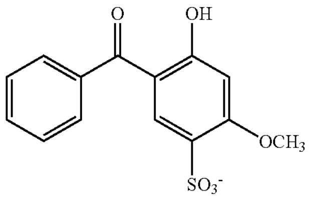

-continued
(N-9)
$ClO_4^-$
(N-10)
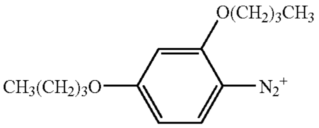
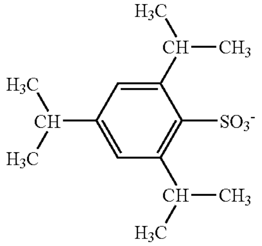
(N-11)
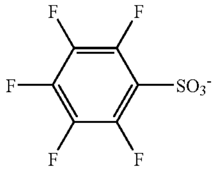
(N-12)
$PF_6^-$
(N-13)
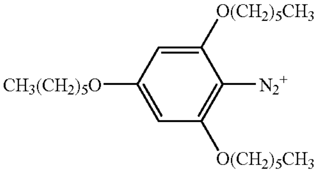
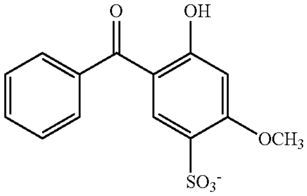
(N-14)
$ClO_4^-$
(N-15)
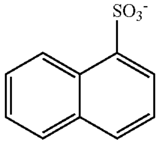
(N-16)
$PF_6^-$
(N-17)
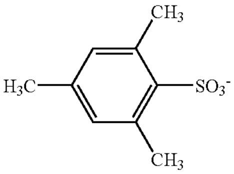
(I-1)
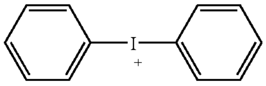
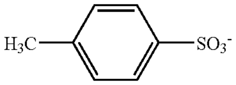
(I-2)
$PF_6^-$
-continued
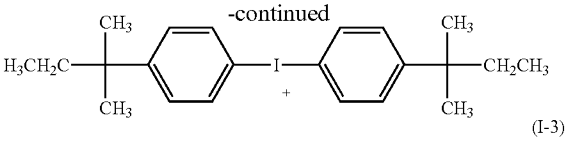
(I-3)
$PF_6^-$
(I-4)
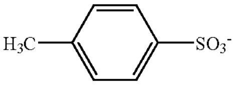
(I-5)
$ClO_4^-$
(I-6)
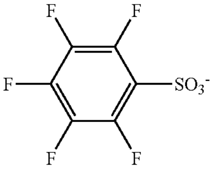
(I-7)
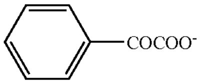
(I-8)
$CF_3SO_3^-$
(I-9)
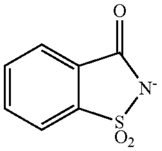
(I-10)
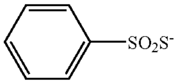
(I-11)
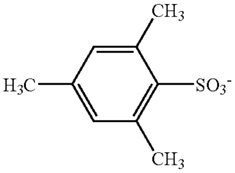
(I-12)
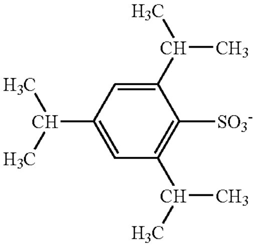
(I-13)
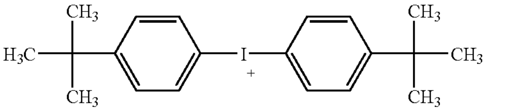
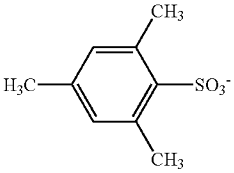
(I-14)
$ClO_4^-$
(I-15)
$C_4F_9SO_3^-$
(I-16)
$PF_6^-$ -continued
(I-17)
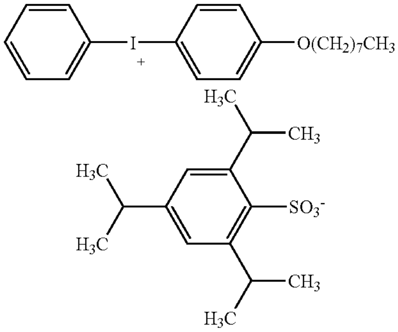
(I-18)
$CF_3COO^-$
(I-19)
$CF_3SO_3^-$
(I-20)
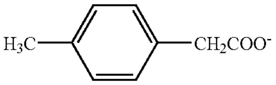
(I-21)
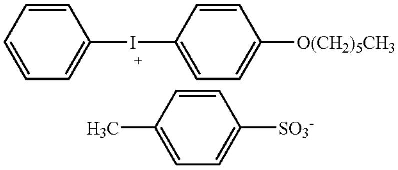
(I-22)
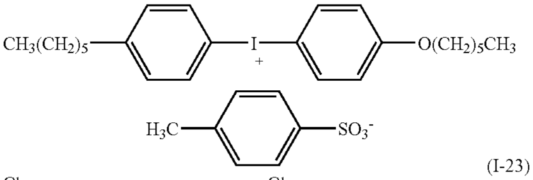
(I-23)
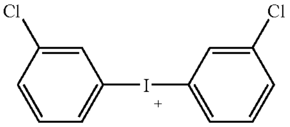
$BF_4^-$
(I-24)
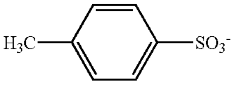
(I-25)
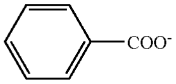
(S-1)
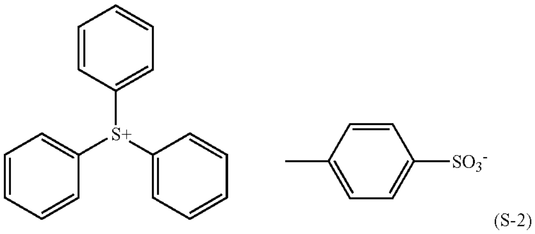
(S-2)
$PF_6^-$
(S-3)
$ClO_4^-$
(S-4)
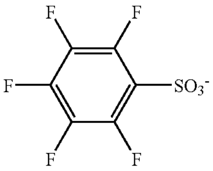
-continued
(S-5)
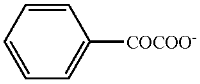
(S-6)
$CF_3SO_3^-$
(S-7)
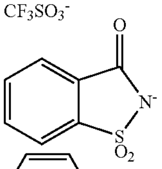
(S-8)
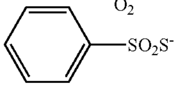
(S-9)
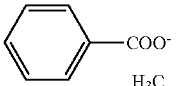
(S-10)
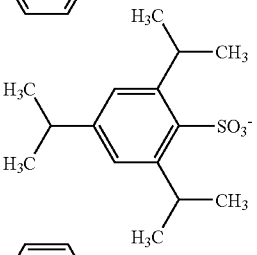
(S-11)
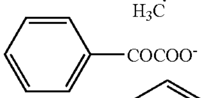
(S-12)
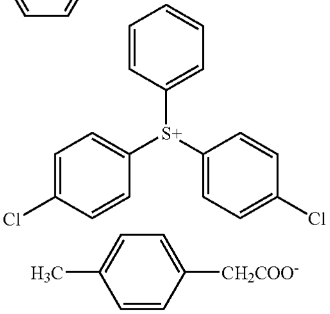
(S-13)
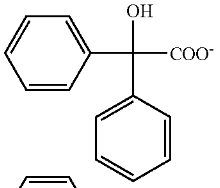
(S-14)
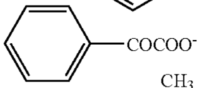
(S-15)
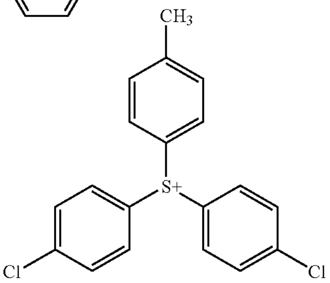
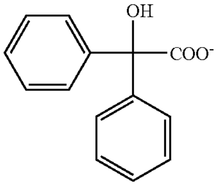

-continued (S-16)

$BF_4^-$ (S-17)

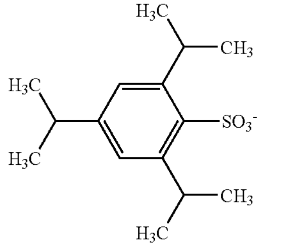

(S-18)

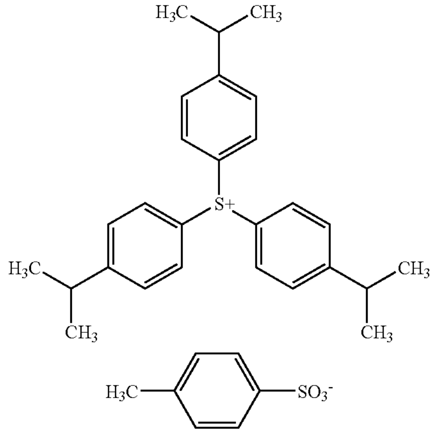

Polymerization initiators can be used preferably in an amount of from 0.1 to 50 mass % to the total solids content constituting the image-recording layer, more preferably from 0.5 to 30 mass %, and still more preferably from 1 to 20 mass %. By using polymerization initiators in this range, good sensitivity and soiling resistance of a non-image area in printing can be obtained. Polymerization initiators may be used alone, or two or more kinds of initiators may be used in combination. These polymerization initiators may be added with other components to one and the same layer, or another layer may be provided for the addition of polymerization initiators.

As radical polymerization initiator, onium salts are particularly preferably used. As the specific examples of the onium salts that can be preferably used as radical generators, the onium salts disclosed in JP-A-2001-133969, JP-A-2001-343742 and JP-A-2002-148790 are exemplified.

<Infrared Absorber>

An infrared absorber can be used in combination with the above polymerization initiator in an image-recording layer of a lithographic printing plate precursor that is imagewise exposed with a light source radiating infrared rays. An infrared absorber has a function of converting the absorbed infrared rays to heat, and a radical is generated by the thermal decomposition of a polymerization initiator by heat generated by the conversion. The infrared absorbers for use in the invention are dyes or pigments having an absorption maximum in the wavelengths of from 760 to 1,200 nm.

As the dyes for this purpose, commercially available dyes and well-known dyes described in literatures, e.g., *Senryo Binran* (*Dye Handbook*), compiled by Yuki Gosei Kagaku Kyokai (1970) can be used. Specifically, azo dyes, metal complex azo dyes, pyrazolone azo dyes, naphthoquinone dyes, anthraquinone dyes, phthalocyanine dyes, carbonium dyes, quinoneimine dyes, metline dyes, cyanine dyes, squarylium dyes, pyrylium salts and metal thiolate complexes are exemplified.

As preferred dyes, e.g., the cyanine dyes disclosed in JP-A-58-125246, JP-A-59-84356 and JP-A-60-78787, the methine dyes disclosed in JP-A-58-173696, JP-A-58-1:81690 and JP-A-58-194595; the naphthoquinone dyes disclosed in JP-A-58-112793, JP-A-58-224793, JP-A-59-48187, JP-A-59-73996, JP-A-60-52940 and JP-A-60-63744, the squarylium dyes disclosed in JP-A-58-112792, and the cyanine dyes disclosed in British Patent 434,875 are exemplified.

Further, the near infrared absorbing sensitizers disclosed in U.S. Pat. No. 5,156,938 are also preferably used, in addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethine thiopyrylium salts disclosed in U.S. Pat. No. 4,283,475, and the pyrylium compounds disclosed in JP-B-5-13514 and JP-B-5-19702 are also preferably used in the invention. As other examples of preferred dyes, the near infrared absorbing dyes disclosed in U.S. Pat. No. 4,756,993 as the compounds represented by formulae (I) and (II) can be exemplified.

Of these dyes, cyanine dyes, squarylium dyes, pyrylium salts, nickel thiolate complexes and indolenine cyanine dyes are exemplified as particularly preferred dyes. Cyanine dyes and indolenine cyanine dyes are more preferred, and as one particularly preferred example, a cyanine dye represented by the following formula (IV) is exemplified.

(IV)

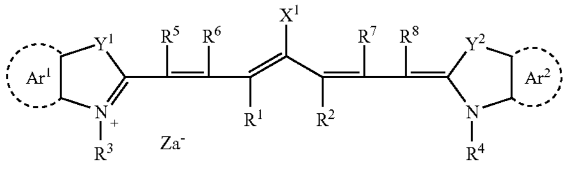

wherein $X^1$ represents a hydrogen atom, a halogen atom, —$NPh_2$, $X^2$-$L^1$, or a group shown below; $X^2$ represents an oxygen atom, a nitrogen atom or a sulfur atom; $L^1$ represents a hydrocarbon group having from 1 to 12 carbon atoms, an aromatic ring having a hetero atom, or a hydrocarbon group containing a hetero atom having from 1 to 12 carbon atoms. The hetero atoms here mean N, S, O, a halogen atom and Se. $X_a^-$ is defined as the same with the later-described $Z_a^-$, and $R^a$ represents a substituent selected from a hydrogen atom, an alkyl group, an aryl group, a substituted or unsubstituted amino group and a halogen atom.

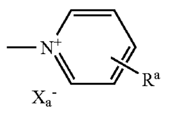

In formula (IV), $R^1$ and $R^2$ each represents a hydrocarbon group having from 1 to 12 carbon atoms. In view of the preservation stability of a recording layer coating solution, $R^1$ and $R^2$ each preferably represents a hydrocarbon group having 2 or more carbon atoms, and particularly preferably $R^1$ and $R^2$ are bonded to each other to form a 5- or 6-membered ring.

$Ar^1$ and $Ar^2$, which may be the same or different, each represents an aromatic hydrocarbon group which may have a substituent. The examples of preferred aromatic hydrocarbon groups include a benzene ring and a naphthalene ring. The examples of the preferred substituents include a hydrocarbon group having 12 or less carbon atoms, a halogen atom, and an alkoxyl group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. The examples of the preferred substituents include an alkoxyl group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms, preferably a hydrogen atom because of easy availability of the material. $Z_a^-$ represents a counter anion, provided that when a cyanine dye represented by formula (IV) has an anionic substituent within the structure and the neutralization of the electric charge is not necessary, $Z_a^-$ is not necessary. $Z_a^-$ preferably represents a halogen ion, a perchlorate ion, a tetrafluoroborate ion, a hexafluorophosphate ion or a sulfonate ion for the preservation stability of the recording layer coating solution, and particularly preferably $Z_a^-$ represents a perchliorate ion, a hexafluorophosphate ion or an arylsulfonate ion.

As the specific examples of cyanine dyes represented by formula (IV) that can be preferably used in the invention, those disclosed in JP-A-2001-133969, paragraphs [0017] to [0019] are exemplified.

Further, as particularly preferred other examples of infrared absorbers, the specific indolenine cyanine dyes disclosed in JP-A-2002-278057 are exemplified.

As the pigments for use in the present invention, commercially available pigments and the pigments described in *Color Index* (*C.I.*) *Binran* (*Color Index Bulletin*), *Shaishin Ganryo Binran* (*The Latest Pigment Handbook*), compiled by Nippon Ganryo Gijutsu Kyokai (1977), *Shaishin Ganryo Oyo Gijutsu* (*The Latest Pigment Applied Techniques*), CMC Publishing Co. Ltd. (1986), *Insatsu Ink Gijutsu* (*Printing Ink Techniques*), CMC Publishing Co. Ltd. (1984) can be used.

Various kinds of pigments can be used in the invention, e.g., black pigments, yellow pigments, orange pigments, brown pigments, red pigments, purple pigments, blue pigments, green pigments, fluorescent pigments, metallic powder pigments, and polymer-bond pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used. Of these pigments, carbon black is preferably used.

These pigments can be used without surface treatment or the surfaces may be treated. As the methods of surface treatments, a method of coating the surfaces of pigments with resins and waxes, a method of adhering surfactants, and a method of bonding reactive substances. (e.g., silane coupling agents, epoxy compounds, or polyisocyanate) on the surfaces of pigments can be exemplified. These surface treatment methods are described in *Kinzoku Sekken no Seishitsu to Oyo* (*Natures and Applications of Metal Soaps*), Saiwai Shobo, *Insatsu Ink Gijutsu* (*Printing Ink Techniques*), CMC Publishing Co., Ltd. (1984), and *Shaishin Ganryo Oyo Gijutsu* (*The Latest Pigment Applied Techniques*), CMC Publishing Co., Ltd. (1986).

The particle size of pigments is preferably in the range of 0.01 to 10 μm, more preferably in the range of 0.05 to 1 μm, and particularly preferably in the range of 0.1 to 1 μm. When the particle size of pigments is in this range, stability of the pigment dispersion in an image-recording layer coating solution and uniformity of an image-recording layer can be obtained.

Well-know dispersing techniques used in the manufacture of inks and toners can be used as the dispersing method of pigments in the invention. The examples of dispersing apparatus include an ultrasonic disperser, a sand mill, an attritor, a pearl mill, a super-mill, a ball mill, an impeller, a disperser, a KD mill, a colloid mill, a dynatron, a three-roll mill and a pressure kneader, and details are described in *Shaishin Ganryo Oyo Gijutsu* (*The Latest Pigment Application Techniques*), CMC Publishing Co. Ltd. (1986).

It is preferred that the addition amount of infrared absorbers to an image-recording layer be the necessary minimum amount for restraining the side reactions hindering the polymerization reaction.

Infrared absorbers can be used preferably in an amount of from 0.001 to 50 mass % to the total solids content in the image-recording layer, more preferably from 0.005 to 30 mass %, and still more preferably from 0.01 to 10 mass %. When the amount of infrared absorbers is in this range, high sensitivity can be obtained without exerting unfavorable influence upon the uniformity and layer strength of an image-recording layer.

<Sensitizer>

A sensitizer can be used in combination with the above polymerization initiator in an image-recording layer of a lithographic printing plate precursor that is imagewise exposed with a light source radiating rays of from 250 to 420 nm, whereby the rate of radical generation can be increased.

The specific examples of the sensitizers include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanithone, thioxanthone, benzyl, dibeizalacetone, p-(dimethylamino)phenyl styryl ketone, p-(dimethylamino)- phenyl p-methyl styryl ketone, benzophenone, p-(dimethyl-amino)benzophenone (or Michler's ketone), p-(diethylamino)-benzophenone, and beizanthrone.

Further, as a sensitizer preferably used in the invention, a compound represented by formula (V) disclosed in JP-B-51-48516 is exemplified.

(V)

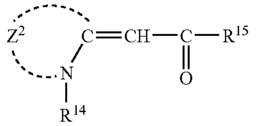

In formula (V), $R^{14}$ represents an alkyl group (e.g., a methyl group, an ethyl group, a propyl group, etc.), or a substituted alkyl group (e.g., a 2-hydroxyethyl group, a 2-methoxyethyl group, a carboxymethyl group, a 2-carboxyethyl group, etc.); $R^{15}$ represents an alkyl group (e.g., a methyl group, an ethyl group, etc.), or an aryl group (e.g., a phenyl group, a p-hydroxyphenyl group, a naphthyl group, a thienyl group, etc.).

$Z^2$ represents a non-metallic atomic group necessary to form a heterocyclic nucleus containing a nitrogen atom generally used in cyanine dyes, e.g., benzothiazoles (e.g., benzothiazole, 5-chlorobenzothiazole, 6-chlorobenzo-thiazole, etc.), naphthothiazoles (e.g., α-naphthothiazole, β-naphthothiazole, etc.), benzoselenazoles (e.g., benzo-selenazole, 5-chlorobenzoselenazole, 6-methoxybenzo-selenazole, etc.), naphthoselenazoles (e.g., α-naphtho-selenazole, β-naphthoselenazole, etc.), benzoxazoles (e.g., benzoxazole, 5-methylbenzoxazole, 5-phenylbenzoxazole, etc.), and naphthoxazoles (e.g., α-naphthoxazole, β-naphthoxazole, etc.).

The specific examples of the compounds represented by formula (V) have chemical structures in which $Z^2$, $R^{14}$ and $R^{15}$ are variously combined, and many compounds are present as well-known compounds. Accordingly, the compounds represented by formula (V) can be arbitrarily selected from well-known compounds. Further, as the preferred sensitizers in the invention, the merocyanine dyes disclosed in JP-B-547095 and the ketocoumarin-based compounds represented by the following formula (VI) are also exemplified.

(VI)

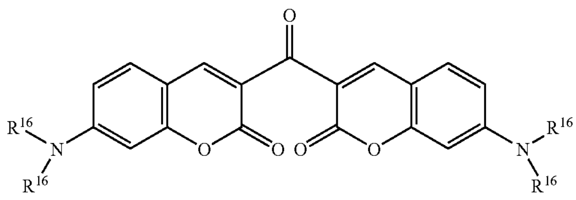

wherein $R^{16}$ represents an alkyl group, e.g., a methyl group or an ethyl group.

The merocyanine dyes disclosed in JP-A-2000-147763 can also be used as a sensitizer.

The addition amount of these sensitizers is preferably from 0.1 to 50 mass % to the total solids content constituting an image-recording layer, more preferably from 0.5 to 30 mass %, and particularly preferably from 0.8 to 20 mass %.

<Other Components of Image-Recording Layer>

In addition to the above components, various additives such as a binder polymer, a surfactant, a colorant, a polymerization inhibitor, a higher fatty acid derivative; a plasticizer, inorganic fine particles and a low molecular weight hydrophilic compound can be added to the radical polymerization system image-recording layer of the invention, if necessary. These additives are described below.

<Binder Polymer>

A binder polymer can be used in the image-recording layer in the invention. The binder polymers usable in the invention are not particularly restricted and well known compounds can be used, and linear organic polymers having a film-forming property are preferably used. The examples of such binder polymers include acrylic resins, polyvinyl acetal resins, polyurethane resins, polyurea resins, polyimide resins, polyamide resins, epoxy resins, methacrylic resins, polystyrene resins, novolak type phenolic resins, polyester resins, synthetic rubbers and natural rubbers.

It is preferred for binder polymers to have a crosslinking property to improve the film strength of an image area. To give a crosslinking property to binder polymers, it is effective to introduce a crosslinkable functional group such as an ethylenic unsaturated bond to the main chain or side chain of the binder polymers. A crosslinkable functional group may be introduced by copolymerization.

As the examples of polymers having an ethylenic unsaturated bond on the main chain of the molecule, poly-1,4-butadiene and poly-1,4-isoprene are exemplified.

As the examples of polymers having an ethylenic unsaturated bond on the side chain of the molecule, polymers of esters or amides of acrylic acid or methacrylic acid, wherein the residue of the ester or amide (R of —COOR or —CONHR) has an ethylenic unsaturated bond are exemplified.

The examples of the residues having an ethylenic unsaturated bond (the above-described R) include, $-(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^1{=}CR^2R^3$ and $(CH_2CH_2O)_2-X$ (wherein $R^1$, $R^2$ and $R^3$ each represents a hydrogen atom, a halogen atom, an alkyl group having from 1 to 20 carbon atoms, an aryl group, an alkoxyl group or an aryloxy group, and $R^1$ and $R^2$ or $R^3$ may be bonded to each other to form a ring, n represents an integer of from 1 to 10, and X represents a dicyclopentadienyl residue).

The specific examples of the ester residues include $-CH_2CH{=}CH_2$ (disclosed in JP-B-7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2-NHCOO-CH_2CH{=}CH_2$ and $CH_2CH_2O-X$ (wherein X represents a dicyclopentadienyl residue).

The examples of the amido residues include $-CH_2CH{=}CH_2$, $-CH_2CH_2-Y$ (wherein Y represents a cyclohexene residue), and $-CH_2CH_2-OCO-CH{=}CH_2$.

When free radicals (polymerization initiation radicals or the grown radicals of a polymerizable compound in the polymerization process) are added to the crosslinkable functional groups of a binder polymer having a crosslinking property, addition polymerization occurs directly between the polymers or via the polymerization chains of the polymerizable compound, as a result, crosslinking is formed between the molecules of the polymers and the binder polymer is hardened. Alternatively, the atoms in the polymer (e.g., the hydrogen atoms on the carbon atoms contiguous to crosslinkable functional groups) are extracted by free radicals and polymer radicals are grown, the polymer radicals are bonded to each other, whereby crosslinking is formed between the polymer molecules, so that the binder polymer is hardened.

The amount of the crosslinkable groups contained in a binder polymer (the amount contained of radical polymerizable-unsaturated double bonds by the iodometric-titration-method) is preferably from 0.1 to 10.0 mmol per gram of the binder polymer, more preferably from 1.0 to 7.0 mmol, and most preferably from 2.0 to 5.5 mmol. Good sensitivity and good preservation stability can be obtained with this range of crosslinkable groups.

From the viewpoint of the improvement of the on-press developing properties, it is preferred that binder polymers have high solubility and dispersibility in ink and/or a fountain solution.

For improving the solubility and dispersibility in ink, binder polymers are preferably lipophilic, and for improving the solubility and dispersibility in a fountain solution, binder polymers are preferably hydrophilic. Accordingly, in the invention, it is also effective to use a lipophilic binder polymer and a hydrophilic binder polymer in combination.

As hydrophilic binder polymers, binder polymers having a hydrophilic group, e.g., a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group are preferably exemplified.

The specific examples of hydrophilic binder polymers include gumi arabic, casein, gelatin, starch derivatives, sova gumin, carboxymethyl cellulose and the sodium salt thereof, cellulose acetate, sodium alginate, vinyl acetate-maleic acid copolymers, styrene-maleic acid copolymers, polyacrylic acids and the salts thereof, polymethacrylic acids and the salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acryl ate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of 60 mol % or more, preferably 80 mol % or more, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, alcohol-soluble nylon, polyether of 2,2-bis(4-hydroxyphenyl)propane and epichlorohydrin, homopolymers and copolymers of 2-acrylamide-2-methyl-1-propanesulfonate, and 2-methacryloyloxyethyl-phosphonate.

Binder polymers have a weight average molecular weight of preferably 5,000 or higher, more preferably from 10,000 to 300,000, and a number average molecular weight of preferably 1,000 or higher, more preferably from 2,000 to 250,000. The degree of polydispersion (weight average molecular weight/number average molecular weight) is preferably from 1.1 to 10.

Binder polymers may be any of a random polymer, a block polymer and a graft polymer, but a random polymer is preferred. Binder polymers may be used alone or as a mixture of two or more.

Binder polymers are used in an amount of preferably from 5 to 90 mass % to the total solids content of an image-forming layer, more preferably from 5 to 80 mass %, and still more preferably from 10 to 70 mass %. When binder polymers are used in this range, preferred strength of an image area and good image-forming property can be obtained. It is preferred to use a polymerizable compound and a binder polymer in mass ratio of from 0.5/1 to 4/1.

<Surfactant>

In the invention, it is preferred to use a surfactant in an image-recording layer to accelerate the on-press development property at the time of initiating printing and to improve the conditions of coating surface. As the surfactants for these purposes, nonionic surfactants, anionic surfactants, cationic surfactants, amphoteric surfactants and fluorine surfactants are used. Surfactants may be used alone or two or more surfactants may be used in combination.

The nonionic surfactants for use in the invention are not particularly restricted and conventionally well known surfactants can be used, e.g., polyoxyethylene alkyl ethers, polyoxyethylene alkyl phenyl ethers, polyoxyethylene polystyryl phenyl ethers, polyoxyethylene polyoxypropylene alkyl ethers, glycerol fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxy- ethylene alkylamine, triethanolamnne fatty acid esters, trialkylamine oxide, polyethylene glycol, and copolymers of polyethylene glycol and polypropylene glycol are exemplified.

The anionic surfactants for use in the invention are not particularly restricted and conventionally well known surfactants can be used, e.g., fatty acid salts, abietates, hydroxyalkanesulfonates, alkanesulfonates, dialkylsulfo-succinates, straight chain alkylbenzenesulfonates, branched chain alkylbenzenesulfonates, alkylnaphthalenesulfonates, alkylphenoxy polyoxyethylene propyl sulfonates, polyoxy-ethylene alkyl sulfophenyl ethers, sodium N-methyl-N-oleyl-taurine, disodium N-alkylsulfosuccinic acid monoamide, petroleum sulfonates, sulfated beef tallow, sulfuric esters of fatty acid alkyl ester, alkylsulfurates, polyoxyethylene alkyl ether sulfuric esters, fatty acid monoglyceride sulfuric esters, polyoxyethylene alkyl phenyl ether sulfuric esters, polyoxyethylene styryl phenyl ether sulfuric esters, alkyl-phosphoric esters, polyoxyethylene alkyl ether phosphoric esters, polyoxyethylene alkyl phenyl ether phosphoric esters, partial saponification products of styrene/maleic anhydride copolymers, partial saponification products of olefin/maleic anhydride copolymers, and naphthalene sulfonate formaldehyde condensation products are exemplified.

The cationic surfactants for use in the invention are not particularly restricted and conventionally well known surfactants can be used, e.g., alkylamine salts, quaternary ammonium salts, polyoxyethyene alkylamine salts, and polyethylene polyamine derivatives are exemplified.

The amphoteric surfactants for use in the invention are not particularly restricted and conventionally well known surfactants can be used, e.g., carboxybetaines, amino-carboxylic acids, sulfobetaines, aminosulfuric esters and imidazolines are exemplified.

In the above surfactants, "polyoxyethylene" can be taken as "polyoxyalkylene" such as polyoxymethylene, polyoxypropylene, and polyoxybutylene, and these surfactants can also be used in the invention.

As more preferred surfactants, fluorine surfactants containing a perfluoroalkyl group in the molecule are exemplified. As such surfactants, anionic surfactants, e.g., perfluoroalkylcarboxylate, perfluoroalkylsulfonate, and perfluoroalkylphosphate; amphoteric surfactants, e.g., perfluoroalkylbetaine; cationic surfactants, e.g., perfluoroalkyltrimethylammonium salt; and nonionic surfactants, e.g., perfluoroalkylamine oxide, perfluoroalkyl ethylene oxide addition products, oligomers containing a perfluoroalkyl group and a hydrophilic group, oligomers containing a perfluoroalkyl group and a lipophilic group, oligomers containing a perfluoroalkyl group, a hydrophilic group and a lipophilic group, and urethane containing a perfluoroalkyl group and a lipophilic group are exemplified. Further, the fluorine surfactants disclosed in JP-A-62-170950, JP-A-62-226143 and JP-A-60-168144 are also preferably used.

Surfactants can be used alone, or two or more surfactants can be used in combination.

Surfactants are preferably used in an amount of from 0.001 to 10 mass % to the total solids content of the image recording layer, more preferably from 0.01 to 7 mass %.

<Auxiliary Coupler and Color Developer>

In addition to spiropyran and/or spirooxazine series compounds, auxiliary couplers and color developers can be added to an image-recording layer in the invention.

As such couplers, (i) triarylmethane series, (ii) diphenylmethane series, (iii) xanthene series, (vi) thiazine series compounds, and (v) leuco dyes are exemplified.

Specifically, Crystal Violet Lactone, Malachite Green Lactone, Benzoyl Leuco Methylene Blue, 3-(N,N-diethylamino)-6-chloro-7-(β-ethoxyethylamino)fluoran, 3-(N,N,N-triethyl-amino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethyl-amino)-6-methyl-7-chlorofluoran, 3-(N,N-diethylamino)-6-methoxy-7-aminofluoran, 3-(N,N-diethylamino)-7-(4-chloro-anilino) fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidino-fluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methyl-indol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)-phthalide are examplified. These dyes may be used alone or as a mixture.

As the leuco dyes, the leuco dyes disclosed in U.S. Pat. No. 3,445,234 can be exemplified. That is, aminotriarylmethanes, aminoxanthenes, aminothioxanthenes, amino-9,10-dihydroacridines, aminophenoxazines, aminophenothiazines, amino-dihydrophenazines, aminodiphenylmethanes, leucoindamines-aminohydrocinnamic acid (cyanoethane, leucbmethines)-hydrazines, leucoindigoid dyes, amino-2,3-dihydroanthra-quinones, tetrahalo-p,p'-biphenols, 2-(p-hydroxyphenyl)-4,5-diphenylimidazoles and phenethylanilines can be exemplified.

As the color developers, phenolic compounds, organic acids and metal salts of the organic acids, hydroxybenzoic acid ester and acid clay are used.

The specific examples of the phenolic compounds include 4,4'-isopropylidenediphenol (bisphenol A), p-tert-butyl-phenol, 2,4-dinitrophenol, 3,4-dichlorophenol, 4,4'-methylenebis(2,6-di-tert-butylphenol), p-phenylphenol, 1,1-bis(4-hydroxyphenyl)cyclohexane, 1,1-bis(4-hydroxy- phenyl)-2-ethylhexane, 2,2-bis(4-hydroxyphenyl)butane, 2,2'-methylenebis(4-tert-butylphenol), 2,2'-methylenebis-(α-phenyl-p-cresol)tluiodiphenol, 4,4'-thiobis(6-tert-butyl-m-cresol), sulfonyldiphenol are exemplified and, in addition to these, p-tert-butylphenol-formaldehyde condensation products and p-phenylphenol-formaldehyde condensation products are exemplified.

As the organic acids and metal salts of the organic acids, phthalic acid, phthalic anhydride, maleic acid, benzoic acid, gallic acid, o-toluic acid, p-toluic acid, salicylic acid, 3-tert-butylsalicylic acid, 3,5-di-3-tert-butylsalicylic acid, 5-α-methylbenzylsalicylic acid, 3,5-bis(α-methyl-benzyl)salicylic acid, 3-tert-octylsalicylic acid, and zinc salt, lead salt, aluminum salt, magnesium salt, nickel salt thereof are exemplified. Salicylic acid derivatives and zinc salt and aluminum salt thereof are excellent in color developing property.

As the hydroxybenzoic acid ester, ethyl p-hydroxy- benzoate, butyl p-hydroxybenzoate, heptyl p-hydroxybenzoate, and benzyl p-hydroxybeiizoate are exemplified.

These couplers and color developers are dissolved or solid-dispersed in an appropriate solvent and coated on an image recording layer, or encapsulated in a microcapsule as described later and added to an image-recording layer. The methods of solid dispersion and microencapsulation are preferred for the reason that the hindrance of the reaction systems of a printout image-forming reaction system and a print image-forming reaction system can be avoided by separating one from another. Couplers and color developers can be added to an overcoat layer and an undercoat layer besides an image-recording layer.

The addition amount of couplers per a unit area of a lithographic printing plate precursor is preferably from 0.001 to 1 g/m$^2$, more preferably from 0.005 to 0.5 g/m$^2$, and most preferably from 0.01 to 0.3 g/m$^2$. The addition amount of color developers per a unit area of a lithographic printing plate precursor is preferably from 0.001 to 1 g/m$^2$, more preferably from 0.005 to 0.5 g/m$^2$, and most preferably from 0.01 to 0.3 g/m$^2$.

<Colorant>

Further, if necessary, various compounds besides the above compounds can be used in the invention. For example, dyes having large absorption in the visible ray region can be used as the colorants of images. Specifically, Oil Yellow #101, Oil Yellow #103, Oil Pink #312, Oil Green BQ Oil Blue BOS, Oil Blue #603, Oil Black BY, Oil Black BS, Oil Black T-505 (products of Orient Chemical Industry Co., Ltd.), Victoria Pure Blue, Crystal Violet (C.I. 42555), Methyl Violet (C.I. 42535), Ethyl Violet, Rhodamine B :(C.I. 145170B), Malachite-Green (G.I.-42000), Methylene Blue(C.I. 52015) and the dyes disclosed in JP-A-62-293247 can be exemplified. In addition, pigments such as phthalocyanine pigments, azo pigments, carbon black and titanium oxide are also preferably used.

There are cases that colorants are added as auxiliary for the purpose of discriminating an image area from a non-image area after image formation. The preferred addition amount of colorants is from 0.01 to 10 mass % to the total solids content in the image-recording layer.

<Polymerization Inhibitor>

For preventing unnecessary thermal polymerization of a radical polymerizable compound during manufacture or preservation of an image-recording layer, it is preferred that a small amount of thermal polymerization inhibitor be added to an image-recording layer in the invention.

As the thermal polymerization inhibitors, e.g., hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t- butylphenol), and N-nitroso-N-phenylhydroxylamine aluminum salt are exemplified.

The amount of the thermal polymerization inhibitor is preferably from about 0.01 to about 5 mass % to the total solids content of the image-recording layer.

<Higher Fatty Acid Derivative, etc.>

For preventing the polymerization hindrance due to oxygen, higher fatty acid derivatives, e.g., behenic acid and behenic acid amide, may be added to an image-recording layer in the invention and locally exist on the surface of the image-recording layer in the drying process after coating. The addition amount of the higher fatty acid derivatives is preferably from about 0.1 to about 10 mass % to the total solids content of the image-recording layer.

<Plasticizer>

An image recording layer in the present invention may contain a plasticizer to improve on-press developing properties.

The examples of plasticizers include phthalic esters, e.g., dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phlithalate, diisodecyl phthalate, and diallyl phthalate; glycol esters, e.g., dimethyl glycol phthalate, ethyl phthalyl ethyl glycolate, methyl phthalyl ethyl glycolate, butyl phthalyl butyl glycolate, and triethylene glycol dicaprylate; phosphoric esters, e.g., tricresyl phosphate and triphenyl phosphate; aliphatic dibasic esters, e.g., diisobutyl adipate, dioctyl adipate, dimethyl sebacate, dibutyl sebacate, dioctyl azelate, and dibutyl maleate; and polyglycidyl methacrylate, triethyl citrate, glycerol triacetyl ester and butyl laurate.

The amount of plasticizers is preferably about 30 mass % or less to the total solids content of the image recording layer.

<Low Molecular Weight Hydrophilic Compound>

For the improvement of an on-press developing property, an image-recording layer in the invention may contain hydrophilic low molecular weight compounds. As the hydrophilic low molecular weight compounds, water-soluble organic compounds, such as glycols, e.g., ethylene glycol, diethylene glycol, triethylene glycol, propylene glycol, dipropylene glycol, and tripropylene glycol, and ether or ester derivatives of these glycols, polyhydroxies, e.g., glycerol and pentaerythritol, organic amines, e.g., triethanolamine, diethanolamine and monoethanolamine, and salts of these organic amines, organic sulfonic acids, e.g., toluenesulfonic acid and benzenesulfonic acid, and salts of these organic sulfonic acids, organic phosphonic acids, e.g., phenyl-phosphonic acid, and salts of organic phosphonic acids, and organic carboxylic acids, e.g., tartaric acid, oxalic acid, citric acid, malic acid, lactic acid, gluconic acid and amino acid, and salts of these organic carboxylic acids are exemplified.

<Formation of Polymerization System Image-Recording Layer>

For adding the above constitutional components of an image-recording layer to an image-recording layer, some methods can be used. One is a method of dissolving the constitutional components in a proper solvent and coating as disclosed in JP-A-2002-287334. Another method is a method of encapsulating the constitutional components of an image recording layer in microcapsules and adding the microcapsules to an image-recording layer (a microcapsule type image recording layer) as disclosed in JP-A-2001-277740 and JP-A-2001-277742. In the microcapsule type image-recording layer, an image-recording layer can contain the constitutional components also out of microcapsules. In a microcapsule type image-recording layer, it is more preferred to contain hydrophobic constitutional components in microcapsules and hydrophilic constitutional components out of microcapsules.

To microencapsulate an infrared absorber, a radical polymerization initiator and a compound capable of causing color change by the action of a radical of the constitutional components of an image-recording layer is more preferred for the reason that the hindrance of the reaction systems of a printout image-forming reaction system and a print image- forming reaction system can be avoided by separating one from another, as a result good printout image and good press life can be obtained.

For obtaining better on-press developing properties, it is advantageous to use a microcapsule type image-recording layer.

The constitutional components of an image-recording layer can be encapsulated in a microcapsule by well-known methods. For example, as the manufacturing method of microcapsules, a method making use of coacervation as disclosed in U.S. Pat. Nos. 2,800,457 and 2,800,458, an interfacial polymerization method as disclosed in U.S. Pat. No. 3,287,154, JP-B-38-19574 and JP-B-42-446, a method by the precipitation of a polymer as disclosed in U.S. Pat. Nos. 3,418,250 and 3,660,304, a method of using isocyanate polyol wall materials as disclosed in U.S. Pat. No. 3,796,669, a method of using isocyanate wall materials as disclosed in U.S. Pat. No. 3,914,511, a method of using urea-formaldehyde series or urea-formaldehyde-resorcinol series wall materials as disclosed in U.S. Pat. Nos. 4,001,140, 4,087,376 and 4,089,802, a method of using wall materials such as melamine-formaldehyde resins and hydroxy cellulose as disclosed in U.S. Pat. No. 4,025,445, a monomer polymerization in situ method as disclosed in JP-B-36-9163 and JP-B-51-9079, a spray drying method as disclosed in British Patent 930,422 and U.S. Pat. No. 3,111,407, and an electrolytic dispersion cooling method as disclosed in British Patents 952,807 and 967,074 can be exemplified, but the invention is not limited to these methods.

The microcapsule walls preferably used in the invention have three dimensional crosslinking and a property of swelling by a solvent. From this point of view, polyurea, polyurethane, polyester, polycarbonate, polyamide, and the mixtures of these compounds are preferably used as microcapsule wall materials, and polyurea and polyurethane are particularly preferred. Compounds having crosslinkable functional groups such as the above binder polymer-introducible ethylenic unsaturated bonds may be introduced into a microcapsule wall.

The average particle size of the microcapsules is preferably from 0.01 to 3.0 μm, more preferably from 0.05 to 2.0 μm, and particularly preferably from 0.10 to 1.0 μm. Good resolution and aging stability can be obtained in this range of particle size.

An image-recording layer in the invention is formed by coating a coating solution prepared by dispersing or dissolving the above necessary constitutional components. As solvents used here, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethyl- formamide, tetramethylurea, N-methylpyrrolidone, dimethyl sulfoxide, sulforan, γ-butyrolactone, toluene, and water are exemplified, but solvents are not limited thereto. These solvents are used alone or as a mixture. The concentration of the solids content of a coating solution is preferably from 1 to 50 mass %.

It is also possible to form an image-recording layer in the invention by preparing a plurality of coating solutions by dispersing or dissolving the same or different components in the same or different solvents, and repeating the coating and drying a plurality of times.

Although the coating amount of an image-forming layer (solids content) on a support obtained after coating and drying varies according to uses, it is generally preferably from 0.3 to 3.0 $g/m^2$. When the coating amount is in this range, good sensitivity and good film properties of an image-recording layer can be obtained.

Various coating methods can be used. For example, bar coating, rotary coating, spray coating, curtain coating, dip coating, air knife coating, blade coating, and roll coating can be used.

(B) Image-forming components of hydrophobitizing precursor:

<Hydrophobitizing Precursor>

Hydrophobilizing precursors in the invention are fine particles capable of converting a hydrophilic image-recording layer to hydrophobic upon heating. Such fine particles are preferably at least one kind of fine particles selected from thermoplastic polymer fine particles and thermo-reactive polymer fine particles. Further, the fine particles may be microcapsules encapsulating a compound having a thermo-reactive group.

As the thermoplastic polymer fine particles used in the invention, the thermoplastic polymer fine particles described in Research Disclosure, No. 33303, January (1992), JP-A-9-123387, JP-A-9-131850, JP-A-9-171249 JP-A-9-171250, and EP931647 can be preferably exemplified. The specific examples of the polymers constituting these polymer fine particles include homopolymers or copolymers of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures thereof of these polymers, polystyrene and polymethyl methacrylate are more preferred.

The average particle size of the thermoplastic polymer fine particles for use in the invention is preferably from 0.01 to 2.0 μm. As the synthesizing methods of these thermoplastic polymer fine particles, a method of dissolving the above compounds in a nonaqueous organic solvent, mixing and emulsifying the solution with an aqueous solution containing a dispersant, and applying heat to the emulsion to thereby solidify the emulsion to a fine particle state with volatizing the organic solvent (a dissolution dispersion method) can be used, in addition to an emulsion polymerization method and a suspension polymerization method.

As the thermo-reactive polymer fine particles used in the invention, thermosetting polymer fine particles and polymer fine particles having a thermo-reactive group are exemplified.

As the thermosetting polymer fine particles, resins having a phenolic skeleton, urea resins (e.g., resins obtained by the resinification of urea or urea derivatives, e.g., methoxymethylated urea, with aldehydes, e.g., formaldehyde), melamine resins (e.g., resins obtained by the resinification of melamine or melamine derivatives with aldehydes, e.g., formaldehyde), alkyd resins, unsaturated polyester resins, polyurethane resins, and epoxy resins can be exemplified. Of these resins, resins having a pheniolic skeleton, melamine resins, urea resins and epoxy resins are particularly preferred.

As preferred resins having a phenolic skeleton, e.g., phenolic resins obtained by resinifying phenol or cresol with aldehydes, e.g., formaldehyde, hydroxystyrene resins, and polymers and copolymers of methacrylamide or acrylamide or methacrylate or acrylate having a phenolic skeleton such as N-(p-hydroxyphenyl)methacrylamide and p-hydroxyphenyl methacrylate can be exemplified.

The average particle size of the thermosetting polymer fine particles for use in the invention is preferably from 0.01 to 2.0 μm. These thermosetting polymer fine particles can be easily obtained by a dissolution dispersion method, but fine particles may be made when the thermosetting polymer is synthesized. The invention is not limited to these methods.

As the thermo-reactive group of the polymer fine particles having a thermo-reactive group used in the invention, functional groups showing any reaction can be used so long as chemical bonds are formed. Ethylenic unsaturated groups showing a radical polymerization reaction (e.g., an acryloyl group, a methacryloyl group, a vinyl group, an allyl group, etc.), cationic polymerizable groups (e.g., a vinyl group, a vinyloxy group, etc.), isocyanate groups showing an addition reaction or blocks thereof, epoxy groups, vinyloxy groups and functional groups having active hydrogen atoms of the other side compounds of the reaction (e.g., an amino group, a hydroxyl group, a carboxyl group, etc.), carboxyl groups showing a condensation reaction and hydroxyl groups and amino groups of the other side compounds of the reaction, and acid anhydrides showing a ring opening addition reaction and amino groups and hydroxyl groups of the other side compounds of the reaction can be preferably exemplified.

These functional groups may be introduced into polymer fine particles in the time of polymerization or they may be added after polymerization by a polymer reaction.

When functional groups are introduced in the time of polymerization, it is preferred that the monomers having these functional groups are emulsion polymerized or suspension polymerized. The specific examples of the monomers having the functional groups include allyl methacrylate, allyl acrylate, vinyl methacrylate, vinyl acrylate, 2-(vinyloxy)ethyl methacrylate, p-vinyloxystyrene, p-[2-(vinyloxy)ethyl]-styrene, glycidyl methacrylate, glycidyl acrylate, 2-isocyanate ethyl methacrylate or block isocyanate thereof by alcohol, 2-isocyanate ethyl acrylate or block isocyanate thereof by alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate, but the invention is not limited to these compounds.

In the invention, copolymers of these monomers and monomers copolymerizable with these monomers not having thermo-reactive groups can also be used. As the examples of copolymerizable monomers not having thermo-reactive groups, styrene, alkyl acrylate, alkyl methacrylate, acrylonitrile and vinyl acetate can be exemplified, for instance, but monomers are not limited to these monomers so long as they are monomers not having thermo-reactive groups.

As the polymer reaction used in the case where the thermo-reactive groups are introduced after polymerization, the polymer reactions disclosed in WO 96/34316 can be exemplified.

Of the above polymer fine particles having thermo- reactive groups, polymers that are coalesced with each other by heat are preferred, and those having hydrophilic surfaces and dispersible in water are particularly preferred. It is preferred that the contact angle of a film (a water droplet in air) prepared by coating only polymer fine particles and drying by a temperature lower than the solidification temperature is lower than the contact angle of a film (a water droplet in air) prepared by drying by a temperature higher than the solidification temperature. For making the surfaces of polymer fine particles hydrophilic, it is effective to let a hydrophilic polymer or oligomer, e.g., polyvinyl alcohol or polyethylene glycol, or a low molecular weight compound be adsorbed onto the surfaces of the polymer fine particles. However, the methods of surface hydrophilization treatment are not restricted thereto.

The solidification temperature of these polymer fine particles having thermo-reactive groups is preferably 70° C. or higher, but considering the aging stability, 100° C. or higher is more preferred. The average particle size of the polymer fine particles is preferably from 0.01 to 2.0 μm, more preferably from 0.05 to 2.0 μm, and particularly preferably from 0.1 to 1.0 μm. Good resolution and aging stability can be obtained in this range of average particle size.

As the thermo-reactive groups in the microcapsules encapsulating a compound having a thermo-reactive group for use in the invention, the same thermo-reactive groups as used in the polymer fine particles having thermo-reactive groups are preferably exemplified.

As the compounds having thermo-reactive groups encapsulated in microcapsules, the same compounds as the above polymerizable compounds are preferably used.

In addition to the polymerizable compounds, compounds having an epoxy group are also preferably exemplified. As the compounds having an epoxy group, compounds having 2 or more epoxy groups are preferred, and glycidyl ether compounds obtained by the reaction of polyhydric alcohol or polyhydric phenol with epichlorohydrin and prepolymers thereof, polymers and copolymers of glycidyl acrylate or glycidyl methacrylate can be exemplified.

The specific examples thereof include propylene glycol diglycidyl ether, tripropylene glycol diglycidyl ether, polypropylene glycol diglycidyl ether, neopentyl glycol diglycidyl ether, trimethylolpropane triglycidyl ether, diglycidyl ether of hydrogenated bisphenol A, hydroquinone diglycidyl ether, resorcinol diglycidyl ether, diglycidyl ether of bisphenol A or epichlorohydrin polyaddition products, diglycidyl ether of bisphenol F or epichlorohydrin polyaddition products, diglycidyl ether of halogenated bisphenol A or epichlorohydrin polyaddition products, diglycidyl ether of biphenyl-type bisphenol A or epichloro- hydrin polyaddition products, glycidyl etherified products of novolak resins, copolymers of methyl methacrylate/glycidyl methacrylate, and copolymers of ethyl methacrylate/glycidyl methacrylate.

Commercially available products of these compounds include, e.g., Epicote 1001 (molecular weight: about 900, epoxy equivalence: 450-500, manufactured by Japan Epoxy Resin Co., Ltd.), Epicote 1002 (molecular weight: about 1,600, epoxy equivalence: 600-700), Epicote 1004 (molecular weight: about 1,060, epoxy equivalence: 875-975), Epicote 1007 (molecular weight: about 2,900, epoxy equivalence: 2,000), Epicote 1009 (molecular weight: about 3,750, epoxy equivalence: 3,000), Epicote 1010 (molecular weight: about 5,500, epoxy equivalence: 4,000), Epicote 1100L (epoxy equivalence: 4,000), Epicote YX31575 (epoxy equivalence: 1,200), Sumiepoxy ESCN-195XHN, ESCN-195XL and ESCN-195XF (manufactured by Sumitomo Chemical Co., Ltd.), etc.

As the isocyanate compounds preferably used in the invention, tolylene diisocyanate, diphenyl)methane diisocyanate, polymethylene polyphenyl polyisocyanate, xylylene diisocyanate, naphthalene diisocyanate, cyclohexane phenylene diisocyanate, isopliorone diisocyanate, hexamethylene diisocyanate, cyclohexyl diisocyanate, and blocked products of these compounds with alcohol or amine can be exemplified.

As preferred amine compounds, ethylenediamine, diethylenetriamine, triethylenetetramine, hexamethylene-diamine, propylenediamine and polyethyleneimine are exemplified.

As the compounds having a hydroxyl group preferably usable in the invention, compounds having methylol groups at terminals, polyhydric alcohols such as pentaerythritol, and bisphenol polyphenols are exemplified.

As the compounds having a carboxyl group preferably usable in the invention, aromatic polycarboxylic acids, e.g., pyromellitic acid, trimellitic acid, and phthalic acid, and aliphatic polycarboxylic acids, e.g., adipic acid are exemplified.

As the preferred acid anhydrides preferably used in the invention, pyromellitic anhydride and beizophenone-tetracarboxylic anhydride are exemplified.

The compounds having a thermo-reactive group can be encapsulated in a microcapsule by the well-known methods described above in the polymerization system image-recording layer.

<Other Image Recording Layer Components>

For the purpose of improving an on-press developing property and the layer strength of an image-recording layer itself, an image-recording layer in the invention may contain a hydrophilic resin. As the hydrophilic resins, resins having a hydrophilic group, e.g., a hydroxyl group, an amino group, a carboxyl group, a phosphoric acid group, a sulfonic acid group, and an amido group are preferred. Further, since hydrophilic resins are crosslinked by the reaction with the thermo-reactive group of a hydrophobitizing precursor to thereby increase image strength and resistance to press, it is preferred that the hydrophilic resins have a group reactive with thermo-reactive groups. For example, when hydrophobitizing precursors have a vinyloxy group or an epoxy group, hydrophilic resins having a hydroxyl group, a carboxyl group, a phosphoric acid group or a sulfonic acid group are preferred. Hydrophilic resins having a hydroxyl group or a carboxyl group are particularly preferred.

The specific examples of hydrophilic resins are the same as the polymers described above as the hydrophilic binder polymers in the binder polymers. The addition amount of the hydrophilic resins to an image recording layer is preferably 20 mass % or less, more preferably 10 mass % or less.

The hydrophilic resins may be crosslinked in advance in such a degree that an unexposed area can be subjected to on-press development. The examples of the crosslinking agents include aldehydes, e.g., glyoxal, melamine-formaldehyde resin, and urea-formaldehyde resin, methylol compounds, e.g., N-methylolurea, N-methylolmelamine, and methylolated polyamide resin, active vinyl compounds, e.g., divinylsulfone and bis(β-hydroxyethylsulfonic acid), epoxy compounds, e.g., epichlorohydrin, polyethylene glycol diglycidyl ether, polyamide, polyamine, epichlorohydrin addition product, and polyamide-epichlorohydrin resin, ester compounds, e.g., monochloroacetic ester and thioglycolic ester, polycarboxylic acids, e.g., polyacrylic acid and methyl vinyl ether/maleic acid copolymer, inorganic crosslinking agents, e.g., boric acid, titanyl sulfate, Cu, Al, Sn, V, Cr salts, and modified polyamide-polyimide resins. In addition, crosslinking catalysts such as ammonium chloride, silane coupling agents, and titanate coupling agents can be used in combination.

An image-recording layer in the invention can contain reaction accelerators for initiating or accelerating the reaction of the thermo-reactive groups. As such reaction accelerators, the polymerization initiators described above can be exemplified as preferred accelerators.

The reaction accelerators can be used in combination of two or more. The reaction accelerators may be directly added to an image-recording layer coating solution, or may be added to the polymer fine particles. The content of the reaction accelerators in an image-recording layer is preferably from 0.01 to 20 mass % of the total solids content of the image-recording layer, more preferably from 0.1 to 10 mass %. In this range of reaction accelerator content, on-press developing properties are not impaired and good reaction initiation and accelerating effect can be ensured.

In the image-recording layer utilizing hydrophobitizing precursor series, polyfunctional monomers can be added to the matrix of the image-recording layer for further increasing the press life. As the polyfunctional monomers, the polymerizable compounds exemplified above can be used. Trimethylolpropane triacrylate and pentaerythritol triacrylate are preferred above all.

Further, the hydrophobitizing precursor series image-recording layer can contain additives such as the surfactants, colorants, polymerization inhibitors, higher fatty acid derivatives, plasticizers, inorganic fine particles and low molecular weight hydrophilic compounds described in the item of <Other image-recording layer components> in the polymerization series image-recording layer, according to necessity.

<Formation of Hydrophobitizing Precursor System Image Recording Layer>

Similarly to the case of the radical polymerization series image-recording layer, the hydrophobitizing precursor series image-recording layer in the invention is formed by preparing a coating solution by dispersing or dissolving the above necessary components in a solvent, and coating the coating solution on a support and drying.

The coating weight (solids content) of the image recording layer on a support obtained after coating and drying is generally preferably from 0.5 to 5.0 g/m$^2$, although it differs according to uses.

A lithographic printing plate precursor capable of on-press development can be easily manufactured by using the hydrophobitizing precursor series image-recording layer.

On the other hand, by giving sufficient press life to the hydrophobitizing precursor system image-recording layer (a hydrophilic layer having a crosslinking structure) even when the image-recording layer is unexposed, the lithographic printing plate precursor in the invention can be applied to a non-processing (non-development) type lithographic printing plate precursor.

It is preferred for a hydrophilic layer having such a crosslinking structure to contain at least one kind of a hydrophilic resin having a crosslinking structure and an inorganic hydrophilic binder resin formed by sol/gel conversion. Of these resins, the hydrophilic resin is described first. By the addition of the hydrophilic resin, the affinity of the hydrophilic components in emulsion ink is increased and, at the same time, the film strength of the image-recording layer itself is also improved. As the hydrophilic resins, those having a hydrophilic group, e.g., hydroxyl, carboxyl, hydroxyethyl, hydroxypropyl, amino, aminoethyl, aminopropyl and carboxymethyl, are preferred.

The specific examples of hydrophilic resins are the same as the polymers described above as the hydrophilic binder polymers in the binder polymers. By using these binder polymers by crosslinking, a hydrophilic layer having a crosslinking structure can be obtained. As crosslinking agents for forming a crosslinking structure, the compounds exemplified above as the crosslinking agents are used.

As preferred non-processing (non-development) type image-recording layer, an image-recording layer containing an inorganic hydrophilic binder resin formed by sol/gel conversion can also be exemplified. Preferred sol/gel convertible binder resins are polymers wherein the bonding groups of polyvalent elements form a network structure, i.e., a three-dimensional crosslinking structure, via oxygen atoms and, at the same time, polyvalent metals also have hydroxyl groups and alkoxyl groups not bonded and they are mixed and form resinous structure. The systems are in a sol state at a stage abundant in alkoxyl groups and hydroxyl groups, and the network resinous structure comes to heighten with the advancement of dehydration condensation. The polyvalent bonding elements of the compounds having sol/gel convertible hydroxyl groups and alkoxyl groups are aluminum, silicon, titanium and zirconium, and all of which can be used in the invention. More preferred sol/gel convertible systems are those using silicon, and particularly preferred system is a sol/gel convertible system containing a silane compound having at least one silanol group. A sol/gel convertible system using silicon is described below. Sol/gel conversions using aluminum, titanium and zirconium can also be carried out by the substitution of the silicon in the following description with respective elements.

Sol/gel convertible binder resins are preferably resins having a siloxane bond and a silanol group, and a coating solution of sol system containing a compound having at least one silanol group is used in an image-recording layer in the invention. Condensation and gelation of the silanol group progress during coating and drying processes, and the structure of a siloxane skeleton is formed.

An image-recording layer containing a sol/gel convertible binder resin and the above hydrophilic resins and crosslinking agents can be used in combination for the purpose of the improvement of physical properties, e.g., layer strength and the flexibility of the layer, and the betterment of coating property.

A siloxane resin for forming a gel structure is represented by the following formula (VII), and a silane compound having at least one silanol group is represented by the following formula (VIII). A material added to an image recording layer need not be a silane compound represented by formula (VIII) alone and, in general, the material may comprise an oligomer of a silane compound partially condensed, or may be mixture of a silane compound represented by formula (VIII) and the oligomer.

(VII)

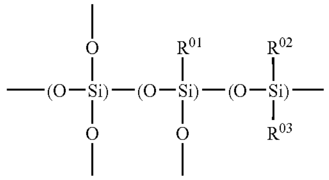

A siloxane resin represented by formula (VII) is formed by sol/gel conversion from the dispersion containing at least one silane compound represented by formula (VIII). In formula (VII), at least one of $R^{01}$, $R^{02}$ and $R^{03}$ represents a hydroxyl group, and the remaining represent an organic residue selected from $R^0$ and Y in formula (VIII).

$$(R^0)_nSi(Y)_{4-n} \quad \text{(VIII)}$$

wherein $R^0$ represents a hydroxyl group, a hydrocarbon group or a heterocyclic group; Y represents a hydrogen atom, a halogen atom, —$OR^1$, —$OCOR^2$ or —$N(R^3)(R^4)$; $R^1$ and $R^2$ each represents a hydrocarbon group; $R^3$ and $R^4$, which may be the same or different, each represents a hydrocarbon group or a hydrogen atom; and n represents 0, 1, 2 or 3.

$R^0$ represents, as the hydrocarbon group or the heterocyclic group, e.g., a straight chain or branched alkyl group having from 1 to 12 carbon atoms which may be substituted (e.g., a methyl group, an ethyl group, a propyl group, a butyl group, a pentyl group, a hexyl group, a heptyl group, an octyl group, a nonyl group, a decyl group, a dodecyl group, etc.; as the substituents of these groups, a halogen atom (a chlorine atom, a fluorine atom, a bromine atom), a hydroxyl group, a thiol group, a carboxyl group, a sulfo group, a cyano group, an epoxy group, an —OR' group (R' represents a methyl group, an ethyl group, a propyl group, a butyl group, a heptyl group, a hexyl group, an octyl group, a decyl group, a propenyl group, a butenyl group, a hexenyl group, an octenyl group, a 2-hydroxyethyl group, a 3-chloropropyl group, a 2-cyanoethyl group, an N,N-dimethylaminoethyl group, a 2-bromoethyl group, a 2-(2-methoxyethyl)oxyethyl group, a 2-methoxycarbonylethyl group, a 3-carboxyethyl group, a 3-carboxypropyl group, a benzyl group), an —OCOR" group (R" has the same meaning as R' above), a —COOR" group, a —COR" group, an —N(R''') (R''') group (R''' represents a hydrogen atom or the same meaning as R', and two R''' may be the same or different), an —NHCONHR" group, an —NHCOOR" group, an —Si(R")$_3$ group, and a —CONHR" group can be exemplified, and a plurality of substituents may be substituted on the alkyl group), a straight chain or branched alkenyl group having from 2 to 12 carbon atoms which may be substituted (e.g., a vinyl group, a propenyl group, a butenyl group, a pentenyl group, a hexenyl group, an octenyl group, a decenyl group, a dodecenyl group, etc.; as the substituents of these groups, the same groups described above as the substituents of the alkyl group can be exemplified), an aralkyl group having from 7 to 14 carbon atoms which may be substituted (e.g., a benzyl group, a phenethyl group, a 3-phenylpropyl group, a naphthylmethyl group, a 2-naphthylethyl group; as the substituents of these groups, the same groups described above as the substituents of the alkyl group can be exemplified, and a plurality of substituents may be substituted on the aralkyl group), an alicyclic group having from 5 to 10 carbon atoms which may be substituted (e.g., a cyclopentyl group, a cyclohexyl group, a 2-cyclohexylethyl group, a norbornyl group, an adamantyl group, etc.; as the substituents of these groups, the same groups described above as the substituents of the alkyl group can be exemplified, and a plurality of substituents may be substituted), an aryl group having from 6 to 12 carbon atoms which may be substituted (e.g., a phenyl group, a naphthyl group, as the substituents of these groups, the same groups described above as the substituents of the alkyl group can be exemplified, and a plurality of substituents may be substituted), or a heterocyclic group containing at least one atom selected from a nitrogen atom, an oxygen atom and a sulfur atom which may be condensed (e.g., a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring, a tetrahydrofuran ring, etc.; each of which may have a substituent, as the substituents of these groups, the same groups described above as the substituents of the alkyl group can be exemplified, and a plurality of substituents may be substituted).

The substituents of the —OR$^1$ group, —OCOR$^2$ group or —N(R$^3$)(R$^4$) group represented by Y in formula (VIII) are as follows. In the —OR$^1$ group, R$^1$ represents an aliphatic group having from 1 to 10 carbon atoms which may be substituted (e.g., a methyl group, an ethyl group, a propyl group, a butyl group, a heptyl group, a hexyl group, a pentyl group, an octyl group, a nonyl group, a decyl group, a propenyl group, a butenyl group, a heptenyl group, a hexenyl group, an octenyl group, a decenyl group, a 2-hydroxyethyl group, a 2-hydroxypropyl group, a 2-methoxyethyl group, a 2-(2-methoxyethyl)oxyethyl group, a 2-(N,N-dimethylamino)ethyl group, a 2-methoxypropyl group, a 2-cyanoethyl group, a 3-methyloxypropyl group, a 2-chloro-ethyl group, a cyclohexyl group, a cyclopentyl group, a cyclooctyl group, a chlorocyclohexyl group, a methoxycyclo-hexyl group, a benzyl group, a phenethyl group, a dimethoxy-benzyl group, a methylbenzyl group, a bromobenzyl group, etc.).

In the —OCOR$^2$ group, R$^2$ represents an aliphatic group of the same meaning as R1 has, or an aromatic group having from 6 to 12 carbon atoms which may be substituted (as the aromatic group, those described above in the aryl group represented by R can be exemplified). In the —N(R$^3$)(R$^4$) group, R$^3$ and R$^4$, which may be the same or different, each represents a hydrogen atom or an aliphatic group having from 1 to 10 carbon atoms which may be substituted (e.g., the same groups described in R$^1$ of the —OR$^1$group can be exemplified). More preferably, the total number of the carbon atoms of R$^3$ and R$^4$ is not more than 16. As the specific examples of the silane compound represented by formula (VIII), the following compounds can be exemplified, but the present invention is not limited to these compounds.

Tetrachlorosilane, tetramethoxysilane, tetraethoxysilane, tetraisopropoxysilane, tetra-n-propylsilane, methyltrichlorosilane, methyltrimethoxysilane, methyltriethoxysilane, ethyltrichlorosilane, ethyltrimethoxysilane, ethyltriethoxysilane, n-propyltrichlorosilane, n-propyltrimethoxysilane, n-hexyltrimethoxysilane, n-decyltrimethoxysilane, phenyltrichlorosilane, phenyltrimethoxysilane, dimethoxyditriethoxysilane, dimethyldichlorosilane, dimethyldimethoxysilane, diphenyldimethoxysilane, phenylmethyldimethoxysilane, triethoxyhydrosilane, trimethoxyhydrosilane, vinyltrichlorosilane, vinyltrimethoxysilane, trifluoropropyltrimethoxysilane, γ-glycidoxypropylmethyldimethoxysilane-γ-glycidoxypropylmethyldiethoxysilane, γ-glycidoxypropyltriethoxysilanie, γ-methacryloxypropyltrimetloxysilane, γ-aminopropyl)methyldimethoxysilane, γ-aminopropyltriethoxysilane, γ-mercaptopropylmetlhyldimethoxysilane, γ-mercaptopropyltrimethoxysilane, γ-mercaptopropyltriethoxysilanie, and β-(3,4-epoxycyclohexyl)ethyltrimethoxysilane.

Together with a silane compound represented by formula (VIII), metallic compounds capable of conjoining with resins to form a film at the time of sol/gel conversion, e.g., Ti, Zn, Sn, Zr, Al, etc., can be used in the image-recording layer in combination. The examples of the metallic compounds for use for this purpose include, e.g., $Ti(OR")_4$, $TiCl_4$, $Zn(OR")_2$, $Zn(CH_3COCHCOCH_3)_2$, $Sn(OR")_4$, $Sn(CH_3COCHCOCH_3)_4$, $Sn(OCOR")_4$, $SnCl_4$, $Zr(OR")_4$, $Zr(CH_3COCHCOCH_3)_4$, $(NH_4)_2ZrO(CO_3)_2$, $Al(OR")_3$, $Al(CH_3COCHCOCH_3)$, etc. (wherein R" represents a methyl group, an ethyl group, a propyl group, a butyl group, a pentyl group, a hexyl group).

For accelerating hydrolysis and polycondensation reaction of the silane compound represented by formula (VIII) and the above metallic compound to be used in combination, it is preferred to use an acidic catalyst or a basic catalyst together. As the catalyst, an acidic or basic compound may be used as it is, or may be dissolved in water or a solvent such as alcohol (hereinafter referred to as the acidic catalyst or the basic catalyst). The concentration of the catalyst is not particularly restricted but when the concentration is high, hydrolysis and polycondensation reaction are liable to become fast. However, when the basic catalyst in high concentration is used, a precipitate is formed in some cases, so that the concentration of the basic catalyst is preferably 1N (in terms of the concentration in an aqueous solution) or less.

The specific examples of the acidic catalysts include hydroghalogenic acid such as hydrochloric acid, carboxylic acids such as nitric acid, sulfuric acid, sulfurous acid, hydrogen sulfide, perchloric acid, hydrogen peroxide, carbonic acid, formic acid and acetic acid, and and sulfonic acid such as benzenesulfonic acid. The specific examples of the basic catalysts include ammoniacal bases such as aqueous ammonia, and amines such as ethylamine and aniline, but the catalysts are not limited to these compounds.

As described above, an image-recording layer produced by the sol/gel method is particularly preferred as the constitution of the image-recording layer according to the present invention. The details of the sol/gel method are described in Sumio Sakka, *Sol/Gel Ho no Kagaku* (*Chemistry of Sol/Gel Method*), Agune Shofu-Sha (1988) and Hiroshi Hirashima, *Saishin Sol/Gel Ho ni yoru Kino-Sei Hakumaku Sakusei Gijutsu* (*Producing Techniques of Functional Thin Films by the Latest Sol/Gel Methods*), Sogo Gijutsu Center (1992).

The addition amount of the hydrophilic resins to an image recording layer having a crosslinking structure is preferably from 5 to 70 mass % of the solids content of the image-recording layer, more preferably from 5 to 50 mass %.

Support:

Supports for use in the lithographic printing plate precursor in the invention are not particularly limited and any materials can be used so long as they are dimensionally stable and plate-like materials. As the support for an on-press development type lithographic printing plate precursor, supports having a hydrophilic surface are preferred. For example, paper, paper laminated with plastics (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene tereplithalate, polyethylene, polystyrene, polypropylene, polycarbonate, polyvinyl acetal, etc.), and paper and plastic films laminated or deposited with the above metals can be exemplified as the materials of the support. Preferred supports are a polyester film and an aluminum plate. Above all, aluminum sheets, which are dimensionally stable and comparatively inexpensive, are preferred.

Aluminum plates are a pure aluminum plate, alloy plates containing aluminum as a main component and a trace amount of different elements, and aluminum or aluminum alloy thin films laminated with plastics. The examples of different elements contained in aluminum alloys include silicon, iron, manganese, copper, magnesium, chromium, zinc, bismuth, nickel, titanium, etc. The different element content in aluminum alloys is preferably 10 mass % or less. In the invention, a pure aluminum plate is preferred but 100% pure aluminum is difficult to produce from the refining technique, accordingly, an extremely small amount of different elements may be contained. Thus, the compositions of aluminum plates used in the invention are not specified, and aluminum plates of conventionally well known and commonly used materials can be optionally used.

A support for use in the invention has a thickness of preferably from 0.1 to 0.6 mm, more preferably from 0.15 to 0.4 mm, and still more preferably from 0.2 to 0.3 mm.

Prior to the use of an aluminum plate, it is preferred for the aluminum plate to be subjected to surface treatment, e.g., surface roughening treatment and anodizing treatment. By surface treatment, the improvement of hydrophilicity and the security of the adhesion of an image-recording layer and a support become easy. Prior to the surface roughening treatment of an aluminum plate, if necessary, degreasing treatment with a surfactant, an organic solvent or an alkaline aqueous solution is carried out to remove the rolling oil on the surface of an aluminum plate.

Surface roughening treatment of the surface of an aluminum plate is performed by various methods, e.g., mechanical surface roughening treatment, electrochemical surface roughening treatment (surface roughening treatment of electrochemically dissolving the surface), and chemical surface roughening treatment (surface roughening treatment of chemically selectively dissolving the surface) are exemplified.

As the method of mechanical surface roughening treatment, well-known methods, e.g., a ball rubbing method, a brush abrading method, a blast abrading method, or a buffing method, can be used.

As the method of electrochemical surface roughening treatment, a method of roughening in an electrolyte containing an acid such as a hydrochloric acid or a nitric acid by alternating current or direct current can be used. Further, a method of using mixed acids can be used as disclosed in JP-A-54-63902.

The aluminum sheet subjected to surface roughening treatment is, if necessary, subjected to alkali etching treatment with an aqueous solution of potassium hydroxide or sodium hydroxide and neutralizing treatment and then to anodizing treatment to increase the abrasion resistance of the surface.

Various electrolytes for forming porous oxide film can be used in the anodizing treatment of an aluminum sheet, and sulfuric acid, hydrochloric acid, oxalic acid, chromic acid and mixed acids of these acids are generally used. The concentrations of these electrolytes are arbitrarily determined according to the kinds of electrolytes.

Anodizing treatment conditions vary according to electrolytes used and cannot be specified unconditionally, but in general the appropriate concentration of electrolyte is from 1 to 80 mass % solution, the liquid temperature is from 5 to 70° C., the electric current density is from 5 to 60 $A/dm^2$, the voltage is from 1 to 100 V, electrolytic time is from 10 seconds to 5 minutes. The amount of the anodic oxide film formed is preferably from 1.0 to 5.0 $g/m^2$, more preferably from 1.5 to 4.0 $g/m^2$. With this range of the amount of the anodic oxide film, good press life and the flaw resistance of the non-image area of a lithographic printing plate can be obtained.

As the supports for use in the invention, supports subjected to surface treatments as above and having an anodic oxide film may be used as they are, but for further improving the adhesion with the upper layer, a hydrophilic property, soiling resistance and a heat insulating property, enlarging treatment of the micro-pores of the anodic oxide film, sealing treatment of the micro-pores, and hydrophilization treatment of the surface by immersion in an aqueous solution containing a hydrophilic compound as disclosed in JP-A-2001-253 181 and JP-A-2001-322365 can be arbitrarily performed, if necessary. These enlarging treatment and sealing treatment are not limited thereto, and any of conventionally known methods can be used.

The sealing treatment for use in the invention is not limited and any of conventionally known methods can be used. Sealing treatment using an aqueous solution containing an inorganic fluorine compound, sealing treatment with aqueous vapor, and sealing treatment with hot water are particularly preferred. These treatments are described below.

As the inorganic fluorine compounds for use in the sealing treatment using an aqueous solution containing an inorganic fluorine compound, metal fluorides are preferably exemplified.

As the specific examples of the metal fluorides, e.g., sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid, and ammonium fluorophosphate are exemplified, and sodium fluorozirconate, sodium fluorotitanate, fluorozirconic acid and fluorotitanic acid are particularly preferred.

The concentration of an inorganic fluorine compound in an aqueous solution is preferably 0.01 mass % or more for sufficiently performing sealing of micro-pores of an anodic oxide film, more preferably 0.05 mass % or more. Further, from the point of soiling resistance, the concentration is preferably 1 mass % or less, more preferably 0.5 mass % or less.

It is preferred that an aqueous solution containing an inorganic fluorine compound further contains a phosphate compound. The hydrophilicity of the surface of an anodic oxide film is improved by the addition of a phosphate compound, so that on-press developing property and soiling resistance can be increased.

As the phosphate compounds, the phosphate of metals of, e.g., alkali metals and alkaline earth metals are preferably exemplified.

Specifically, zinc phosphate, aluminum phosphate, ammonium phosphate, diammonium hydrogenphosphate, ammonium dihydrogenphosphate, monoammonium phosphate, monopotassium phosphate, monosodium phosphate, potassium dihydrogen-phosphate, dipotassium hydrogenphosphate, calcium phosphate, sodium ammonium hydrogenphosphate, magnesium hydrogen-phosphate, magnesium phosphate, ferrous phosphate, ferric phosphate, sodium dihydrogenphosphate, sodium phosphate, disodium hydrogenphosphate, lead phosphate, diammonium phosphate, calcium dihydrogenphosphate, lithium phosphate, phosphorus tungstic acid, ammonium phosphorus twigstate, sodium phosphorus tungstate, ammonium phosphorus molybdate, sodium phosphorus molybdate, sodium phosphite, sodium tripolyphosphate and sodium pyrophosphate are exemplified. Of these compounds, sodium dihydrogenphosphate, disodium hydrogenphosphate, potassium dihydrogenphosphate and dipotassium hydrogenphosphate are preferred.

The combination of an inorganic fluorine compound and a phosphate compound is not particularly restricted, but it is preferred for the aqueous solution to contain at least sodium fluorozirconate as the inorganic fluorine compound and at least sodium dihydrogenphosphate as the phosphate compound.

The concentration of a phosphate compound in the aqueous solution is preferably 0.01 mass % or more from the point of improving on-press developing property and soiling resistance, more preferably 0.1 mass % or more, and from the point of solubility the concentration is preferably 20 mass % or less, more preferably 5 mass % or less.

The ratio of each compound in the aqueous solution is not particularly restricted but the ratio of an inorganic fluorine compound and a phosphate compound is preferably from 1/200 to 10/1, more preferably from 1/30 to 2/1. The temperature of the aqueous solution is preferably 20° C. or more, more preferably 40° C. or more, and preferably 100° C. or less, more preferably 80° C. or less. The pH of the aqueous solution is preferably 1 or more, more preferably 2 or more, and preferably 11 or less, more preferably 5 or less.

The method of sealing treatment using the aqueous solution containing an inorganic fluorine compound is not particularly restricted and, e.g., an immersing method and a spraying method are exemplified. These methods may be carried out one time or a plurality of times alone, or two or more methods may be combined.

An immersing method is particularly preferred. When sealing treatment is performed with an immersing method, treatment time is preferably 1 second or longer, more preferably 3 seconds or longer, and preferably 100 seconds or shorter, more preferably 20 seconds or shorter.

As the sealing treatment with aqueous vapor, e.g., a method of applying aqueous vapor to an anodic oxide film continuously or intermittently under pressure or normal pressure is exemplified.

The temperature of aqueous vapor is preferably 80° C. or more, preferably 95° C. or higher, and preferably 105° C. or lower.

The pressure of aqueous vapor is preferably in the range of from (atmospheric pressure −50 mmAg) to (atmospheric pressure +300 mmAg) ($1.008\times10^5$ to $1.043\times10^5$ Pa).

Further, the application time of aqueous vapor is preferably I second or longer, more preferably 3 seconds or longer, and preferably 100 seconds or shorter, more preferably 20 seconds or shorter.

As the sealing treatment with hot water, e.g., a method of immersing an aluminum plate on which an anodic oxide film is formed in hot water is exemplified.

The hot water may contain an inorganic salt (e.g., a phosphate) or an organic salt.

The temperature of hot water is preferably 80° C. or more, preferably 95° C. or higher, and preferably 100° C. or lower.

The time of immersion in hot water is preferably 1 second or longer, more preferably 3 seconds or longer, and preferably 100 seconds or shorter, more preferably 20 seconds or shorter.

As the hydrophilization treatment, alkali metal silicate methods as disclosed in U.S. Pat. Nos. 2,714,066, 3,181,461, 3,280,734 and 3,902,734 are known. These are methods of immersing a support in an aqueous solution of sodium silicate, or electrolytically treating. Besides these methods, a method of treating a support with a potassium fluorozirconate as disclosed in JP-B-36-22063, and a method of treating a support with a polyvinyl phosphonic acid as disclosed in U.S. Pat. Nos. 3,276,868, 4,153,461 and 4,689,272 are exemplified.

When a support that is insufficient in hydrophilic property, e.g., a polyester film, is used, it is preferred to coat a hydrophilic layer to make the surface hydrophilic. As the hydrophilic layers, a hydrophilic layer formed by coating a coating solution containing the colloid of the oxide or hydroxide of at least one element selected from among beryllium, magnesium, aluminum, silicon, titanium, boron, germanium, tin, zirconium, iron, vanadium, antimony and transition metals as disclosed in JP-A-2001-199175, a hydrophilic layer having an organic hydrophilic matrix obtained by crosslinking or pseudo-crosslinking an organic hydrophilic polymer disclosed in JP-A-2002-79772, a hydrophilic layer having an inorganic hydrophilic matrix obtained by sol/gel conversion comprising hydrolysis or condensation reaction of polyalkoxysilane, titanate, zirconate or aluminate, and a hydrophilic layer comprising an inorganic thin film having a surface containing metallic oxide are preferred. Of these layers, a hydrophilic layer formed by coating a coating solution containing the colloid of the oxide or hydroxide of silicon is preferred.

When a polyester film is used, it is preferred to provide an antistatic layer on the same side of a support on which a hydrophilic layer is provided, or opposite side, or both sides. When an antistatic layer is provided between a hydrophilic layer and a support, the adhesion of the support and the hydrophilic layer is improved. As the antistatic layer, the polymer layer having dispersed metallic oxide fine particles and a matting agent as disclosed in JP-A-2002-79772 can be used.

A support preferably has central line average surface roughness of from 0.10 to 1.2 μm. In this range of surface roughness, good adhesion of a support with an image-recording layer, good press life and good soiling resistance can be obtained.

As the color density of a support, from 0.15 to 0.65 in a reflection density value is preferred. In this range of color density, good image forming property due to prevention of halation in image exposure and good detecting property of the printing plate after development can be obtained.

Undercoat Layer:

In the lithographic printing plate precursor in the invention, if necessary, an undercoat layer can be provided between an image-recording layer and a support. Since the undercoat layer functions as a heat insulating layer, the heat generated by infrared laser exposure does not diffuse to the support and is efficiently utilized, so that the improvement of sensitivity can be contrived. Further, the image-recording layer comes to be easily peeled off the support at an unexposed area, so that on-press developability is improved.

As the undercoat layer, specifically the silane coupling agent having an addition polymerizable ethylenic double bond reactive group disclosed in JP-A-10-282679, and the phosphorus compounds having an ethylenic double bond reactive group disclosed in JP-A-2-304441 are preferred. As particularly preferred compounds, compounds having both a polymerizable group such as a methacrylic group or an allyl group and support-adsorptive group such as a sulfonic acid group, a phosphoric acid group or a phosphoric ester group are exemplified. Compounds having a hydrophilicity-imparting group, e.g., an ethylene oxide group, in addition to a polymerizable group and a support-adsorptive group can also be preferably used.

The coating amount of an undercoat layer (solids content) is preferably from 0.1 to 100 $mg/m^2$, more preferably from 1 to 30 $mg/m^2$.

Back Coat Layer:

After surface treatment of a support or after forming an undercoat layer, if necessary, a backcoat can be provided on the back surface of the support.

As the backcoat, e.g., coating layers comprising organic polymer compounds as disclosed in JP-A-5-45885, and coating layers comprising metallic oxides obtained by hydrolysis and polycondensation of organic or inorganic metallic compounds as disclosed in JP-A-6-35174 are preferably used. Alkoxy compounds of silicon, e.g., $Si(OCH_3)_4$, $Si(OC_2H_5)_4$, $Si(OC_3H_7)_4$, $Si(OC4H_9)_4$, are preferably used for the inexpensiveness and easy availability of the materials.

Protective Layer (Overcoat Layer):

For preventing the generation of flaws on an image recording layer, for shielding oxygen, and for preventing ablation at the time of exposure with high intensity laser, if necessary, a protective layer may be provided on an image recording layer of the lithographic printing plate precursor of the invention. In the invention, it is also preferred to add couplers, acid generators and hydrophilic fine particles to the protective layer as described above.

Exposure is generally performed in the air in the invention, and the protective layer prevents the mixture into the image recording layer of low molecular weight compounds such as oxygen and basic substance in the air that hinder the image forming reaction occurring in the image-recording layer by exposure, by which the hindrance of the image-forming reaction by exposure in the air can be prevented.

Accordingly, the characteristics required of the protective layer are to be low in permeability of low molecular weight compounds such as oxygen, good in transmission of light used for exposure, excellent in adhesion with an image-recording layer, and capable of being removed easily by on-press development after exposure. Protective layers having such characteristics have so far been variously examined and they are disclosed in detail, e.g., in U.S. Pat. No. 3,458,311 and JP-B-55-49729.

As the materials that are used for the protective layer, for example, water-soluble polymer compounds relatively excellent in crystallizability are exemplified. Specifically, water-soluble polymers, e.g., polyvinyl alcohol, polyvinyl pyrrolidone, acid celluloses, gelatin, gum arabic, and polyacrylic acid are exemplified.

Above all, when polyvinyl alcohol (PVA) is used as the main component, the best results can be given to the fundamental characteristics such as an oxygen-shielding property and the removal by development. Polyvinyl alcohols may be partially substituted with ester, ether or acetal, or may partially contain other copolymer component so long as they contain an unsubstituted vinyl alcohol unit for imparting an oxygen-shielding property and solubility in water that are necessary to the protective layer.

As the specific examples of polyvinyl alcohols, those having a hydrolyzed rate of from 71 to 100 mol % and the degree of polymerization of from 300 to 2,400 are preferably exemplified. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (manufactured by Kuraray Co., Ltd.) are exemplified.

The components of the protective layer (the selection of PVA, the use of additives, etc.), and the coating amounts are suitably selected by considering fogging characteristic, adhesion and scratch resistance besides the oxygen shielding property and the removal by development. In general, the higher the hydrolyzing rate of PVA (that is, the higher the unsubstituted vinyl alcohol unit content in the protective layer), and the higher the layer thickness, the higher is the oxygen-shielding property, thus advantageous in the point of sensitivity. For the prevention of the generation of unnecessary polymerization reaction during manufacture and preservation, or the generation of unnecessary fog and thickening of image lines in image exposure, it is preferred that an oxygen-permeating property is not too high. Therefore, oxygen permeability A at 25° C. under 1 atm is preferably, $0.2 \leqq A \leqq 20$ ($ml/m^2$ day).

As other components of the protective layer, glycerol, dipropylene glycol and the like can be added in an amount of several mass % to the water-soluble polymer compounds to provide flexibility, and further, anionic surfactants, e.g., sodium alkylsulfate and sodium alkylsulfonate; ampholytic surfactants, e.g., alkylaminocarboxylate and alkylaminodicarboxylate; and nonionic surfactants, e.g., polyoxyethylene alkyl phenyl ether, can be added to the (co)polymers each in an amount of several mass %.

The layer thickness of the protective layer is preferably from 0.1 to 5 μm, and particularly preferably from 0.2 to 2 μm.

The adhesion of the protective layer with an image part and scratch resistance are also very important in treating a lithographic printing plate precursor. That is, when a protective layer that is hydrophilic by containing a water-soluble polymer compound is laminated on a lipophilic image-recording layer, layer peeling of the protective layer due to insufficient adhesion is liable to occur, and sometimes a defect such as film hardening failure attributing to polymerization hindrance by oxygen is caused at the peeled part.

Various countermeasures have been proposed for improving the adhesion of an image-recording layer and a protective layer. For example, it is disclosed in JP-A-49-70702 and British Patent Application No. 1,303,578 that sufficient adhesion can be obtained by mixing from 20 to 60 mass % of an acryl-based emulsion or a water-insoluble vinyl pyrrolidone/vinyl acetate copolymer with a hydrophilic polymer mainly comprising polyvinyl alcohol and laminating the resulting product on an image-recording layer. Any of these well-known techniques can be used in the present invention. The coating methods of a protective layer are disclosed in detail, e.g., in U.S. Pat. No. 3,458,311 and JP-B-55-49729.

In the invention, the above printout image-forming components (compounds the color of which is discolored by the action of radicals, radical polymerization initiators, infrared absorbers) can be added to a protective layer. It is preferred to add these printout image-forming components to a protective layer not to an image-recording layer for the reason that the printout image-forming reaction system is separated from the polymerization reaction system in the image-recording layer, so that the hindrance of the reaction can be avoided each other. It is also preferred to add the printout image-forming components to a protective layer in the form of being encapsulated in microcapsules. To enhance a printout image, the printout image-forming components may be contained in both a protective layer and an image-recording layer.

Further, other functions can be imparted to a protective layer. For example, by the addition of colorants excellent in transmission of infrared rays that are used in exposure and capable of efficiently absorbing lights of other wavelengths (e.g., water-soluble dyes), safelight aptitude can be improved without causing sensitivity reduction.

The coating methods are disclosed in detail, e.g., in U.S. Pat. No. 3,458,311 and JP-B-55-47929.

<Lithographic Printing Method>

In the lithographic printing method using the lithographic printing plate precursor in the invention, the lithographic printing plate precursor of the invention is imagewise exposed by exposure through a transparent original having a line image and a dot image, or by laser scanning exposure by digital data. As exposure light sources, e.g., a carbon arc lamp, a high-pressure mercury lamp, a xenon lamp, a metal halide lamp, a fluorescent lamp, a tungsten lamp, a halogen lamp, an ultraviolet laser, a visible laser and an infrared laser are exemplified. Lasers are particularly preferred, and a semiconductor laser radiating rays of from 250 to 420 nm, and a solid state laser and a semiconductor laser radiating infrared rays of from 760 to 1,200 nm are exemplified. When a laser is used, it is preferred to perform imagewise scanning exposure according to digital data. For expediting exposure time, it is preferred to use a multi-beam laser device.

When a laser is used, the exposure time per a pixel is preferably not longer than 20 psec.

The wavelength of a laser is preferably a wavelength having range of infrared, specifically 740 to 1,300 nm. In case of using a infrared laser, the output of an infrared laser is preferably 100 mW or more, and the quantity of irradiation energy is preferably from 10 to 400 mJ/cm$^2$.

In the lithographic printing method in the invention, as described above, after the lithographic printing plate precursor of the invention is imagewise exposed, printing can be carried out by supplying oily ink and aqueous component with being subjected to development process or without being subjected to development process.

<Development Process>

As the developing solution used in the case where development process with a developing solution is performed, conventionally known alkali aqueous solution can be used. For example, inorganic alkali agents, e.g., sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide are exemplified. Further, organic alkali agents, e.g., monomethylamine, dimethylamine, trimethylamine, monoethyl-amine, diethylamine, triethylamine, monoisopropylamine, diisopropylamine, triusopropylamine, n-butylamine, monoethanolamine, diethanolamine, triethanolamine, monoisopropanolamine, diisopropanolamine, ethyleneimine, ethylenediamine and pyridine are also used.

These alkali agents are used alone or two or more in combination. Of the above alkali aqueous solutions, the developing solution capable of conspicuously exhibiting the effect of the invention is an aqueous solution containing alkali metal silicate having pH of 12 or more. An aqueous solution of alkali metal silicate is capable of controlling the developing property by the ratio of silicon oxide $SiO_2$ that is the component of silicate and alkali metal oxide $M_2O$ [in general, represented by the molar ratio of $(SiO_2)/(M_2O)$] and the concentration. For example, a sodium silicate aqueous solution having a molar ratio of $SiO_2Na_2O$ of from 1.0 to 1.5 [that is, $(SiO_2)/(M_2O)$ is from 1.0 to 1.5], and $SiO_2$ content of from 1 to 4 mass %, as disclosed in JP-A-54-62004, and an alkali metal silicate aqueous solution having a molar ratio of $(SiO_2)/(M)$ of from 0.5 to 0.75, [that is, $(SiO_2)/(M_2O)$ is from 1.0 to 1.5], $SiO_2$ concentration of from 1 to 4 mass %, and containing at least 20 mass % of potassium based on the gram atom of the total alkali metals contained in the developing solution, as disclosed in JP-B-57-7427, are preferably used. The pH of a developing solution is preferably from 9 to 13.5, more preferably from 10 to 13. The temperature of a developing solution is preferably from 15 to 40° C., more preferably from 20 to 35° C. The developing time is preferably from 5 to 60 seconds, more preferably from 7 to 40 seconds.

When the photosensitive lithographic printing plate is processed with an automatic processor, it is known that by adding an aqueous solution (replenisher) having higher alkali strength than that of the developing solution to the developing solution, a great amount of photosensitive lithographic printing plates can be processed without exchanging the developing solution in the tank for a long time. This replenishing system is preferably applied to the invention. For example, a method of using a sodium silicate aqueous solution having a molar ratio of $SiO_2/Na_2O$ of from 1.0 to 1.5 [that is, $(SiO_2)/(Na_2O)$ is from 1.0 to 1.5], and $SiO_2$ content of from 1 to 4 mass %, and adding continuously or intermittently a sodium silicate aqueous solution (a replenisher) having a molar ratio of $SiO_2/Na_2O$ of from 0.5 to 1.5 [that is, $(SiO_2)/(Na_2O)$ is from 0.5 to 1.5] to the developing solution in proportion to the processing amount, as disclosed in JP-A-54-62004, and a developing method of using an alkali metal silicate developing solution having a molar ratio of $(SiO_2)/(M)$ of from 0.5 to 0.75 [that is, $(SiO_2)/(M_2O)$ is from 1.0 to 1.5], and $SiO_2$ concentration of from 1 to 4 mass %, and an alkali metal silicate replenisher having a molar ratio of $(SiO_2)/(M)$ of from 0.25 to 0.75 [that is, $(SiO_2)/(M_2O)$ is from 0.5 to 1.5], and both of the developing solution and the replenisher contain at least 20 mass % of potassium based on the gram atom of the total alkali metals contained in the developing solution and the replenisher, as disclosed in JP-B-57-7427, are preferably used.

As disclosed in JP-A-54-8002 JP-A-55-115045 and JP-A-59-58431, the thus-development processed photosensitive lithographic printing plate is subjected to post-treatment with washing water, rinsing solution containing a surfactant, and a desensitizing solution containing gum arabic and starch derivatives. These post treatments can be used in various combinations in the post treatment of the photosensitive lithographic printing plate in the invention. The processed lithographic printing plate is mounted on offset printing press and used in printing of a plenty of sheets. As plate cleaners for removing the dirt on the plate in printing, conventionally known plate cleaners for PS plate, e.g., CL-1, CL-2, CP, CN-4, CN, CG-1, PC-1, SR, IC (manufactured by Fuji Photo Film Co., Ltd.) can be used.

As the plate-making process of the lithographic printing plate precursor for use in the plate-making method in the invention, the whole of the plate may be heated before exposure, during exposure, during the time from exposure to development, if necessary. By this heating, the image-forming reaction in the photosensitive layer is accelerated, thus sensitivity and press life are improved and sensitivity is stabilized. Further, it is also effective to perform entire post-heating or entire exposure of the developed image for the purpose of increasing image strength and press life. Heating before development is generally preferably performed on a moderate condition of 150° C. or lower. When the temperature is too high, a problem that even the unexposed area is fogged arises. Very intense condition is used in heating after development. The temperature is generally from 200 to 500° C. When the temperature is too low, sufficient image strength cannot be obtained, while when too high a temperature results in the deterioration of the support and heat-decomposition of the image area.

<On-Press Development>

As a method of printing without subjecting to development process, specifically, a method of mounting a lithographic printing plate on a press without subjecting to development after exposure and performing printing, and a method of mounting a lithographic printing plate precursor on a press, exposing the lithographic printing plate precursor on the press and performing printing as it is are exemplified.

The exposed area of the image-recording layer of the imagewise exposed lithographic printing plate precursor is insolubilized by polymerization hardening. When printing is carried out by supplying oily ink and an aqueous component to the exposed lithographic printing plate precursor without performing development process such as wet development process, the unhardened image-recording layer in the unexposed area is dissolved or dispersed by the oily ink and/or the aqueous component and removed, and the surface of a hydrophilic support is bared at that area. On the other hand, in the exposed area, the image-recording layer hardened by polymerization remains and forms an oily ink-receptive area (image area) having a lipophilic surface.

As a result, the aqueous component adheres to the bared hydrophilic surface, the oily ink adheres to the image-recording layer in the exposed area, and printing is initiated. Here, the one supplied first to the printing plate may be oily ink or may be an aqueous component, but for preventing the aqueous component from becoming dirty by the image-recording layer at the unexposed area, it is preferred to supply oily ink in the first place. As the aqueous component and the oily ink, fountain solutions and oily inks used in ordinary lithographic printing are used.

Thus, a lithographic printing plate precursor is subjected to on-press development on an offset printer and used in printing of a plenty of sheets.

EXAMPLE

The invention will be described more specifically with referring to examples, but the invention is not limited thereto.

Manufacture of Support:

(1) Support A

For removing the rolling oil of the surface, an aluminum plate having a thickness of 0.3 mm (material 1050) was subjected to degreasing treatment with a 10 mass % sodium alminate aqueous solution at 50° C. for 30 seconds, and after degreasing the aluminum surface was subjected to brush-graining with three nylon brushes planted with hairs having a hair diameter of 0.3 mm and a suspension of pumice stone and water of a median diameter of 25 μm (the specific gravity: 1.1 g/cm$^3$), and the surface of the plate was thoroughly washed with water. The plate was immersed in a 25 mass % sodium hydroxide aqueous solution at 45° C. for 9 seconds for etching, and then washed with water. After water washing, the plate was further immersed in a 20 mass % nitric acid aqueous solution for 20 seconds, followed by washing with water. The etched amount of the surface by graining was about 3 g/m$^2$.

Electrochemical surface roughening treatment was performed continuously by alternating voltage of 60 Hz. The electrolyte at this time was an aqueous solution containing 1 mass % of a nitric acid (containing a 0.5 mass % of an aluminum ion) and the liquid temperature was 50° C. As the alternating current electric source waveform, trapezoidal rectangular waveform alternating current was used, the time required for the electric current value to reach the peak from 0 was 0.8 msec, the duty ratio was 1/1, and electrochemical surface roughening treatment was performed with a carbon electrode as the counter electrode. Ferrite was used as the auxiliary anode. The electric current density was 30 A/dM$^2$ at a peak value of electric current, and 5% of the electric current from the electric source was diverted to the auxiliary anode. The quantity of electricity was 175 C/dm$^2$ in the quantity of electricity in the case where the aluminum plate was the anode. The aluminum plate was then washed with water.

Subsequently, electrochemical surface roughening treatment of the aluminum plate was performed in the same manner as in the above nitric acid electrolysis with an electrolyte containing a 0.5 mass % hydrochloric acid aqueous solution (containing 0.5 mass % of an aluminum ion) at a liquid temperature of 50° C. on the condition of 50 C/din$^2$ of the quantity of electricity in the case where the aluminum plate was the anode, and the plate was then subjected to spray washing. The plate was provided with 2.5 g/m$^2$ of a direct current anodic oxide film with a 15 mass % sulfuric acid aqueous solution (containing 0.5 mass % of an aluminum ion) as the electrolyte and the electric current density of 15 A/dm$^2$, washed with water and dried, whereby support A was manufactured.

(2) Support B

A support provided with an anodic oxide film manufactured in the same manner as in support A was subjected to sealing treatment by exposing to saturated aqueous vapor at 100° C. for 10 seconds, whereby support B was manufactured.

The central line average surface roughness (Ra) of support A and support B measured with a needle having a diameter of 2 μm were 0.48 μm and 0.51 ,μm respectively.

(3) Formation of Undercoat Layer

The undercoat layer coating solution (1) having the composition shown below was coated on each of support A and support B in a dry coating weight of 6 mg/$m^2$, whereby support (a) and support (b) having an undercoat layer were manufactured.

| Undercoat layer coating solution (1): | |
|---|---|
| Undercoat compound (1) shown below | 0.017 g |
| Methanol | 9.00 g |
| Water | 1.00 g |

Undercoat Compound (1)

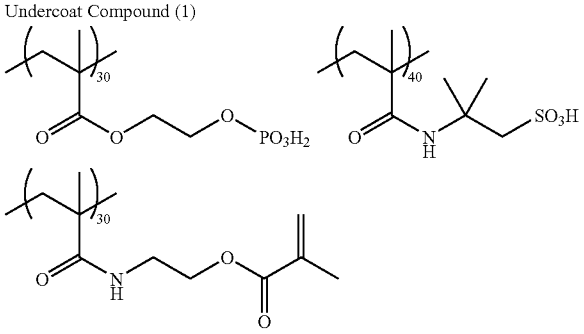

Examples 1 to 10 and Comparative Examples 1 to 3

The image-recording layer coating solution having the composition shown below was coated on support (a) with bar coating, dried at 1 00° C. for 60 seconds in an oven, whereby an image-recording layer having a dry coating weight of 1.0 g/$m^2$ was formed, thus lithographic printing plate precursors (1) to (10) and comparative lithographic printing plate precursors (R1) to (R3) were obtained.

Each image-recording layer coating solution was prepared by the mixture and stirring of the photosensitive liquid shown below and microcapsule liquid (1) just before coating. The compositions of the photosensitive liquids used in Examples and Comparative Examples are shown in Table 1 below.

| Photosensitive liquids (1) to (10) | |
|---|---|
| Binder polymer (1) shown below | 0.147 g |
| Polymerization initiator (1) shown below | 0.091 g |
| Infrared absorber (1) shown below | 0.018 g |
| Polymerizable compound | 0.350 g |
| ARONIX M-215 (manufactured by TOAGOSEL CO., LTD.) | |
| Fluorine surfactant (1) shown below | 0.040 g |
| Spiropyran/spirooxazine compound (shown in Table 1) | X g |
| Acid generator (shown in Table 1) | Y g |
| Methyl ethyl ketone | 0.991 g |
| 1-Methoxy-2-propanol | 7.816 g |
| Microcapsule liquid (1) | |
| Microcapsule dispersion (A) (synthesized as shown below) | 2.397 g |
| Water | 2.202 g |

-continued

Photosensitive liquids (1) to (10)

Binder Polymer (1)

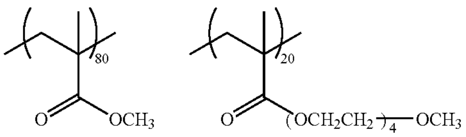

Polymerization Initiator (1)

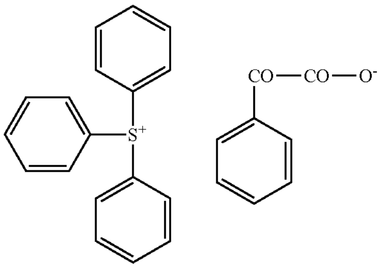

Infrared Absorber (1)

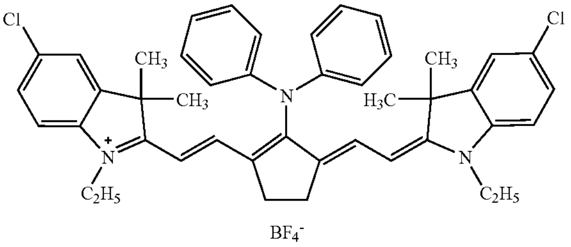

Fluorine Surfactant (1)

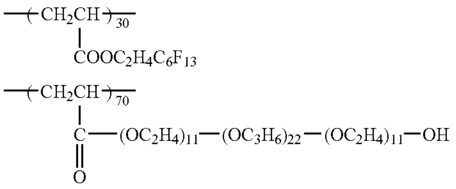

Spiropyran Compound (1)

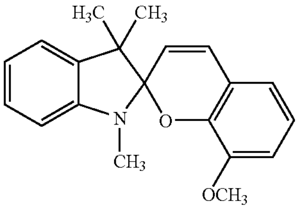

Spirooxane Compound (2)

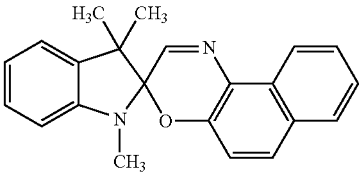

Acid Generator (1)

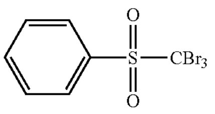

-continued

| Photosensitive liquids (1) to (10) |
|---|

Acid Generator (2)

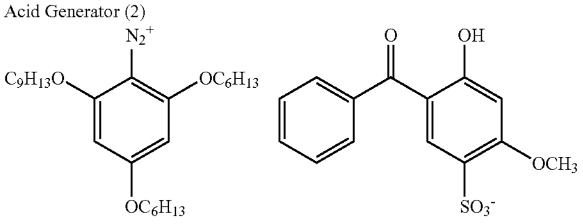

Acid Generator (3)

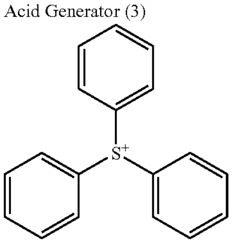

$CF_3CF_2CF_2CF_2SO_3^-$

Acid Generator (4)

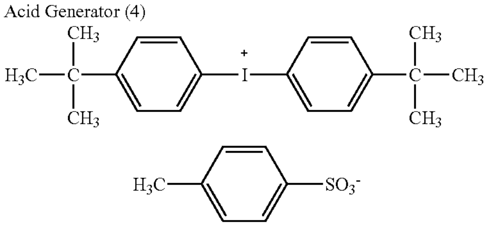

Acid Generator (5)

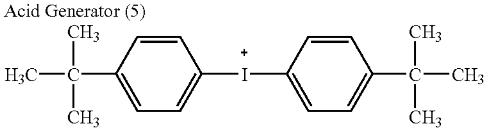

$CF_3CF_2CF_2CF_2SO_3^-$

Acid Generator (6)

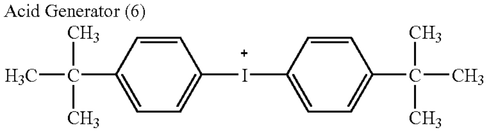

$PF_6^-$

Synthesis of Microcapsule Dispersion (A):

As the oil phase component, 10.0 g of the addition product of trimethylolpropane and xylene dilsocyanate (Takenate D-110N, manufactured by Mitsui Takeda Chemicals Inc., a 75 mass % ethyl acetate solution), 6.00 g of ARONIX M-215 as polymerizable composition (manufactured by TOAGOSEI CO., LTD.), and 0.12 g of Pionin A-41C (manufactured by Takemoto Oil & Fat) were dissolved in 16.67 g of ethyl acetate. As the aqueous phase component, 37.5 g of a 4 mass % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, and the mixture was stirred at room temperature for 30 minutes, and then stirred at 40° C. for 2 hours. The concentration of the solids content of the obtained microcapsule liquid was diluted to reach 15 mass % with distilled water, thus microcapsule dispersion (A) was obtained. The average particle size was 0.23 μm.

(3) Exposure and Printing

Each of lithographic printing plate precursors (1) to (1) and comparative lithographic printing plate precursors (R1) to (R3) obtained was subjected to exposure with Trendsetter 3244VX (manufactured by Creo Products Incorporated) loading a water-cooling type 40 W infrared semiconductor laser on the conditions of output of 9 W, outer drum rotation of 210 rpm, and resolution of 2,400 dpi. Each sample was subjected to exposure so as to contain fine line chart in the exposed image. After exposure, the degree of visibility (plate-detecting property) of fine line chart was visually observed. The results obtained are shown in Table 1 below.

The exposed printing plate precursor was mounted on SOR-M cylinder (manufactured by Heidelberg Japan K.K.) without performing development. A fountain solution (EU-3 (an etching solution manufactured by Fuji Photo Film Co., Ltd.)/water/isopropyl alcohol=1/89/10 (by volume)) and Values-G (transparent yellow) ink (manufactured by Dainippon Ink and Chemicals Inc.) were supplied as the fountain solution and ink, and 100 sheets of paper were printed at a printing speed of 6,000 sheets per hour. As a result, it was confirmed that on-press development was completed within 100 sheets of paper with every lithographic printing plate precursor.

Press life was evaluated by further continuing printing. As a result, good printed matters of 10,000 sheets or more were obtained with every lithographic printing plate precursor.

TABLE 1

| Example No. | Lithographic Printing Plate Precursor | Photo-sensitive Liquid | Spiropyran/Spirooxazine Compound Structure | Spiropyran/Spirooxazine Compound Addition Amount X (g) | Acid Generator Structure | Acid Generator Addition Amount Y (g) | Plate Detecting Property |
|---|---|---|---|---|---|---|---|
| Example 1 | (1) | (1) | (1) | 0.741 | (1) | 0.094 | Nearly good |
| Example 2 | (2) | (2) | (1) | 0.741 | (2) | 0.178 | Good |
| Example 3 | (3) | (3) | (1) | 0.741 | (3) | 0.136 | Good |
| Example 4 | (4) | (4) | (1) | 0.741 | (6) | 0.130 | Extremely good |
| Example 5 | (5) | (5) | (2) | 0.791 | (1) | 0.094 | Nearly good |
| Example 6 | (6) | (6) | (2) | 0.791 | (2) | 0.178 | Good |
| Example 7 | (7) | (7) | (2) | 0.791 | (3) | 0.136 | Good |
| Example 8 | (8) | (8) | (2) | 0.791 | (4) | 0.136 | Good |
| Example 9 | (9) | (9) | (2) | 0.791 | (5) | 0.167 | Extremely good |
| Example 10 | (10) | (10) | (2) | 0.791 | (6) | 0.130 | Extremely good |
| Comparative Example 1 | (R1) | (R1) | (2) | 0.791 | None | None | Extremely bad |
| Comparative Example 2 | (R2) | (R2) | None | None | (6) | 0.130 | Bad |
| Comparative Example 3 | (R3) | (R3) | None | None | None | None | Extremely bad |

Example 11

The image-recording layer coating solution having the composition shown below was coated on support (a) with bar coating, dried at 100° C. for 60 seconds in an oven, whereby an image-recording layer having a dry coating weight of 1.0 g/m$^2$ was formed, thus lithographic printing plate precursor (11) was obtained.

The image-recording layer coating solution was prepared by the mixture and stirring of the photosensitive liquid (11) and microcapsule liquid (2) shown below just before coating.

| | |
|---|---|
| Photosensitive liquid (11) | |
| Binder polymer (1) shown above | 0.147 g |
| Polymerization initiator (1) shown above | 0.091 g |
| Infrared absorber (1) shown above | 0.018 g |
| Polymerizable compound ARONIX M-215 (manufactured by TOAGOSEI CO., LTD.) | 0.350 g |
| Fluorine surfactant (1) shown above | 0.040 g |
| Methyl ethyl ketone | 0.991 g |
| 1-Methoxy-2-propanol | 7.816 g |
| Microcapsule liquid (2) | |
| Microcapsule dispersion (B) (synthesized as shown below) | 2.397 g |
| Water | 2.202 g |

Synthesis of Microcapsule Dispersion (B):

As the oil phase component, 10.0 g of the addition product of trimethylolpropane and xylene diusocyanate (Takenate D-110N, manufactured by Mitsui Takeda Chemicals Inc., a 75 mass % ethyl acetate solution), 1.19 g of spirooxazine compound (2), 2.51 g of acid generator (5), 0.38 g of infrared absorber (2) shown below, 1.94 g of tricresyl phosphate, and 0.12 g of Pionin A-41C (manufactured by Takemoto Oil & Fat) were dissolved in 16.67 g of ethyl acetate. As the aqueous phase component, 37.5 g of a 4 mass % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, and the mixture was stirred at room temperature for 30 minutes, and then stirred at 40° C. for 2 hours. The concentration of the solids content of the obtained microcapsule liquid was diluted to reach 15 mass % with distilled water, thus microcapsule dispersion (B) was obtained. The average particle size was 0.25 μm.

Infrared Absorber (2)

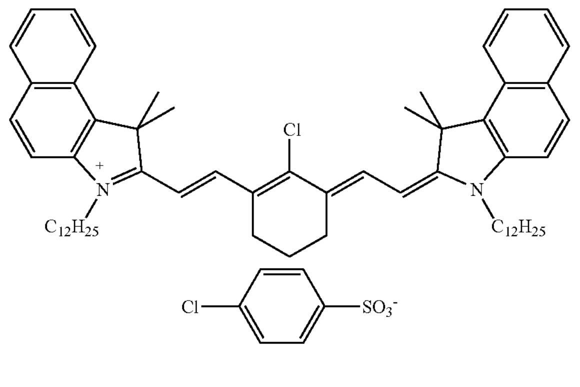

Lithographic printing plate precursor (11) was subjected to exposure in the same manner as the exposure of lithographic printing plate precursor (1) and printing was carried out. As a result, good plate detecting property was obtained. With respect to on-developing property and press life, also the same good results were obtained as in Examples 1 to 10.

Example 12

The image-recording layer coating solution having the composition shown below was coated on support (a) with bar coating, dried at 100° C. for 60 seconds in an oven, whereby an image-recording layer having a dry coating weight of 1.0 g/m$^2$ was formed. An image-recording layer coating solution was prepared by the mixture and stirring of photosensitive liquid (12) shown below and microcapsule liquid (1) just before coating.

Further, protective layer coating solution (1) having the composition shown below was coated on the image-recording layer with bar coating, dried at 120° C. for 75 seconds in an oven, whereby a protective layer having a dry coating weight of 1.0 g/m$^2$ was formed, thus lithographic printing plate precursor (12) was obtained.

| | |
|---|---|
| Photosensitive liquid (12) | |
| Binder polymer (1) shown above | 0.147 g |
| Polymerization initiator (1) shown above | 0.091 g |
| Infrared absorber (1) shown above | 0.018 g |
| Polymerizable compound ARONIX M-215 (manufactured by TOAGOSEI CO., LTD.) | 0.350 g |
| Fluorine surfactant (1) shown above | 0.040 g |
| Methyl ethyl ketone | 0.991 g |
| 1-Methoxy-2-propanol | 7.816 g |
| Microcapsule liquid (1) | |
| Microcapsule dispersion (A) (synthesized as shown above) | 2.397 g |
| Water | 2.202 g |
| Protective layer coating solution (1) | |
| Microcapsule dispersion (B) (synthesized as shown above) | 6.667 g |
| Fluorine surfactant (1) shown above | 0.075 g |
| Water | 8.333 g |

Lithographic printing plate precursor (12) was subjected to exposure in the same manner as the exposure of lithographic printing plate precursor (1) and printing was carried out. As a result, good plate detecting property was obtained. With respect to on-developing property and press life, also the same good results were obtained as in Examples 1 to 10.

As is apparent from the above results, the samples in Examples 1 to 12 according to the invention each having a layer containing a spiropyran or spirooxazine compound and acid generator showed a good plate inspecting property.

Examples 13a and 13b

Image-recording layer coating solution (13) having the composition shown below was coated on support shown in Table 2 below with bar coating, dried at 100° C. for 60 seconds in an oven, whereby an image-recording layer having a dry coating weight of 1.3 g/m$^2$ was formed, thus each lithographic printing plate precursor was obtained. Image-recording layer coating solution (13) was prepared by the mixture and stirring of photosensitive liquid (1) and microcapsule liquid (1) shown below just before coating.

| Image-recording layer coating solution (13) | |
|---|---|
| Binder polymer (1) shown below | 0.162 g |
| Polymerization initiator (1) shown below | 0.100 g |
| Infrared absorber (1) shown below | 0.020 g |
| Polymerizable compound ARONIX M-215 (manufactured by TOAGOSEI CO., LTD.) | 0.385 g |
| Fluorine surfactant (1) shown below | 0.044 g |
| Coupler (A) shown in Table 1 | 0.090 g |
| Acid generator (B) shown in Table 1 | 0.180 g |
| Hydrophilic fine particles (C) shown in Table 1 | 0.200 g |
| Methyl ethyl ketone | 1.091 g |
| 1-Methoxy-2-propanol | 8.210 g |
| Microcapsule liquid (1) | |
| Microcapsule (1) (synthesized as shown below) | 2.640 g |
| Water | 2.425 g |

Binder Polymer (1)

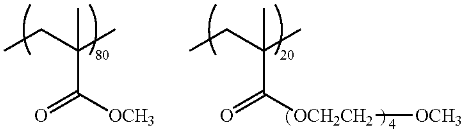

Polymerization Initiator (1)

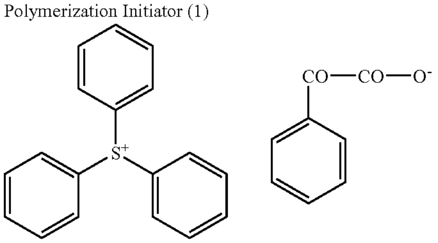

Infrared Absorber (1)

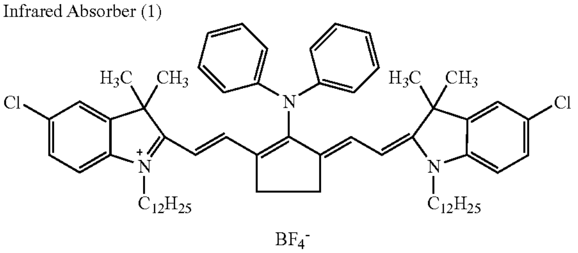

Fluorine Surfactant (1)

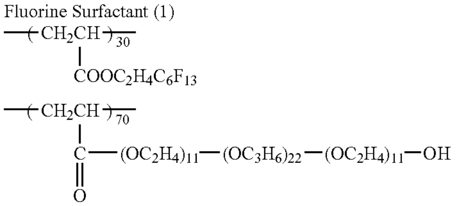

Synthesis of Microcapsule (1):

As the oil phase component, 10.0 g of the addition product of trimethylolpropane and xylene diisocyanate (Takenate D-110N, manufactured by Mitsui Takeda Chemicals Inc., a 75 mass % ethyl acetate solution), 6.00 g of ARONIX SR-399 (manufactured by TOAGOSEI CO., LTD.), and 0.12 g of Pionin A-41C (manufactured by Takemoto Oil & Fat) were dissolved in 16.67 g of ethyl acetate. As the aqueous phase component, 37.5 g of a 4 mass % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, and the mixture was stirred at room temperature for 30 minutes, and then stirred at 40° C. for 2 hours. The concentration of the solids content of the obtained microcapsule liquid was diluted to reach 15 mass % with distilled water. The average particle size was 0.2 μm.

Comparative Example 4

Image-recording layer coating solution (2) was prepared by extracting coupler (A), acid generator (B) and hydrophilic fine particles (C) from image-recording layer coating solution (13), and coated on support (a) with bar coating, dried at 100° C. for 60 seconds in an oven, whereby an image-recording layer having a dry coating weight of 1.0 g/m$^2$ was formed, thus comparative lithographic printing plate precursor was obtained.

Examples 14a, 14b and 15

Image-recording layer coating solution (14) was prepared by extracting coupler (A), acid generator (B) and hydrophilic fine particles (C) from image-recording layer coating solution (13), and coated on each support shown in Table 2 with bar coating, dried at 100° C. for 60 seconds in an oven, whereby an image-recording layer having a dry coating weight of 1.0 g/m$^2$ was formed. Overcoat layer coating solution (1) having the composition shown below was coated on the image-recording layer with bar coating, dried at 125° C. for 40 seconds in an oven, whereby an overcoat layer having a dry coating weight of 0.35 g/m$^2$ was formed, thus lithographic printing plate precursor was obtained.

| Overcoat laver coating solution (1) | |
|---|---|
| Solid dispersion (shown below, 12.5 mass %) of coupler (A) shown in Table 1 | 2.02 g |
| Solid dispersion (shown below, 12.5 mass %) of infrared absorber (1) | 0.71 g |
| Solid dispersion (shown below, 12.5 mass %) of acid generator (B) shown in Table 1 | 0.20 g |
| Polyvinyl alcohol (PVA 105, manufactured by Kuraray Co., Ltd., saponification degree: 98.5 mol %, polymerization degree: 500, a 6 mass % aqueous solution) | 2.50 g |
| Hydrophilic fine particles (C) shown in Table 1 (3.2 mass %) | 1.88 g |
| Surfactant (EMALEX 710, manufactured by Kao Corporation, a 1 mass % aq. soln.) | 1.43 g |
| Distilled water | 8.43 g |

Manufacture of Solid Dispersion:

In a glass bottle having a capacity of 500 ml, 130 g of glass beads (UB2527LN, 2.5 to 2.7 mmφ, manufactured by Union Co.) was filled, and then 12.5 g of an objective compound, and 87.5 g of a 2 mass % aqueous solution of modified polyvinyl alcohol (MP103, manufactured-by Kuraray Co., Ltd.) having alkyl-groups at terminals, saponification degree of 98.5 mol %, and polymerization degree of 300 were added. The contents were dispersed by vibration with a test disperser (paint shaker No. 488, manufactured by Toyo Seiki Seisaku-Sho, Ltd.) for 2 hours. After that, glass beads were removed with a nylon filter of 50 μm meshes to recover dispersion.

Comparative Example 5

Overcoat layer coating solution (2) was manufactured by extracting hydrophilic fine particles (C) from overcoat layer coating solution (1), and coated on the image-recording layer in Comparative Example 4 with bar coating, dried at 125° C. for 40 seconds in an oven, whereby an overcoat layer having a dry coating weight of 0.35 g/m$^2$ was formed, thus a comparative lithographic printing plate precursor was obtained.

Comparative Example 6

Overcoat layer coating solution (3) was manufactured by extracting coupler (A) from overcoat layer coating solution (1), and coated on the image-recording layer in Comparative Example 4 with bar coating, dried at 125° C. for 40 seconds in an oven, whereby an overcoat layer having a dry coating weight of 0.35 g/$M^2$ was formed, thus a comparative lithographic printing plate precursor was obtained.

Evaluation of Lithographic Printing Plate Precursor:

The plate detecting property and on-press developing property of the obtained lithographic printing plate precursor were evaluated as follows. The results obtained are shown in Table 2 below.

Plate Detecting Property:

Each lithographic printing plate precursor obtained was subjected to exposure with Trendsetter 3244VX (manufactured by Creo Products Incorporated) loading a water-cooling type 40 W infrared semiconductor laser on the conditions of output of 6.5 W, outer drum rotation of 150 rpm, and resolution of 2,400 dpi. The exposed printing plate precursor was allowed to stand in a dark place at 25° C. 50% RH without subjecting to development process, and the degree of coloring was measured 30 minutes and 4 hours after exposure respectively.

The measurement of the degree of coloring was performed with spectro-colorimeter CM2600d (manufactured by KONICA MINOLTA HOLDINGS, INC.) and operation software (CM-S100W) according to SCE (specularly reflected light exclusion) method. In SCE method, specularly reflected light is excluded and only diffused light is measured, so that the evaluated color is inclining toward visual observation and well relates to the detection by human eyes. For the representation of coloring in a numeric value, the difference (ΔL value) in coloring between the exposed area and the unexposed area is searched for from L value(brightness) of L*a*b* color specification, and this value is taken as the criterion of color detecting property. The greater ΔL value means more excellent detecting property.

L*a*b* color specification is described in JIS (JISZ 8729).

On-Press Developing Property:

The exposed printing plate precursor was mounted on SOR-M cylinder (manufactured by Heidelberg Japan K.K.). A fountain solution (IF-102 (an etching solution manufactured by Fuji Photo Film Co., Ltd.)/water=3/97 (by volume)) and TRANS-G (N) sumi ink (manufactured by Dainippon Ink and Chemicals Inc.) were fed as the fountain solution and ink, and 100 sheets of paper were printed at a printing speed of 6,000 sheets per hour.

After completion of the on-press removal of the image recording layer in the unexposed area, the number of the sheets of printing paper required up to the time when the ink did not transfer to the printing paper was counted and this was taken as the on-press developing property.

TABLE 2

| | Example No. / Support | Example 13a / a | Example 13b / b | Example 14a / a | Example 14b / b | Example 15 / a | Comp. Ex. 4 / a | Comp. Ex. 5 / a | Comp. Ex. 6 / a |
|---|---|---|---|---|---|---|---|---|---|
| Image Recording Layer | Coupler (A) | H-1 | H-2 | Not added | Not added | Not added | Not added | Not added | Not added |
| | Acid generator (B) | K-1 | K-2 | Not added | Not added | Not added | Not added | Not added | Not added |
| | Hydrophilic fine particles (C) | Synthetic mica (MEB3L) | Colloidal silica (SYLYSIA 310) | Not added | Not added | Not added | Not added | Not added | Not added |
| Protective Layer | Coupler (A) | — | — | H-1 | H-2 | H-3 | — | H-1 | Not added |
| | Acid generator (B) | — | — | K-1 | K-2 | K-1 | — | K-1 | K-1 |
| | Hydrophilic fine particles (C) | — | — | Synthetic mica (MEB3L) | Colloidal silica (SYLYSIA 310 | Synthetic mica (MEB3L) | — | Not added | Synthetic mica (MEB3L) |
| Plate Detecting Property | 30 Minutes after exposure | 5.0 | 4.5 | 5.5 | 5.0 | 5.5 | 0.8 | 4.0 | 0.8 |
| | 4 Hours after exposure | 5.0 | 4.2 | 5.5 | 5.0 | 5.0 | 0.6 | 1.0 | 0.7 |
| | Example No. | Example 1-a | Example 1-b | Example 2-a | Example 2-b | Example 3 | Comp. Ex. 1 | Comp. Ex. 2 | Comp. Ex. 3 |
| On-Press Developing Property | Number of Sheets | 15 | 12 | 17 | 15 | 16 | 30 | 40 | 15 |

Note)

MEB3L: Flaky synthetic mica having an average particle size of 1 to 5 μm, manufactured by UNICOOP JAPAN SYLYSIA 310: $SiO_2$ having an average particle size of 1.4 μm, manufactured by Fuji Sylysia Co., Ltd

H-1

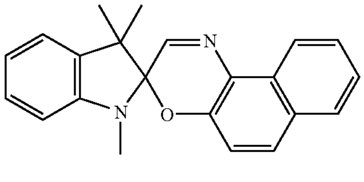

TABLE 2-continued

H-2

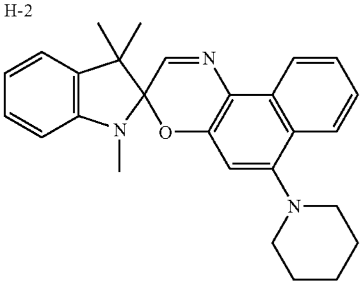

H-3

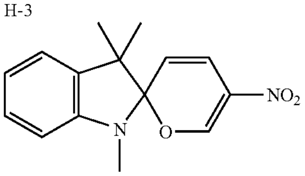

(K-1)

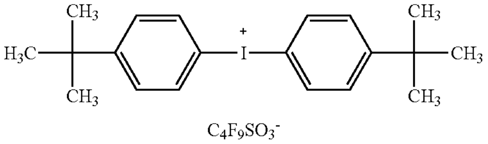

(K-2)

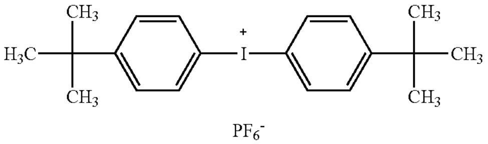

As is apparent from the results in Table 2, according to the lithographic printing method of the invention using the lithographic printing plate precursors in the invention (Examples 13 to 15), color-forming property of printing plate precursor by exposure is excellent and aging stability of colored images is good as compared with the method of using conventional lithographic printing plate precursors (Comparative Examples 4 to 6), so that it can be seen that the plate detecting property according to the invention is extremely excellent. Further, it is also seen that good on-press developing property is maintained.

This application is based on Japanese patent applications JP 2004-218454, filed on Jul. 27, 2004 and JP 2004-249823, filed on Aug. 30, 2004, the entire content of which is hereby incorporated by reference, the same as if set forth at length.

What is claimed is:

1. A lithographic printing plate precursor comprising a support and an image-recording layer, wherein the image-recording layer contains an acid generator and at least one spirooxazine compound, wherein said at least one spirooxazine compound is a compound represented by the formula (IIIa):

(IIIa)

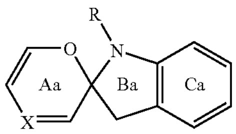

wherein X represents a nitrogen atom, R represents a hydrogen atom, an aliphatic group, an aromatic group, or a heterocyclic group, another ring (aromatic ring, aliphatic ring, or heterocyclic ring) may be condensed with rings Aa, Ba, and Ca, the rings Aa, Ba, Ca and the condensed rings thereof may each have a substituent, and the ring Ca may be an aromatic ring in which one or more carbon atoms constituting the ring Ca are substituted with hetero atoms selected from an oxygen atom, a nitrogen atom, and sulfur atom.

2. The lithographic printing plate precursor as claimed in claim 1, wherein the acid generator is an acid generator capable of generating an acid having an acid dissociation constant (pKa) at 25° C. of 5 or lower.

3. The lithographic printing plate precursor as claimed in claim 1, wherein the acid generator is an acid generator capable of generating $HClO_4$, $HBF_4$, $HPF_6$ or R—$SO_3H$ wherein R represents a hydrocarbon group having 1 to 30 carbon atoms that may have a substituent.

4. The lithographic printing plate precursor as claimed in claim 1, wherein the acid generator is at least one compound selected from the group consisting of iodonium salt, diazonium salt, and sulfonium salt.

5. The lithographic printing plate precursor as claimed in claim 1, wherein the acid generator is iodonium salt.

6. The lithographic printing plate precursor as claimed in claim 1, wherein the image-recording layer contains a polymerizable compound and a polymerization initiator.

7. The lithographic printing plate precursor as claimed in claim 1, wherein the image-recording layer is an image-recording layer removable by printing ink and/or a fountain solution.

8. The lithographic printing plate precursor as claimed in claim 1, wherein the image-recording layer further contains hydrophilic fine particles.

9. The lithographic printing plate precursor as claimed in claim 8, wherein the hydrophilic fine particles include at least fine particles selected from colloidal silica, alumina sol, magnesium oxide, zirconia oxide, titanium oxide, magnesium carbonate, calcium alginate, and mica.

10. A lithographic printing plate precursor comprising: a support; an image-recording layer; and a layer containing an acid generator and at least one spirooxazine compound, wherein said at least one spirooxazine compound is a compound represented by the formula (IIIa):

(IIIa)

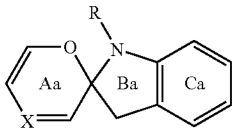

wherein X represents a nitrogen atom, R represents a hydrogen atom, an aliphatic group, an aromatic group, or a heterocyclic group, another ring (aromatic ring, aliphatic ring, or heterocyclic ring) may be condensed with rings Aa, Ba, and Ca, the rings Aa,, Ba, Ca and the condensed rings thereof may each have a substituent, and the ring Ca may be an aromatic ring in which one or more carbon atoms constituting the ring Ca are substituted with hetero atoms selected from an oxygen atom, a nitrogen atom, and sulfur atom.

11. The lithographic printing plate precursor as claimed in claim 10, wherein the acid generator is an acid generator capable of generating an acid having an acid dissociation constant (pKa) at 25° C. of 5 or lower.

12. The lithographic printing plate precursor as claimed in claim 10, wherein the acid generator is an acid generator capable of generating $HClO_4$, $HBF_4$, $HPF_6$, or $R—SO_3H$ wherein R represents a hydrocarbon group having 1 to 30 carbon atoms that may have a substituent.

13. The lithographic printing plate precursor as claimed in claim 10, wherein the acid generator is at least one compound selected from the group consisting of iodonium salt, diazonium salt, and sulfonium salt.

14. The lithographic printing plate precursor as claimed in claim 10, wherein the acid generator is iodonium salt.

15. The lithographic printing plate precursor as claimed in claim 10, wherein the image-recording layer contains a polymerizable compound and a polymerization initiator.

16. The lithographic printing plate precursor as claimed in claim 10, wherein the image-recording layer is an image-recording layer removable by printing ink and/or a fountain solution.

17. The lithographic printing plate precursor as claimed in claim 10, wherein the image-recording layer further contains hydrophilic fine particles.

18. The lithographic printing plate precursor as claimed in claim 17, wherein the hydrophilic fine particles include at least fine particles selected from colloidal silica, alumina sol, magnesium oxide, zirconia oxide, titanium oxide, magnesium carbonate, calcium alginate, and mica.

19. A lithographic printing plate precursor comprising: a support; an image-recording layer removable by printing ink and/or a fountain solution; and a hydrophilic overcoat layer, in this order, wherein the overcoat layer contains: at least one spirooxazine compound; and hydrophilic fine particles, wherein said at least one spirooxazine compound is a compound represented by the formula (IIIa):

(IIIa)

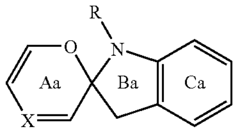

wherein X represents a nitrogen atom, R represents a hydrogen atom, an aliphatic group, an aromatic group, or a heterocyclic group, another ring (aromatic ring, aliphatic ring, or heterocyclic ring) may be condensed with rings Aa, Ba, and Ca, the rings Aa, Ba, Ca and the condensed rings thereof may each have a substituent, and the ring Ca may be an aromatic ring in which one or more carbon atoms constituting the ring Ca are substituted with hetero atoms selected from an oxygen atom, a nitrogen atom, and sulfur atom.

20. The lithographic printing plate precursor as claimed in claim 19, wherein the hydrophilic fine particles include at least fine particles selected from the group consisting of colloidal silica, alumina sol, magnesium oxide, zirconia oxide, titanium oxide, magnesium carbonate, calcium alginate, and mica.

21. A lithographic printing plate precursor comprising a support and an image-recording layer, wherein the image-recording layer contains an acid generator and at least one spirooxazine compound, wherein said at least one spirooxazine compound is a compound represented by the formula (IIIa):

(IIIa)

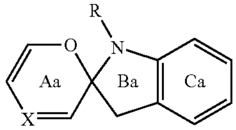

wherein X represents a nitrogen atom, R represents a hydrogen atom, an aliphatic group, an aromatic group, or a heterocyclic group, and at least one other ring selected from the group consisting of aromatic rings, aliphatic rings, and heterocyclic rings may be condensed with rings Aa, Ba, and Ca, the rings An, Ba, Ca and the condensed rings thereof may each have a substituent, and the ring Ca may be an aromatic ring in which one or more carbon atoms constituting the ring Ca are substituted with hetero atoms selected from an oxygen atom, a nitrogen atom, and sulfur atom.

* * * * *